US012777783B2

(12) United States Patent
Li et al.

(10) Patent No.: US 12,777,783 B2
(45) Date of Patent: Oct. 27, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Jianbo Li, Beijing (CN); Wei Zhang, Beijing (CN); Yu Wang, Beijing (CN); Kaijie Deng, Beijing (CN); Xiangdan Dong, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 446 days.

(21) Appl. No.: 18/547,647

(22) PCT Filed: Nov. 22, 2022

(86) PCT No.: PCT/CN2022/133485
§ 371 (c)(1),
(2) Date: Aug. 23, 2023

(87) PCT Pub. No.: WO2024/108381
PCT Pub. Date: May 30, 2024

(65) Prior Publication Data
US 2024/0306434 A1 Sep. 12, 2024

(51) Int. Cl.
*H10K 59/122* (2023.01)
*H10K 59/35* (2023.01)
*H10K 59/80* (2023.01)

(52) U.S. Cl.
CPC ......... *H10K 59/122* (2023.02); *H10K 59/353* (2023.02); *H10K 59/80521* (2023.02); *H10K 59/352* (2023.02)

(58) Field of Classification Search
CPC ........................... H10K 59/122; H10K 59/353
See application file for complete search history.

(56) References Cited

U.S. PATENT DOCUMENTS 8,475,937 B2 7/2013 Suzuki et al.
2017/0069697 A1 3/2017 Hashimoto et al.
(Continued)

FOREIGN PATENT DOCUMENTS

CN 105895664 A 8/2016
CN 113314579 B 8/2021
(Continued)

OTHER PUBLICATIONS

Extended European Search Report in corresponding EP 23893294 mailed Sep. 24, 2025., 11 pages.
(Continued)

*Primary Examiner* — Mariceli Santiago
(74) *Attorney, Agent, or Firm* — LEASON ELLIS LLP

(57) ABSTRACT

A display substrate and a display device are provided. The display substrate includes sub-pixels and a pixel defining pattern. The sub-pixel includes a light emitting element including a light emitting region; the light emitting element includes a light emitting functional layer, and a first electrode and a second electrode, and the second electrode covers the light emitting region of the sub-pixel. The pixel defining pattern includes first openings; one sub-pixel corresponds to at least one first opening; at least a portion of the
(Continued)

light emitting element of the sub-pixel is in the first opening corresponding to the sub-pixel, and the first opening exposes the first electrode. The pixel defining pattern further includes second openings located between at least part of sub-pixels; and at least one layer of the light emitting functional layer and at least a portion of the second electrode are disconnected at the second opening.

18 Claims, 11 Drawing Sheets

(56) References Cited

U.S. PATENT DOCUMENTS

| | | | | |
|---|---|---|---|---|
| 2017/0278905 | A1 | 9/2017 | Hsu et al. | |
| 2018/0123078 | A1* | 5/2018 | Byun | H10D 30/6723 |
| 2020/0235172 | A1* | 7/2020 | Lee | G06F 3/0443 |
| 2020/0357325 | A1 | 11/2020 | Zhao et al. | |
| 2021/0359028 | A1 | 11/2021 | Asaoka et al. | |
| 2021/0408163 | A1 | 12/2021 | Heo et al. | |
| 2022/0093721 | A1* | 3/2022 | Kim | H10K 59/1315 |
| 2023/0309348 | A1* | 9/2023 | Kwon | H10K 59/123 |
| 2024/0032375 | A1 | 1/2024 | Shang et al. | |

FOREIGN PATENT DOCUMENTS

| | | | | |
|---|---|---|---|---|
| CN | 114628405 | A | | 6/2022 |
| CN | 114628448 | A | | 6/2022 |
| CN | 114628451 | A | | 6/2022 |
| CN | 216749902 | U | | 6/2022 |
| CN | 115241266 | A | | 10/2022 |
| CN | 115513273 | A | | 12/2022 |
| JP | 2005197189 | A | * | 7/2005 |

OTHER PUBLICATIONS

Extended European Search Report in corresponding EP 22966081.6 mailed Mar. 10, 2025.

US Office Action corresponding to U.S. Appl. No. 18/705,758, dated Jun. 18, 2026, 27 pages.

* cited by examiner

DISPLAY SUBSTRATE AND DISPLAY DEVICE

CROSS-REFERENCE TO RELATED PATENT APPLICATIONS

This application is a U.S. National Stage Application under 35 U.S.C. § 371 of International Patent Application No. PCT/CN2022/133485, filed Nov. 22, 2022, which is incorporated by reference in its entirety.

TECHNICAL FIELD

Embodiments of the present disclosure relate to a display substrate and a display device.

BACKGROUND

With the development of the display technique, users have increasingly high requirements on the service life and power consumption of display devices. In a tandem organic light emitting display device, at least one light emitting layer and a charge generation layer are added in an organic light emitting device, thereby prolonging the service life of the light emitting device, increasing the brightness of the light emitting device, and reducing the power consumption. Thus, the light emitting device can meet the requirements of users on the service life and power consumption of display devices.

SUMMARY

Embodiments of the disclosure provides a display substrate and a display device.

In an embodiment of the disclosure, a display substrate includes a base substrate, a plurality of sub-pixels and a pixel defining pattern. The plurality of sub-pixels is located on the base substrate, each of at least part of sub-pixels comprises a light emitting element comprising a light emitting region; the light emitting element comprises a light emitting functional layer, and a first electrode and a second electrode located on two sides of the light emitting functional layer in a direction perpendicular to the base substrate; the first electrode is located between the light emitting functional layer and the base substrate; the light emitting functional layer comprises a plurality of film layers; and the second electrode covers the light emitting region of the sub-pixel. The pixel defining pattern located between the second electrode and the base substrate and located on a side, far away from the base substrate, of the first electrode, the pixel defining pattern comprises a plurality of first openings; one sub-pixel corresponds to at least one first opening; at least a portion of the light emitting element of the sub-pixel is located in the first opening corresponding to the sub-pixel, and the first opening is configured to expose the first electrode. The pixel defining pattern further comprises a plurality of second openings located between at least part of sub-pixels; and at least one layer of the light emitting functional layer and at least a portion of the second electrode are disconnected at the second opening.

For example, according to an embodiment of the disclosure, at least one isolation portion is disposed within each second opening; and at least one layer of the light emitting functional layer and at least a portion of the second electrode are disconnected at the isolation portion.

For example, according to an embodiment of the disclosure, a gap is formed between an orthographic projection of a partial edge of the isolation portion on the base substrate and an orthographic projection of an edge of the second opening where the isolation portion is located on the base substrate.

For example, according to an embodiment of the disclosure, two edges of the light emitting regions of sub-pixels located on two sides of the isolation portion in a direction perpendicular to an extension direction of the isolation portion have different distances to an edge, exposed by the second opening, of the isolation portion.

For example, according to an embodiment of the disclosure, at least one second opening is formed around the light emitting region of at least one sub-pixel.

For example, according to an embodiment of the disclosure, a portion, surrounding the second opening, of the second electrode comprises a structure in a closed ring shape.

For example, according to an embodiment of the disclosure, the second electrode overlapping the light emitting region of the sub-pixel and the second electrode located at the second opening and far away from the light emitting region are of a continuous structure.

For example, according to an embodiment of the disclosure, the second electrode of the sub-pixels located on two sides of the isolation portion in the direction perpendicular to the extension direction of the isolation portion is connected at a position outside the second opening.

For example, according to an embodiment of the disclosure, the second opening surrounding the light emitting region of at least one sub-pixel is of a structure in an unclosed ring shape.

For example, according to an embodiment of the disclosure, a shape of the light emitting region of at least one sub-pixel comprises a polygon, and the second opening is formed on a side, far away from a center of the light emitting region, of each edge of the polygon.

For example, according to an embodiment of the disclosure, a boundary of the second opening comprises a portion extending in a direction intersecting a row direction and a column direction.

For example, according to an embodiment of the disclosure, an edge of the second opening comprises a portion extending in a direction parallel to one of the row direction and the column direction.

For example, according to an embodiment of the disclosure, the plurality of sub-pixels comprise a plurality of first-color sub-pixels, a plurality of second-color sub-pixels, and a plurality of third-color sub-pixels; the plurality of sub-pixels is arranged in a plurality of first sub-pixel sets and a plurality of second sub-pixel sets disposed alternately in a first direction; each first sub-pixel set comprises the first-color sub-pixels and the second-color sub-pixels disposed alternately in a second direction, and each second sub-pixel set comprises the third-color sub-pixels arranged in the second direction; and the first direction intersects the second direction.

For example, according to an embodiment of the disclosure, the second opening comprises a first opening portion in the unclosed ring shape surrounding at least one first-color sub-pixel; and the first opening portion in the unclosed ring shape has a first fracture portion which is disposed opposite to at least one of an edge and an angle of the first-color sub-pixel.

For example, according to an embodiment of the disclosure, the second opening comprises a second opening portion in the unclosed ring shape surrounding at least one second-color sub-pixel; and the second opening portion in the unclosed ring shape has a second fracture portion which is disposed opposite to at least one of an edge and an angle of the second-color sub-pixel.

For example, according to an embodiment of the disclosure, the second opening comprises a third opening portion in the unclosed ring shape surrounding at least one third-color sub-pixel; and the third opening portion in the unclosed ring shape has a third fracture portion which is disposed opposite to at least one of an edge and an angle of the third-color sub-pixel.

For example, according to an embodiment of the disclosure, the first opening portion is located between the first-color sub-pixel and the third-color sub-pixel disposed adjacently, or the first opening portion is located between the first-color sub-pixel and the second-color sub-pixel disposed adjacently.

For example, according to an embodiment of the disclosure, the second opening portion is located between the second-color sub-pixel and the third-color sub-pixel disposed adjacently, or the second opening portion is located between the first-color sub-pixel and the second-color sub-pixel disposed adjacently.

For example, according to an embodiment of the disclosure, the third opening portion is located between the second-color sub-pixel and the third-color sub-pixel disposed adjacently, or the second opening portion is located between the first-color sub-pixel and the third-color sub-pixel disposed adjacently.

For example, according to an embodiment of the disclosure, a size of the first fracture portion is different from a size of the second fracture portion.

For example, according to an embodiment of the disclosure, the first opening portion and the second opening portion are disposed adjacently between the first-color sub-pixel and the second-color sub-pixel; a minimum distance between the first opening portion and the second opening portion disposed adjacently is a first spacing distance; a maximum spacing distance between the first opening portions surrounding the first-color sub-pixel in an arrangement direction of the first opening portion and the second opening portion disposed adjacently is a second spacing distance, and a maximum spacing distance between the second opening portions surrounding the second-color sub-pixel in the arrangement direction of the first opening portion and the second opening portion disposed adjacently is a third spacing distance; and the second spacing distance and the third spacing distance are both greater than the first spacing distance.

For example, according to an embodiment of the disclosure, the display substrate further comprises an insulating layer located between the pixel defining pattern and the base substrate, wherein the isolation portion is located on a surface, far away from the base substrate, of the insulating layer; and the insulating layer is disposed at other positions than the isolation portion in the second opening.

For example, according to an embodiment of the disclosure, at least one film layer of the light emitting functional layer comprises a charge generation layer; the light emitting functional layer comprises a first light emitting layer, the charge generation layer, and a second light emitting layer that are stacked; and the charge generation layer is located between the first light emitting layer and the second light emitting layer and disconnected at an edge of the isolation portion.

Another embodiment of the disclosure provides a display device, comprising the display substrate according to any items as mentioned above.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
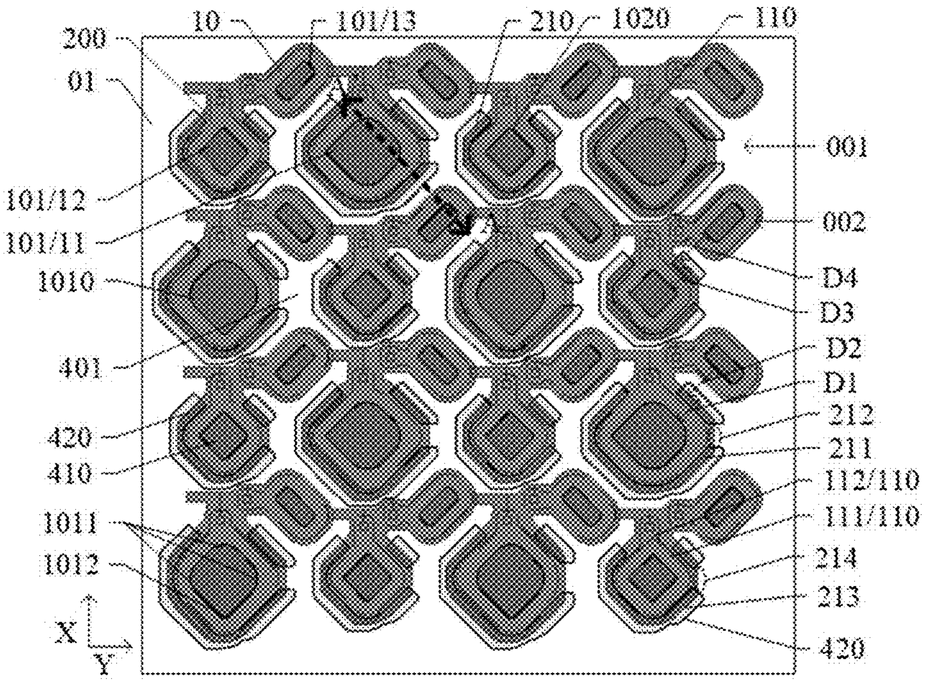
FIG. 1 to FIG. 3 are schematic diagrams illustrating a partial cross structure of a display substrate provided according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words “first”, “second” and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

As used in embodiments of the present disclosure, the features "parallel", "perpendicular", and "identical" include the features "parallel", "perpendicular", and "identical," etc. in the strict sense, as well as "approximately parallel", "approximately perpendicular", and "approximately identical," etc., which include a certain amount of error, are indicated to be within a range of acceptable deviations for a particular value as determined by a person of ordinary skill in the art, taking into account the measurement and the error associated with the measurement of the particular quantity (e.g., the limitation of the measurement system). For example, "substantially" can mean within one or more standard deviations, or within 10% or 5% of the stated value. Where the quantity of a component is not specifically indicated in the following embodiments of the present disclosure, it is meant that the component may be one or more, or may be understood to be at least one. "At least one" means one or more, and "a plurality of" means at least two.

In studies, the inventors of the present disclosure have found that: a light emitting functional layer of a light emitting element may include a plurality of light emitting layers stacked; a charge generation layer (CGL) is disposed between at least two of the plurality of light emitting layers and has great electric conductivity; when the charge generation layer is an entire-surface film layer, the charge generation layers of two adjacent light emitting elements are a continuous film layer, and transverse migration of charge may occur, leading to spectral crosstalk at a low grey level on a display substrate, e.g., easily leading to crosstalk between adjacent sub-pixels, which causes the display substrate to have a color deviation. For example, the charge generation layer may easily cause crosstalk between sub-pixels of different colors at a low brightness, leading to a color deviation at a low grey level. Moreover, when a second electrode in a display substrate is an entire-surface film layer, transverse migration of charge may occur, leading to spectral crosstalk at a low grey level on the display substrate, which may result in nonuniform colors of the display substrate and have a great influence on the uniformity of a display product.

Embodiments of the present disclosure provide a display substrate and a display device. The display substrate includes a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. An isolation portion is disposed between at least two adjacent sub-pixels. At least one layer of the light emitting functional layer and at least a portion of the second electrode are disconnected at an edge of the isolation portion, and the second electrodes of sub-pixels disposed adjacently are at least partially disposed continuously to form a reticular path. A length of orthographic projections of the second electrodes in the at least part of sub-pixels on the base substrate in a direction is greater than a sum of sizes of orthographic projections of the light emitting regions of the sub-pixels arranged in the direction on the base substrate. The reticular path includes a plurality of crisscrossed paths. At least one path has an uneven width, and a portion of the path with an uneven width overlapping with the light emitting region has a width greater than that of a portion of the path overlapping with at least a position outside the light emitting region.

In the display substrate provided in the present disclosure, the isolation portion is provided to isolate at least one layer of the light emitting functional layer and at least a portion of the second electrode. The isolation portion is shaped such that the second electrodes form the reticular path. In the reticular path, a width at a position corresponding to the light emitting region is greater so that a match between the isolation portion and an arrangement relationship of sub-pixels can be improved. Thus, the conduction effect of the second electrodes can be improved while the crosstalk occurring between adjacent sub-pixels is reduced, guaranteeing that the resistance of the second electrodes is not increased as much as possible and thereby being conducive to avoiding the problems of excessively high power consumption and brightness non-uniformity of the display substrate.

An embodiment of the present disclosure provides a display substrate, including a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. An isolation portion is disposed between at least two adjacent sub-pixels. At least one layer of the light emitting functional layer and at least a portion of the second electrode are disconnected at an edge of the isolation portion, and the second electrodes of sub-pixels disposed adjacently are at least partially disposed continuously to form a reticular path. The reticular path includes a plurality of crisscrossed paths. At least one path has an uneven width, and at least partial edge of the path with an uneven width is an edge of the isolation portion. The path with an uneven width includes a first path portion overlapping the light emitting region and a second path portion located at a position outside the light emitting region. Straight lines perpendicular to an extension direction of the path with an uneven width include a first straight line passing through an orthographic projection of the first path portion on the base substrate and a second line passing through an orthographic projection of the second path portion on the base substrate. A length of a connecting line of two intersection points of the first straight line with orthographic projections of edges of the isolation portions located on two sides of the first path portion on the base substrate is a first connecting line length, and a length of a connecting line of two intersection points of the second straight line with orthographic projections of edges of the isolation portions located on two sides of the second path portion on the base substrate is a second connecting line length. The first connecting line length is not less than the second connecting line length.

In the display substrate provided in the present disclosure, the isolation portion is provided to isolate at least one layer of the light emitting functional layer and at least a portion of the second electrode. The isolation portion is shaped such that the second electrodes form the reticular path. In the reticular path, a distance between edges of the isolation portions on two sides of the first path portion at a position corresponding to the light emitting region is not less than that between edges of the isolation portions on two sides of the second path portion corresponding to a position outside the light emitting region. Thus, the conduction effect of the second electrodes can be improved while the crosstalk occurring between adjacent sub-pixels is reduced, guaranteeing that the resistance of the second electrodes is not increased as much as possible and thereby being conducive to avoiding the problems of excessively high power consumption and brightness non-uniformity of the display substrate.

The display substrate and the display device provided by the embodiments of the present disclosure will be described below with reference to the accompanying drawings.

Figure 2:
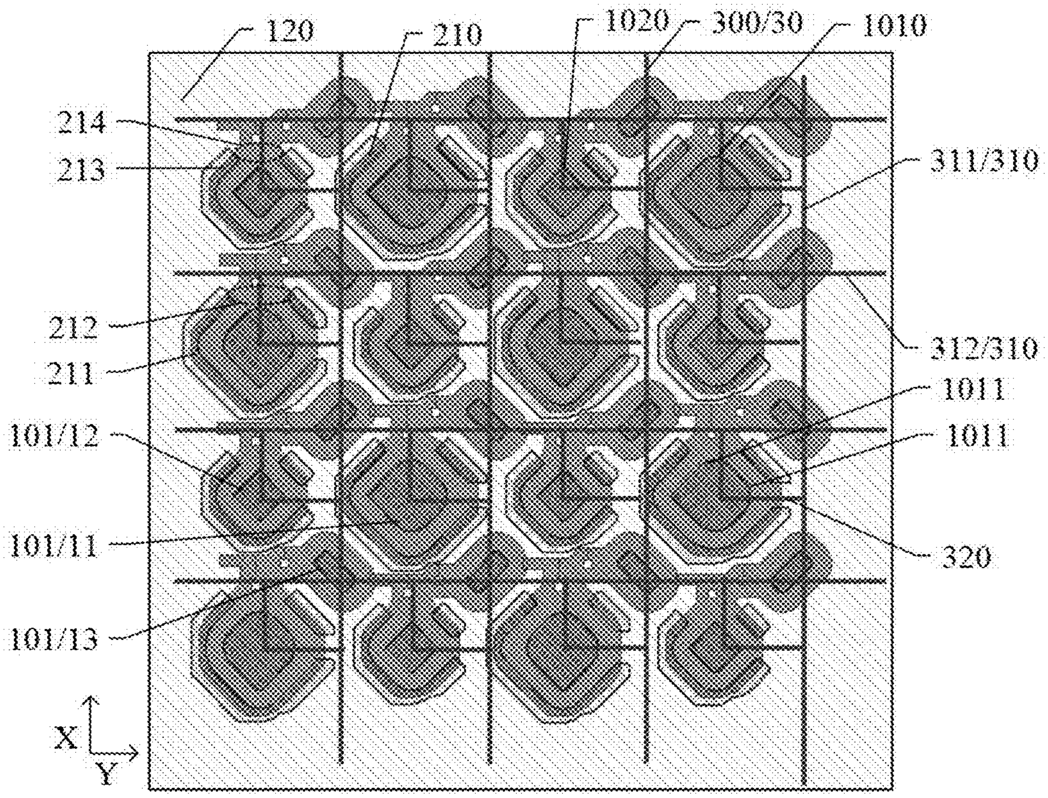
Figure 3:
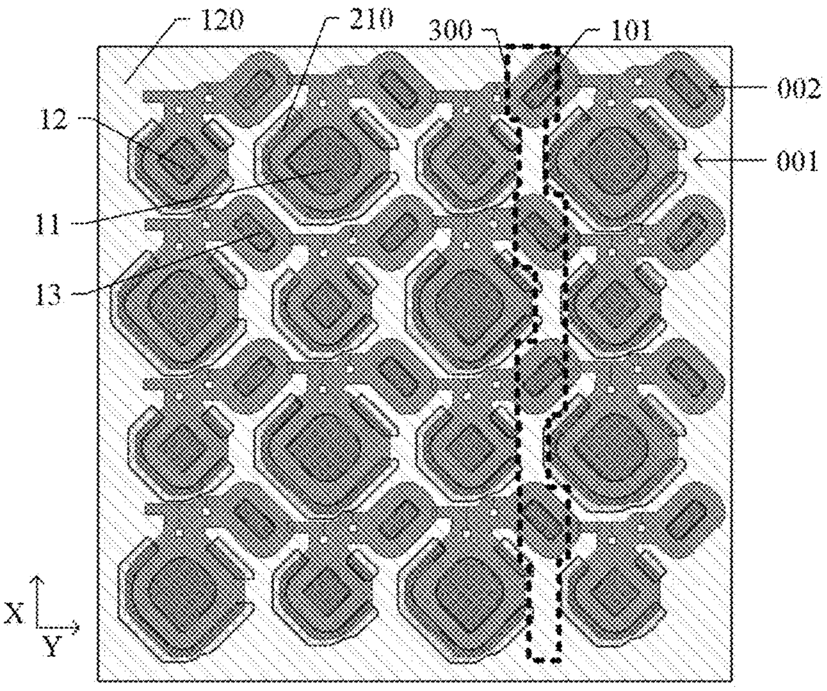
Figure 4A:
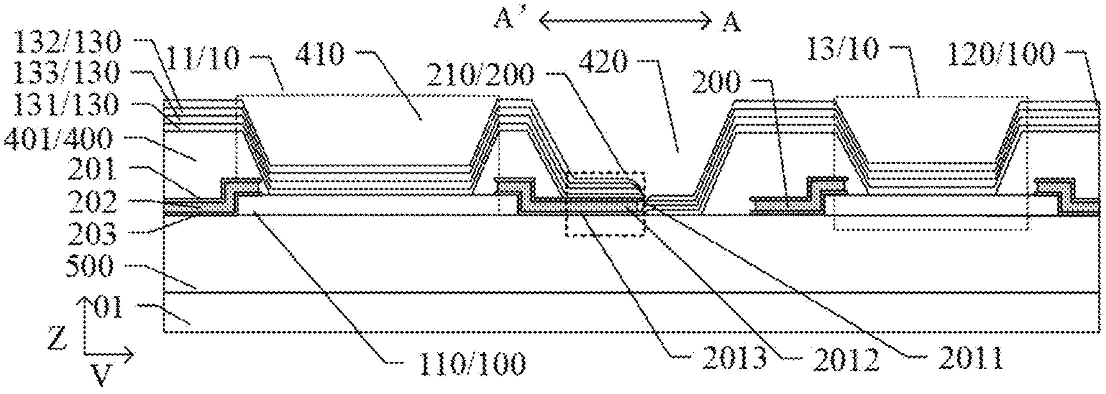
FIG. 4A is a schematic diagram illustrating a partial cross section truncated by section line AA' shown in FIG. 1.

FIG. 1 to FIG. 3 are schematic diagrams illustrating a partial cross structure of a display substrate provided according to an embodiment of the present disclosure. FIG. 4A is a schematic diagram illustrating a partial cross section truncated by section line AA' shown in FIG. 1. FIG. 1 illustrates a first electrode of a light emitting element and does not illustrate a second electrode of the light emitting element. FIG. 2 and FIG. 3 illustrate the second electrode of the light emitting element and do not illustrate the first electrode of the light emitting element.

As shown in FIG. 1 to FIG. 4A, the display substrate includes a base substrate 01, and a plurality of sub-pixels 10 located on the base substrate 01. Each sub-pixel 10 of at least part of sub-pixels 10 includes a light emitting element 100. The light emitting element 100 includes a light emitting region 101. The light emitting element 100 includes a light emitting functional layer 130, and a first electrode 110 and a second electrode 120 that are located on two sides of the light emitting functional layer 130 in a direction perpendicular to the base substrate 01 (e.g., the Z-direction shown in FIG. 4A). The first electrode 110 is located between the light emitting functional layer 130 and the base substrate 01. The second electrode 120 is located on a side, far away from the base substrate 01, of the light emitting functional layer 130. The light emitting functional layer 130 includes a plurality of film layers. For example, the light emitting functional layer 130 includes a charge generation layer 133. For example, the light emitting element 100 may be an organic light emitting element. For example, each sub-pixel located in a display region includes a light emitting element.

As shown in FIG. 1 to FIG. 4A, an isolation portion 210 is disposed between at least two adjacent sub-pixels 10. At least one layer of the light emitting functional layer 130 and at least a portion of the second electrode 120 are disconnected at an edge of the isolation portion 210, and the second electrodes 120 of sub-pixels 10 disposed adjacently are at least partially disposed continuously to form a reticular path 30. For example, the isolation portion 210 is disposed between any adjacent sub-pixels 10. For example, the second electrodes 120 are disposed continuously at least at a position with no isolation portion 210 between the sub-pixels 10 disposed adjacently.

For example, in the at least part of sub-pixels 10, orthographic projections of the second electrodes 120 on the base substrate 01 are of an entire-surface structure.

As shown in FIG. 1 to FIG. 4A, a length of orthographic projections of the second electrodes 120 in the at least part of sub-pixels 10 on the base substrate 01 in a direction is greater than a sum of sizes of orthographic projections of the light emitting regions 101 of the sub-pixels 10 arranged in the direction on the base substrate 01. For example, "a direction" mentioned above includes a row direction or a column direction. For example, one of the X-direction and the Y-direction as shown may be the row direction, and the other one may be the column direction.

As shown in FIG. 1 to FIG. 4A, the reticular path 30 includes a plurality of crisscrossed paths 300. At least one path 300 has an uneven width, and a width of a portion of the path 300 with an uneven width overlapping with the light emitting region 101 is greater than that of a portion of the path 300 overlapping with at least a position outside the light emitting region 101. For example, an orthographic projection of a widest portion of the at least one path 300 on the base substrate 01 overlaps an orthographic projection of the light emitting region 101 on the base substrate 01. FIG. 3 schematically illustrates a path 300 having an uneven width. An orthographic projection of a widest portion of the path 300 on the base substrate 01 overlaps the orthographic projection of the light emitting region 101 on the base substrate 01, and a narrow portion of the path 300 overlaps a gap between adjacent light emitting regions 101. For example, the paths 300 corresponding to different light emitting regions 101 may have different widths.

In the display substrate provided in the present disclosure, the isolation portion is provided to isolate at least one layer of the light emitting functional layer and at least a portion of the second electrode. The isolation portion is shaped such that the second electrodes form the reticular path. In the reticular path, a width at a position corresponding to the light emitting region is greater so that a match between the isolation portion and an arrangement relationship of sub-pixels can be improved. Thus, the conduction effect of the second electrodes can be improved while the crosstalk occurring between adjacent sub-pixels is reduced, thereby being conducive to avoiding the problems of excessively high power consumption and brightness non-uniformity of the display substrate.

The "reticular path" described above is created as follows: when an entire-surface second electrode is formed after the formation of the isolation portions, the second electrode is disconnected at a position of at least one isolation portion, and the continuous portion of the second electrode other than the disconnected position forms a reticular joined path which is a charge transportation path and formed as a charge path.

"Adjacent sub-pixels" in any embodiment of the present disclosure refer to two sub-pixels 10 between which no other sub-pixel 10 is disposed.

In some examples, as shown in FIG. 4A, the light emitting functional layer 130 may include a first light emitting layer (EML) 131, a charge generation layer (CGL) 133, and a second light emitting layer (EML) 132 that are stacked. The charge generation layer 133 is located between the first light emitting layer 131 and the second light emitting layer 132. The charge generation layer has good electrical conductivity, allowing the light emitting functional layer to have the advantages of long service life, low power consumption, and high brightness. For example, compared with the light emitting functional layer with no charge generation layer, by disposing the charge generation layer in the light emitting functional layer of the sub-pixel, the brightness can be approximately doubled.

For example, the light emitting element 100 of a same sub-pixel 10 may be a tandem light emitting element, such as a Tandem OLED.

For example, the charge generation layer 133 may include an N-type charge generation layer and a P-type charge generation layer.

For example, in each sub-pixel 10, the light emitting functional layer 130 may further include a hole injection layer (HIL), a hole transport layer (HTL), an electron transport layer (ETL), and an electron injection layer (EIL).

For example, the hole injection layer, the hole transport layer, the electron transport layer, the electron injection layer, and the charge generation layer 133 are all film layers shared by a plurality of sub-pixels 10, and may be referred to as common layers. For example, the second electrodes 120 in a plurality of sub-pixels 10 may be a common electrode shared by the plurality of sub-pixels 10. When no isolation portion 210 is disposed between the two adjacent sub-pixels 10, the second electrodes 120 are of an entire film layer.

For example, the first electrode 110 may be an anode electrode, and the second electrode 120 may be a cathode electrode. For example, the cathode electrode may be made of a material with high electrical conductivity and low work function. For example, the cathode electrode may be made of a metal material. For example, the anode electrode may be made of a transparent conductive material with high work function.

For example, at least one film layer, disconnected at the edge of the isolation portion 210, of the light emitting functional layer 130 may be at least one film layer of the common layers. For example, all film layers of the light emitting functional layer 130 and the second electrodes 120 are disconnected by the isolation portion 210. By disconnecting the at least one film layer of the common layers at the edge of the isolation portion 210 located between adjacent sub-pixels, the probability of crosstalk occurring between the adjacent sub-pixels can be reduced. For example, the common layers and the second electrodes may be film layers formed with an open mask.

For example, the second light emitting layer 132 may be located between the first light emitting layer 131 and the second electrode 120, and a hole injection layer may be located between the first electrode 110 and the first light emitting layer 131. For example, an electron transport layer may be disposed between the charge generation layer 133 and the first light emitting layer 131. For example, a hole transport layer may be disposed between the second light emitting layer 132 and the charge generation layer 133. For example, an electron transport layer and an electron injection layer may be disposed between the second light emitting layer 132 and the second electrode 120.

For example, in a same sub-pixel 10, the first light emitting layer 131 and the second light emitting layer 132 may be the light emitting layers that emit light of a same color. For example, the first light emitting layers 131 in sub-pixels 10 that emit light of different colors emit light of different colors. For example, the second light emitting layers 132 in sub-pixels 10 that emit light of different colors emit light of different colors. As a matter of course, the embodiments of the present disclosure are not limited thereto. For example, in a same sub-pixel 10, the first light emitting layer 131 and the second light emitting layer 132 may be the light emitting layers that emit light of different colors. By disposing the light emitting layers emitting light of different colors in the same sub-pixel 10, the light emitted by a plurality of light emitting layers included by the sub-pixel 10 is mixed into white light, and a color film layer is provided to adjust the color of the light emitted by each sub-pixel.

For example, as shown in FIG. 1 to FIG. 4A, the plurality of sub-pixels 10 include sub-pixels 10 of different colors. Portions of the path 300 overlapping with the light emitting regions 101 of the sub-pixels 10 of different colors have different widths. For example, the sub-pixels of different colors may include a blue sub-pixel, a red sub-pixel, and a green sub-pixel. For example, a width of a portion of the path overlapping with the light emitting region of the blue sub-pixel may be greater than that of a portion of the path overlapping with the light emitting region of the green sub-pixel. The embodiments of the present disclosure are not limited thereto. According to a product requirement, if a voltage drop of the second electrode of a sub-pixel of a color has a great influence on the display product, the path of the second electrode overlapping the light emitting region of the sub-pixel of the color may be set to be wide. For example, the sub-pixel of the color may be a green sub-pixel.

For example, in adjacent sub-pixels 10, the light emitting layers located on a same side of the charge generation layer 133 may overlap or be spaced apart. For example, in adjacent sub-pixels 10, the light emitting layers located on the same side of the charge generation layer 133 may be spaced apart at the edge of the isolation portion 210. Without limitation thereto, in adjacent sub-pixels 10, the light emitting layers located on the same side of the charge generation layer 133 may overlap or be spaced apart on a pixel defining portion (described below).

For example, a material of the electron transport layer may include aromatic heterocyclic compounds, such as imidazole derivatives such as benzimidazole derivatives, imidazopyridine derivatives, and benzimidazophenanthridine derivatives; azine derivatives such as pyrimidine derivative and triazine derivatives; and compounds having a nitrogen-containing six-membered ring structure (including compounds having phosphine oxide-based substitutes on a heterocyclic ring), such as quinoline derivatives, isoquinoline derivatives, and phenanthroline derivatives.

For example, a material of the charge generation layer 133 may be a material containing a phosphorus-oxygen group and may also be a material containing triazine.

For example, a ratio of electron mobilities of the material of the charge generation layer 133 to the electron transport layer is 10-2 to 102.

For example, as shown in FIG. 4A, at least one layer of the light emitting functional layer 130 may be the charge generation layer 133. A first charge generation layer orthographic projection of the charge generation layer 133 on the base substrate 01 is continuous, and a second charge generation layer orthographic projection in a plane (e.g., the ZV plane) perpendicular to the base substrate 01 is discontinuous. For example, the charge generation layer 133 may include a portion located on the isolation portion 210 and a portion not located on the isolation portion 210, and the two portions are disconnected at the edge of the isolation portion 210. For example, the first charge generation layer orthographic projections of the two portions on the base substrate 01 may be connected or overlap, and the first charge generation layer orthographic projections are continuous.

For example, the light emitting functional layer 130 includes at least one light emitting layer. In the light emitting functional layer 130, the film layers disconnected at the isolation portion 210 include at least one light emitting layer and at least one other film layer. An area of an orthographic projection of the at least one other film layer, which is disconnected, on the base substrate 01 is greater than that of an orthographic projection of the at least one light emitting layer, which is disconnected, on the base substrate 01. Alternatively, an area of a portion of the disconnected at least one other film layer that covers the isolation portion 210 is greater than that of a portion of the disconnected at least one light emitting layer that covers the isolation portion 210.

For example, as shown in FIG. 4A, orthographic projections of the second electrode 120 and at least one of the plurality of film layers included in the light emitting functional layer 130 on the base substrate 01 overlap the orthographic projection of the isolation portion 210 on the base substrate 01.

For example, at least a portion of at least one of the plurality of film layers included in the light emitting functional layer 130 covers a portion of a side surface of the isolation portion 210.

In some examples, as shown in FIG. 4A, the display substrate further includes a pixel defining pattern 400 and an insulating layer 500. The pixel defining pattern 400 is located on a side, far away from the base substrate 01, of the first electrode 110 of the light emitting element 100. The insulating layer 500 is located between the pixel defining pattern 400 and the base substrate 01. The pixel defining pattern 400 includes a plurality of first openings 410. One sub-pixel 10 corresponds to at least one first opening 410. At least a portion of the light emitting element 100 of the sub-pixel 10 is located in the first opening 410 corresponding to the sub-pixel 10, and the first opening 410 is configured to expose the first electrode 110. For example, the pixel defining pattern 400 includes a pixel defining portion 401 surrounding the first openings 410.

For example, as shown in FIG. 4A, when the light emitting functional layer 130 is formed in the first opening 410 of the pixel defining pattern 400, the first electrode 110 and the second electrode 120 located on the two sides of the light emitting functional layer 130 are capable of driving the light emitting functional layer 130 in the first opening 410 to emit light. For example, the first opening 410 of the pixel defining pattern 400 is configured to define the light emitting region 101 of the light emitting element 100. The outline of the middle region of each sub-pixel 10 in FIG. 1 to FIG. 3 illustrates the light emitting region 101. The outline surrounding the light emitting region 101 in FIG. 1 is the first electrode 110.

The light emitting region 101 may refer to an effective light emitting region of a sub-pixel. A shape of the light emitting region refers to a two-dimensional shape. For example, the shape of the light emitting region may be the same as that of the first opening 410 of the pixel defining pattern 400.

For example, as shown in FIG. 4A, a material of the pixel defining portion 401 may include polyimide, acrylic, polyethylene glycol terephthalate, or the like.

In some examples, as shown in FIG. 1 to FIG. 4A, the pixel defining pattern 400 further includes a second opening 420. The second opening 420 is configured to expose the isolation portion 210 which is located between the light emitting functional layer 130 and the insulating layer 500. For example, the pixel defining portion 401 surrounds the second opening 420. For example, the second opening 420 is located between adjacent sub-pixels 10. For example, at least one second opening 420 is formed between adjacent first openings 410. For example, the orthographic projection of the isolation portion 210 on the base substrate 01 does not overlap an orthographic projection of the pixel defining portion 401 on the base substrate 01. For example, the pixel defining portion 401 other than the first openings 410 and the second openings 420 of the pixel defining pattern 400 may be of a continuous structure.

In some examples, as shown in FIG. 1 to FIG. 4A, the display substrate further includes a defining structure 200 located between the light emitting functional layer 130 and the insulating layer 500. The defining structure 200 surrounds the light emitting region 101 of each sub-pixel 10 of at least part of sub-pixels 10. At least a portion of the defining structure 200 is located on the side, far away from the base substrate 01, of the first electrode 110, and a portion, exposed by the second opening 420, of the defining structure 200 includes an isolation portion 210. For example, the isolation portion 210 is a portion of the defining structure 200. In a direction perpendicular to the base substrate 01, a portion of the defining structure 200 that overlaps the pixel defining portion 401 is a portion which is outside the isolation portion 210 and not used for isolating at least one layer of the light emitting functional layer 130.

For example, as shown in FIG. 1 to FIG. 4A, in the direction perpendicular to the base substrate 01, the isolation portion 210 does not overlap the first electrode 110 of the light emitting element 10. For example, the isolation portion 210 may be disposed at a same layer with the first electrode 110. For example, the first electrode 110 and the isolation portion 210 may be both disposed on a surface on a side, far away from the base substrate 01, of the insulating layer 500.

For example, as shown in FIG. 1 to FIG. 4A, a portion of the defining structure 200 covers an edge of the first electrode 110, e.g., covers a circle of edges of the first electrode 110 or a partial edge in a circle of edges, thereby being conducive to avoiding shedding of an edge material (e.g., silver ions) of the first electrode. For example, the portion of the defining structure 200 that covers the first electrode 110 is covered by the pixel defining portion 401. That is, the portion of the defining structure 200 that covers the first electrode 110 is located in a region between the first opening 410 and the second opening 420.

For example, as shown in FIG. 1 to FIG. 4A, the defining structures 200 surrounding the light emitting regions 101 of different sub-pixels 10 may be of an integrated structure. For example, the plurality of sub-pixels 10 include a plurality of rows of sub-pixels arranged in the X-direction. The defining structures 200 corresponding to every two rows of sub-pixels may be of an integrated structure. For example, the defining structures 200 corresponding to a first row of sub-pixels and a second row of sub-pixels may be of an integrated structure. A gap is formed between the defining structure 200 corresponding to a third row of sub-pixels and the defining structure 200 corresponding to the second row of sub-pixels. In the present disclosure, the defining structures surrounding the light emitting regions of different sub-pixels are of an integrated structure so that patterning of the defining structures can be facilitated.

For example, as shown in FIG. 4A, the defining structure 200 includes three film layers stacked, e.g., a first defining structure layer 201, a second defining structure layer 202, and a third defining structure layer 203. Edges of the first defining structure layer 201 and the third defining structure layer 203 at the position of the isolation portion 210 both protrude outwards relative to an edge of the second defining structure layer 202 such that at least one layer of the light emitting functional layer 130 is disconnected at the edge of the first defining structure layer 201.

For example, a material of the defining structure 200 includes an inorganic non-metallic material. For example, the material of the defining structure 200 may include any one or more of silicon nitride, silicon oxide, and silicon oxynitride. For example, a material of the first defining structure layer 201 and the third defining structure layer 203 may include silicon oxide, and a material of the second defining structure layer 202 may include silicon nitride.

For example, as shown in FIG. 4A, a thickness of the defining structure 200 may be smaller than that of the first electrode 110. For example, the thickness of the defining structure 200 may be greater than 400 angstroms.

FIG. 4A does not illustrate other film layers between the insulating layer and the base substrate. For example, a pixel circuit electrically connected to the light emitting element, various signal lines, others insulating layers, and the like may be further disposed between the insulating layer and the base substrate. For example, other insulating layers may include a planarization layer, a passivation layer, a buffer layer, a gate insulating layer, an interlayer insulating layer, etc.

Figure 4B:
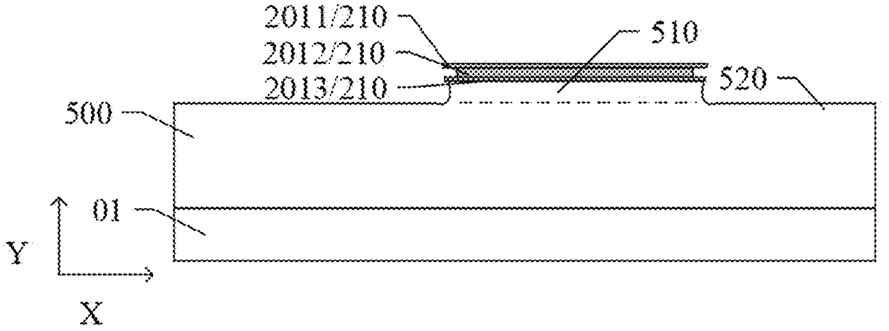
FIG. 4B to FIG. 4D are schematic diagrams illustrating a partial cross structure including an isolation portion provided according to different examples of an embodiment of the present disclosure.
Figure 4C:
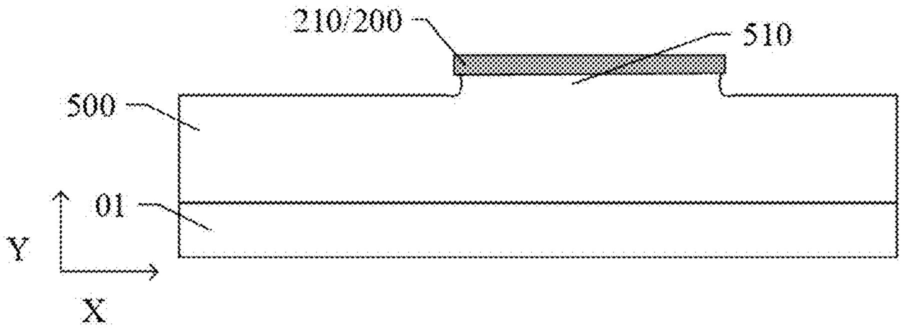
Figure 4D:
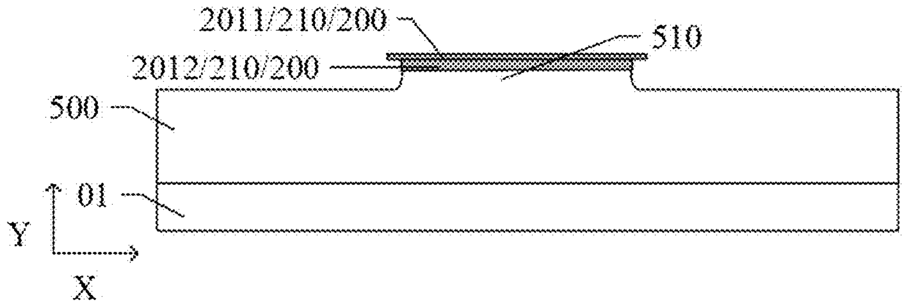
Figure 5:
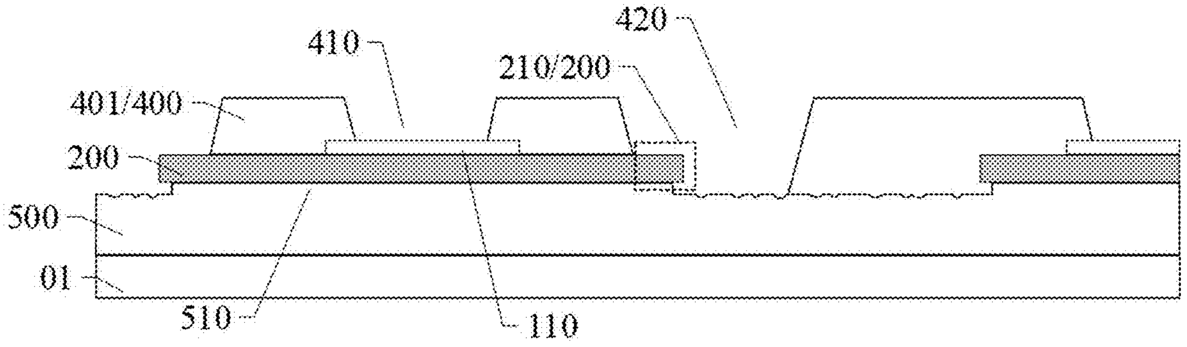
FIG. 5 is a structural schematic diagram illustrating a pixel defining pattern disposed on the isolation portion shown in FIG. 4C.

FIG. 4B to FIG. 4D are schematic diagrams illustrating a partial cross structure including an isolation portion provided according to different examples of an embodiment of the present disclosure. FIG. 4B to FIG. 4D do not illustrate the pixel defining pattern. FIG. 5 is a structural schematic diagram illustrating a pixel defining pattern disposed on the isolation portion shown in FIG. 4C, and the shown isolation portion 210 may be in a case where the defining structure is completely exposed by an opening of the pixel defining pattern.

The examples shown in FIG. 4B to FIG. 5 differ from the example shown in FIG. 4A in that at least a portion of the defining structure 200 is located between the first electrode 110 and the insulating layer 500.

For example, as shown in FIG. 4B to FIG. 5, the insulating layer 500 includes a protrusion 510 on a side far away from the base substrate 01. An orthographic projection of the protrusion 510 on the base substrate 01 overlaps the orthographic projection of the isolation portion 210 on the base substrate 01, and the isolation portion 210 is in contact with the protrusion 510.

For example, as shown in FIG. 4B to FIG. 4D, a material of the isolation portion 210 includes an inorganic non-metallic material, and a material of the insulating layer 500 includes an organic material. For example, the orthographic projection of the protrusion 510 on the base substrate 01 is completely located within the orthographic projection of the isolation portion 210 on the base substrate 01.

For example, as shown in FIG. 4B to FIG. 4D, at least a side edge of the isolation portion 210 protrudes relative to an edge of the protrusion 510 to isolate the film layers. For example, the edge of the isolation portion 210 may also be flush with the edge of the protrusion 510. For example, at least partial edge of the isolation portion protrudes relative to the edge of the protrusion by a size of less than 1 micron. For example, at least partial edge of the isolation portion protrudes relative to the edge of the protrusion by a size of less than 0.08 micron. For example, at least partial edge of the isolation portion protrudes relative to the edge of the protrusion by a size of less than 0.05 micron. For example, at least partial edge of the isolation portion protrudes relative to the edge of the protrusion by a size of less than 0.02 micron.

For example, as shown in FIG. 4B, the isolation portion 210 includes a first isolation structure layer 2011, a second isolation structure layer 2012, and a third isolation structure layer 2013 that are stacked in sequence. An edge of the first isolation structure layer 2011 and an edge of the third isolation structure layer 2013 both protrude relative to an edge of the second isolation structure layer 2012. For example, the edge of the second isolation structure layer 2012 is indented relative to the edge of the first isolation structure layer 2011 by a size of not less than 0.05 micron. For example, the edge of the second isolation structure layer 2012 is indented relative to the edge of the first isolation structure layer 2011 by a size of not less than 0.08 micron. For example, the edge of the second isolation structure layer 2012 is indented relative to the edge of the first isolation structure layer 2011 by a size of not less than 0.1 micron. For example, the edge of the second isolation structure layer 2012 is indented relative to the edge of the first isolation structure layer 2011 by a size of not less than 0.15 micron. For example, the edge of the second isolation structure layer 2012 is indented relative to the edge of the first isolation structure layer 2011 by a size of not less than 0.2 micron. For example, the edge of the second isolation structure layer 2012 is indented relative to the edge of the first isolation structure layer 2011 by a size of not less than 0.5 micron.

For example, as shown in FIG. 4B, a thickness of the isolation portion 210 may be 150 to 5000 angstroms. For example, the thickness of the isolation portion 210 may be 200 to 500 angstroms. For example, the thickness of the isolation portion 210 may be 300 to 1000 angstroms. For example, the thickness of the isolation portion 210 may be 400 to 2000 angstroms. For example, the thickness of the isolation portion 210 may be 600 to 1500 angstroms.

For example, as shown in FIG. 4B, a thickness of the protrusion 510 may be 400 to 5000 angstroms. For example, the thickness of the protrusion 510 may be 450 to 4000 angstroms. For example, the thickness of the protrusion 510 may be 500 to 3000 angstroms. For example, the thickness of the protrusion 510 may be 600 to 2000 angstroms.

For example, as shown in FIG. 4B, a size of a middle position of the protrusion 510 in a direction parallel to the base substrate 01 (e.g., the X-direction shown in FIG. 4B) is smaller than a size of positions of two sides of the protrusion 510 in the direction. For example, the middle position of the protrusion 510 is indented relative to the positions of two sides by a size of greater than 0.01 micron. For example, the middle position of the protrusion 510 is indented relative to the positions of two sides by a size of greater than 0.02 micron. For example, the middle position of the protrusion 510 is indented relative to the positions of two sides by a size of greater than 0.03 micron. For example, the middle position of the protrusion 510 is indented relative to the positions of two sides by a size of greater than 0.05 micron.

For example, as shown in FIG. 4B, the insulating layer 500 includes a planar portion 520 at a position other than the protrusion 510. A portion of the protrusion 510 that is joined to the planar portion 520 may be a depressed portion to better isolate the common layers. For example, the edge of the protrusion 510 may be an inclined side edge, and an included angle between the side edge and the planar portion is not greater than 150 degrees, thereby realizing isolation of the common layers using both of the protrusion and the isolation portion. For example, the included angle between the side edge and the planar portion is not greater than 140 degrees. For example, the included angle between the side edge and the planar portion is not greater than 130 degrees. For example, the included angle between the side edge and the planar portion is not greater than 120 degrees. For example, the included angle between the side edge and the planar portion is not greater than 110 degrees. For example, the included angle between the side edge and the planar portion is not greater than 100 degrees.

For example, as shown in FIG. 4B, at least a side edge of the third isolation structure layer 2013 protrudes relative to at least a side edge of the protrusion 510. For example, at least a side edge of the first isolation structure layer 2011 protrudes relative to at least a side edge of the third isolation structure layer 2013 to achieve a good effect of isolating the common layers. For example, at least a side edge of the first isolation structure layer 2011 protrudes relative to at least a side edge of the third isolation structure layer 2013 by a size of not less than 0.08 micron. For example, at least a side edge of the first isolation structure layer 2011 protrudes relative to at least a side edge of the third isolation structure layer 2013 by a size of not less than 0.1 micron. For example, at least a side edge of the first isolation structure layer 2011 protrudes relative to at least a side edge of the third isolation structure layer 2013 by a size of not less than 0.15 micron. As a matter of course, the embodiments of the present disclosure are not limited thereto. The edge of the protrusion may protrude relative to the edge of the third isolation structure layer by a tiny size.

The display substrate shown in FIG. 4C differs from the display substrate shown in FIG. 4B in that the isolation portion 210 includes a different number of film layers. The protrusion shown in FIG. 4C may have the same features with the protrusion shown in FIG. 4B, which will not be described here redundantly.

For example, as shown in FIG. 4C, the isolation portion 210 includes one film layer. For example, the thickness of the isolation portion 210 may be 100 to 5000 angstroms. For example, the thickness of the isolation portion 210 may be 200 to 4000 angstroms. For example, the thickness of the isolation portion 210 may be 300 to 3500 angstroms. For example, the thickness of the isolation portion 210 may be 400 to 2000 angstroms. For example, the thickness of the isolation portion 210 may be 500 to 1000 angstroms.

The display substrate shown in FIG. 4C differs from the display substrate shown in FIG. 4B in that the isolation portion 210 includes a different number of film layers.

For example, as shown in FIG. 4C, the isolation portion 210 may include two film layers. For example, the isolation portion 210 includes a first isolation structure layer 2011 and a second isolation structure layer 2012 that are stacked. The first isolation structure layer 2011 is located on a side, far away from the base substrate 01, of the second isolation structure layer 2012, and an edge of the first isolation structure layer 2011 protrudes relative to an edge of the second isolation structure layer 2012. For example, the edge of the second isolation structure layer 2012 protrudes relative to the edge of the protrusion 510.

The protrusion shown in FIG. 4C may have the same features with the protrusion shown in FIG. 4B. Without limitation thereto, there may be no depressed portion at a side edge of the protrusion shown in FIG. 4C. For example, an included angle between the side edge and the planar portion of the insulating layer is not greater than 140 degrees. For example, the included angle between the side edge and the planar portion is not greater than 130 degrees. For example, the included angle between the side edge and the planar portion is not greater than 120 degrees. For example, the included angle between the side edge and the planar portion is not greater than 110 degrees. For example, the included angle between the side edge and the planar portion is not greater than 100 degrees.

For example, as shown in FIG. 5, the defining structure 200 is formed between the first electrode 110 of a sub-pixel and the base substrate 01. For example, before forming the first electrode 110 of the sub-pixel, the defining structure 200 is firstly deposited on the insulating layer 500, e.g., the planar layer, and then the first electrode 110 of the sub-pixel is formed on the defining structure 200. In the display substrate, when forming the defining structure 200 including the isolation portion 210, the planar layer 500 located at the bottom of the defining structure 200 is etched to form sawtooth. By forming the first electrode on the defining structure, the problem that the first electrode has sawtooth due to an uneven planar layer can be avoided, and the probability of poor display can be reduced. For example, an orthographic projection of the first electrode 110 on the base substrate 01 may be completely located within the orthographic projection of the defining structure 200 on the base substrate 01.

For example, the defining structure located directly under the first electrode 110 and the defining structure exposed by the second opening 420 of the pixel defining pattern 400 may be of an integrated defining structure, and may also be defining structures spaced apart.

In the display substrate provided in the present disclosure, after a pattern of the first electrode of a sub-pixel is deposited and etched above the insulating layer (e.g., the planar layer), the defining structure (e.g., including a stacked structure, such as SiOx/SiNx/SiOx) is formed to cover four sides of the first electrode. When etching the defining structure, since the SiNx in the defining structure is easier to be etched than SiOx, an I-shaped morphology is formed at the edge of the defining structure after the completion of etching. The morphology allows at least one layer of the light emitting functional layer to be isolated when deposited on the isolation portion in the defining structure, thereby being conducive to reducing the crosstalk between adjacent light emitting regions. For example, a pixel defining film layer deposited on the defining structure is patterned to form the second opening to expose the isolation portion at the edge of the defining structure so as to realize isolation of at least one layer of the light emitting functional layer. The second electrodes of the sub-pixels formed at a portion, covered by the pixel defining portion, of the edge of the defining structure are kept continuous, and the charge transmission path is formed to achieve the conduction effect of the second electrode.

The isolation portion provided in the present disclosure is not limited to the shape and position shown in FIG. 4A. For example, the isolation portion may further include a first isolation sub-structure and a second isolation sub-structure that are stacked, and the first isolation sub-structure is located between the second isolation sub-structure and the base substrate. In an arrangement direction of adjacent sub-pixels, a size of the first isolation sub-structure of the isolation portion between the adjacent sub-pixels is smaller than a size of the second isolation sub-structure such that the second isolation sub-structure includes a portion protruding relative to an edge of the first isolation sub-structure. Alternatively, a slope angle of at least a portion of a side surface of the first isolation sub-structure to a plane parallel to a contact surface of the first isolation sub-structure and the second isolation sub-structure is greater than 60 degrees and less than 120 degrees, and/or a slope angle of at least a portion of a side surface of the second isolation sub-structure to the plane parallel to the contact surface of the first isolation sub-structure and the second isolation sub-structure is greater than 60 degrees and less than 120 degrees. For example, the isolation portion may be formed between pixel defining patterns, e.g., located in an opening formed in the insulating layer, and is exposed by the second openings of the pixel defining patterns. Alternatively, the isolation portion may be located between adjacent sub-pixels and spaced apart from the first electrode, and the second opening of the pixel defining pattern exposes the isolation portion. Alternatively, the isolation portion is located on a side, far away from the base substrate, of the pixel defining portion.

The isolation portion provided in the present disclosure is not limited to the shape and position shown in FIG. 4A. For example, the isolation portion may further include a groove located in the insulating layer, and a shielding portion located at an edge of the groove and protruding into the opening of the groove. The shielding portion of the isolation portion is located between adjacent sub-pixels and spaced apart from the first electrodes of the adjacent sub-pixels. For example, the isolation portion may further include a groove located in the pixel defining portion, and a shielding portion located at an edge of the groove and protruding into the groove.

The isolation portion provided in the present disclosure is not limited to the shape and position shown in FIG. 4A. For example, the isolation portion may further include a first isolation sub-portion and a second isolation sub-portion that are stacked. The first isolation sub-portion is located between the second isolation sub-portion and the base substrate. A material of the first isolation sub-portion includes an inorganic material, and a material of the second isolation sub-portion includes an organic material. The second isolation sub-portion includes a protrusion protruding relative to an edge of the first isolation sub-portion. The protrusion is located between adjacent sub-pixels, and at least a portion, facing one of the adjacent sub-pixels, of the second isolation sub-portion and at least a portion, facing the other one of the adjacent sub-pixels, of the second isolation sub-portion have different shapes. The second isolation sub-portion of the isolation portion may be a portion of the pixel defining portion. The first isolation sub-portion may be disposed at a same layer with the first electrode of a sub-pixel, or the first isolation sub-portion may be a portion of the first electrode of the sub-pixel.

The isolation portion provided in the present disclosure is not limited to the shape and position shown in FIG. 4A. For example, the isolation portion may further include a first sub-structure and a second sub-structure that are stacked, and the first sub-structure is located between the second sub-structure and the base substrate. A material of the first sub-structure is different from a material of the second sub-structure. In the arrangement direction of adjacent sub-pixels, an edge of the second sub-structure of the defining structure located between the adjacent sub-pixels protrudes relative to an edge of the first sub-structure to form a protrusion. Alternatively, a slope angle of at least a portion of a side surface of the second sub-structure to a plane parallel to a contact surface of the first sub-structure and the second sub-structure is a first slope angle, and/or a slope angle of at least a portion of a side surface of the first sub-structure to the plane parallel to the contact surface of the first sub-structure and the second sub-structure is a second slope angle. At least one of the first slope angle and the second slope angle is greater than 60 degrees, and an area of a surface, close to the first sub-structure, of the second sub-structure is not smaller than that of the contact surface of the first sub-structure and the second sub-structure. The isolation portion is spaced apart from the first electrodes of the sub-pixels.

FIG. 2 schematically illustrates positions of a plurality of paths and does not illustrate width features of different paths.

In some examples, as shown in FIG. 2, a plurality of paths 300 include a plurality of trunk paths 310 and a plurality of branch paths 320. Two ends of at least one branch path 320 are connected to the trunk paths 310 of which extension directions intersect or are the same.

For example, the plurality of trunk paths 310 include a first trunk path 311 and a second trunk path 312 of which the extension directions intersect. For example, the plurality of trunk paths 310 include a plurality of first trunk paths 311 extending in the X-direction and a plurality of second trunk paths 312 extending in the Y-direction. When the first trunk path is a nonlinear line, e.g., a broken line, the extension direction of the first trunk path may refer to an overall extension direction of one first trunk path. For example, the overall extension direction of the broken line is the X-direction. When the second trunk path is a nonlinear line, e.g., a broken line, the extension direction of the second trunk path may refer to an overall extension direction of one second trunk path. For example, the overall extension direction of the broken line is the X-direction.

For example, an included angle between the X-direction and the Y-direction may be 30 to 150 degrees. For example, the included angle between the X-direction and the Y-direction may be 60 to 120 degrees. For example, the included angle between the X-direction and the Y-direction may be 80 to 100 degrees. For example, the X-direction may be perpendicular to the Y-direction.

For example, as shown in FIG. 2, the plurality of first trunk paths 311 and the plurality of second trunk paths 312 form a portion of the reticular path 30. The first trunk paths 311 are connected with the second trunk paths 312. Charge transported by the second electrodes 120 may be transported in the first trunk paths 311 and the second trunk paths 312.

In some examples, as shown in FIG. 2, the plurality of trunk paths 310 pass through a region where at least part of sub-pixels 10 are located.

For example, a length of the trunk path 310 is greater than that of a branch path 320. For example, an area of a region where one trunk path 310 is located is greater than that of a region where one branch path 320 is located. For example, an area of a region through which one trunk path 310 passes is greater than that of a region through which one branch path 320 passes. For example, the number of the light emitting regions 101 of the sub-pixels 10 through which one trunk path 310 passes is greater than that of the light emitting regions 101 of the sub-pixels 10 through which one branch path 320 passes. The path passing through the light emitting region of a sub-pixel refers to that an orthographic projection of the path on the base substrate overlaps an orthographic projection of the pixel light emitting region of the sub-pixel on the base substrate.

For example, the trunk path 310 may pass through a display region in the extension direction thereof. For example, the trunk path 310 extending in the X-direction may pass through the display region where the sub-pixels 10 are located in the X-direction, and the trunk path 310 extending in the Y-direction may pass through the display region where the sub-pixels 10 are located in the Y-direction. For example, the branch paths 320 are located in only one of regions where the trunk paths 310 are located or in some small-area regions. For example, one branch path 320 may be located within a region defined by four crisscrossed trunk paths 310.

In some examples, as shown in FIG. 2, two ends of at least one branch path 320 are connected to the first trunk path 311 and the second trunk path 312, respectively. For example, the path 300 includes a plurality of branch paths 320. Two ends of at least part of branch paths 320 are connected to the first trunk paths 311 and the second trunk paths 312, respectively. For example, different branch paths 320 may have a same shape or different shapes. For example, different branch paths 320 may have a same length or different lengths. The branch path being connected with the trunk path may refer to that the second electrode at the position of the branch path and the second electrode at the position of the trunk path are continuous, i.e., of an integrated structure.

For example, as shown in FIG. 2, at least one branch path 320 may be in a shape of a broken line, and two ends of the broken line are connected to the first trunk path 311 and the second trunk path 312, respectively. For example, one branch path 320 is capable of passing through the light emitting region 101 of at least one sub-pixel 10.

For example, as shown in FIG. 2, the branch paths 320 are connected with the trunk paths 310, and charge transported by the second electrodes 120 may be transported in the branch paths 320 and the trunk paths 310.

In some other examples, two ends of at least one branch path 320 are both connected to one of the first trunk path 311 and the second trunk path 312. For example, two ends of at least one branch path 320 may be connected to two different first trunk paths 311, respectively, or two ends of at least another branch path 320 may be connected to two different second trunk paths 312, respectively. For example, the extension direction of the branch path 320 may be different from that of the first trunk path 311 and that of the second trunk path 312. Alternatively, the branch path 320 has a same extension direction with one of the first trunk path 311 and the second trunk path 312.

In some examples, as shown in FIG. 1 to FIG. 3, the plurality of sub-pixels 10 include a plurality of first-color sub-pixels 11, a plurality of second-color sub-pixels 12, and a plurality of third-color sub-pixels 13. The plurality of sub-pixels 10 are arranged in a plurality of first sub-pixel sets 001 and a plurality of second sub-pixel sets 002 disposed alternately in a first direction. Each first sub-pixel set 001 includes the first-color sub-pixels 11 and the second-color sub-pixels 12 disposed alternately in a second direction, and each second sub-pixel set 002 includes the third-color sub-pixels 13 arranged in the second direction; and the first direction intersects the second direction. For example, the first direction may be the X-direction shown in FIG. 1, and the second direction may be the Y-direction shown in FIG. 1. The first direction and the second direction may be interchangeable. For example, an included angle between the first direction and the second direction may be 80 to 120 degrees. For example, the first direction is perpendicular to the second direction. For example, one of the first direction and the second direction may be the row direction, and the other one may be the column direction. For example, the first direction may be the row direction, while the second direction may be the column direction; and the first sub-pixel set may be a first sub-pixel column, while the second sub-pixel set may be a second sub-pixel column. The first direction may be the column direction, while the second direction may be the row direction; and the first sub-pixel set may be a first sub-pixel row, while the second sub-pixel set may be a second sub-pixel row.

In some examples, as shown in FIG. 1 to FIG. 3, the first sub-pixel sets 001 and the second sub-pixel sets 002 are distributed in a staggered manner in the second direction, and each first-color sub-pixel 11 of at least part of first-color sub-pixels 11 is surrounded by eight sub-pixels 10 that include the third-color sub-pixels 13 and the second-color sub-pixels 12 disposed alternately.

For example, as shown in FIG. 1 to FIG. 3, the first-color sub-pixels 11 and the second-color sub-pixels 12 are arranged alternately in the second direction, and the third-color sub-pixels 13 are arranged in an array in the first direction and the second direction. For example, each second-color sub-pixel 12 of at least part of second-color sub-pixels 12 is surrounded by eight sub-pixels 10 that include the third-color sub-pixels 13 and the first-color sub-pixels 11 disposed alternately.

For example, as shown in FIG. 1 to FIG. 3, one of the first-color sub-pixel 11 and the second-color sub-pixel 12 may be a red sub-pixel emitting red light, while the other one may be a blue sub-pixel emitting blue light. The third-color sub-pixel 13 may be a green sub-pixel emitting green light. For example, the first-color sub-pixel 11 is a blue sub-pixel, and the second-color sub-pixel 12 is a red sub-pixel.

For example, as shown in FIG. 1 to FIG. 3, a center of the light emitting region of the first-color sub-pixel 11 and a center of the light emitting region of the second-color sub-pixel 12 are in a straight line extending in the Y-direction. For example, as shown in FIG. 1 to FIG. 3, an included angle between a connecting line of the centers of the light emitting regions 101 of the adjacent first-color sub-pixel 11 and second-color sub-pixel 12 arranged in the Y-direction and the straight line extending in the Y-direction is small, e.g., not greater than 2 degrees.

For example, four third-color sub-pixels 13 are disposed in directions at 45°, 135°, 225°, and 315° angles of the center of the light emitting region of the first-color sub-pixel 11, respectively.

In some examples, as shown in FIG. 2, at least part of trunk paths 310 pass through the second sub-pixel sets 002.

Since serious crosstalk may easily occur between the first-color sub-pixel and the second-color sub-pixel, e.g., between the red sub-pixel and the blue sub-pixel, the trunk paths are designed to pass through the sub-pixel set of the third-color sub-pixels, and the branch paths are designed to pass through the branch path of the first-color sub-pixel and the second-color sub-pixel. For example, the isolation portion disposed around the first-color sub-pixel and the second-color sub-pixel covers the edges of the corresponding light emitting regions to a large extent, so that at least one common film layer between the first-color sub-pixel and the third-color sub-pixel and between the second-color sub-pixel and the third-color sub-pixel can be isolated indirectly while at least one common film layer between the first-color sub-pixel and the second-color sub-pixel is isolated. Thus, the second electrode surrounding the light emitting region of the third-color sub-pixel forms a wide trunk path to improve the charge transportation effect.

For example, at least part of trunk paths 310 pass through the light emitting region 101 of the third-color sub-pixel 13. The trunk path passing through the second sub-pixel set refers to that an orthographic projection of the trunk path on the base substrate overlaps orthographic projections of the light emitting regions of the second sub-pixel set on the base substrate.

For example, as shown in FIG. 2, the extension direction of the first trunk path 311 and the extension direction of the second trunk path 312 are both parallel to an arrangement direction of the third-color sub-pixels 13. For example, the second trunk path 312 passes through the second sub-pixel set 002. For example, the first trunk path 311 passes through the light emitting region 101 of the third-color sub-pixel 13. For example, the paths 300 passing through the third-color sub-pixels 13 may be all trunk paths 310.

For example, as shown in FIG. 2, an intersection position of the first trunk path 311 and the second trunk path 312 overlaps the light emitting region 101 of the third-color sub-pixel 13. For example, the path 300 at the intersection position of the first trunk path 311 and the second trunk path 312 is widest to improve the charge transportation effect.

In some examples, as shown in FIG. 2, at least one branch path 320 passes through at least one of the first-color sub-pixel 11 and the second-color sub-pixel 12. The branch path passing through at least one of the first-color sub-pixel and the second-color sub-pixel refers to that an orthographic projection of the branch path on the base substrate overlaps an orthographic projection of at least one of the light emitting region of the first-color sub-pixel and the light emitting region of the second-color sub-pixel on the base substrate.

For example, as shown in FIG. 2, one part of branch paths 320 of the plurality of branch paths 320 pass through the light emitting region 101 of the first-color sub-pixel 11, and the other part of branch paths 320 pass through the light emitting region 101 of the second-color sub-pixel 12. The embodiments of the present disclosure are not limited thereto. The branch path may only pass through the light emitting region of the first-color sub-pixel, or the branch path may only pass through the light emitting region of the second-color sub-pixel.

In some examples, as shown in FIG. 1 and FIG. 2, the isolation portion 210 includes a first isolation portion 211 in an unclosed ring shape surrounding at least one first-color sub-pixel 11. The first isolation portion 211 in the unclosed ring shape has at least two first fracture portions 212. At least one branch path 320 passes through the first fracture portions 212 to be connected with the trunk paths 310. The first isolation portion refers to a defining structure exposed by the second opening of the pixel defining pattern, and the first fracture portion is a defining structure covered by the pixel defining portion. The first isolation portion refers to a portion, exposed by the second opening, of the defining structure surrounding the light emitting region of the first-color sub-pixel.

In some examples, as shown in FIG. 1 and FIG. 2, the isolation portion 210 surrounding each first-color sub-pixel 11 is the first isolation portion 211. The first isolation portion 211 in the unclosed ring shape has two first fracture portions 212. One end of the branch path 320 passing through the light emitting region 101 of the first-color sub-pixel 11 passes through one first fracture portion 212 to be connected with the first trunk path 311, and the other end of the branch path 320 passes through the other first fracture portion 212 to be connected with the second trunk path 312. When the first isolation portion in the unclosed ring shape has two first fracture portions, the relative positional relationship of the two first fracture portions may be set such that two ends of the branch path passing through the light emitting region of the first-color sub-pixel pass through two different first fracture portions to be connected with the first trunk path and the second trunk path, respectively, or such that two ends of two first fracture portions passing through the light emitting region of the first-color sub-pixel are both connected with the first trunk path or both connected with the second trunk path.

For example, the number of the first fracture portions 212 of the first isolation portion 211 in the unclosed ring shape surrounding at least one first-color sub-pixel 11 is greater than two, and the branch path 320 passes through each first fracture portion 212 to be connected with the trunk paths 310. The number of the first trunk paths 311 connected to the branch path 320 may be the same as or different from the number of the second trunk paths 312 connected to the branch path 320.

In some examples, as shown in FIG. 2, at least one branch path 320 passes through at least two first fracture portion 212 to form at least one L-shaped branch path 320. The at least two first fracture portions include one first fracture portion located on a side of the light emitting region of the first-color sub-pixel in the first direction and one first fracture portion located on a side of the light emitting region of the first-color sub-pixel in the second direction.

For example, an orthographic projection of a corner of the L-shaped branch path 320 on the base substrate overlaps an orthographic projection of the light emitting region 101 of the first-color sub-pixel 11 on the base substrate. FIG. 2 schematically illustrates that one first-color sub-pixel corresponds to one L-shaped branch path. Without limitation thereto, the number and positions of the first fracture portions may be set such that a first-color sub-pixel corresponds to a plurality of L-shaped branch paths. The L-shaped branch paths correspond to a same first-color sub-pixel may share part of branch paths or be spaced apart.

In some examples, as shown in FIG. 1 and FIG. 2, at least a portion of the first isolation portion 211 is located between the first-color sub-pixel 11 and the third-color sub-pixel 13 disposed adjacently in a third direction. The first direction and the second direction both intersect the third direction. For example, the third direction may be the V-direction shown in FIG. 4A. A distance between edges, close to each other, of the first isolation portion 211 and the light emitting region 101 of the first-color sub-pixel 11 is a first distance D1, and a distance between edges, close to each other, of the first isolation portion 211 and the light emitting region 101 of the third-color sub-pixel 13 is a second distance D2. The first distance D1 is smaller than the second distance D2. The edge of the first isolation portion refers to an edge of the first isolation portion that is exposed by the second opening of the pixel defining pattern.

For example, only one isolation portion 210 (e.g., the first isolation portion 211) is disposed between the first-color sub-pixel 11 and the third-color sub-pixel 13 disposed adjacently, and the first isolation portion 211 is closer to the first-color sub-pixel 11, thereby being conducive to increasing the width of the trunk path of the second electrode at a position overlapping the third-color sub-pixel. Accordingly, the power consumption of the display substrate during displaying can be reduced.

For example, a ratio of the first distance D1 to the second distance D2 may be 0.1 to 0.9. For example, the ratio of the first distance D1 to the second distance D2 may be 0.2 to 0.7. For example, the ratio of the first distance D1 to the second distance D2 may be 0.3 to 0.8. For example, the ratio of the first distance D1 to the second distance D2 may be 0.45 to 0.65. For example, the ratio of the first distance D1 to the second distance D2 may be 0.5 to 0.58. For example, the ratio of the first distance D1 to the second distance D2 may be 0.55 to 0.6.

In some examples, as shown in FIG. 1 and FIG. 2, the first fracture portions 212 are configured to expose at least one angle 1010 of the light emitting region 101 of the first-color sub-pixel 11. For example, each first fracture portion 212 exposes one angle 1010 of the light emitting region 101 of the first-color sub-pixel 11, and different first fracture portions 212 corresponding to the same first-color sub-pixel 11 are configured to expose different angles 1010 of the light emitting region 101. For example, two angles 1010 exposed by two first fracture portions 212 corresponding to the same first-color sub-pixel 11 may be two adjacent angles 1010 or two opposite angles 1010.

In the embodiments of the present disclosure, the fracture portion exposing an angle of the light emitting region refers to that no isolation portion is disposed on a side, far away from the light emitting region, of the angle, with a connecting line passing through the vertex of the angle and the center of the light emitting region.

For example, as shown in FIG. 1 and FIG. 2, an isolation portion 210 is disposed between the first fracture portion 212 corresponding to the first-color sub-pixel 11 and the second-color sub-pixel 12 disposed adjacent to the first-color sub-pixel 11 to reduce the crosstalk between the first-color sub-pixel and the second-color sub-pixel.

For example, as shown in FIG. 1 and FIG. 2, the first isolation portion 211 is disposed between the first-color sub-pixel 11 and the third-color sub-pixel 13 disposed adjacently in the third direction; the first isolation portion 211 or the first fracture portion 212 is disposed between the first-color sub-pixel 11 and the second-color sub-pixel 12 disposed adjacently in the first direction; and the first isolation portion 211 or the first fracture portion 212 is disposed between the first-color sub-pixel 11 and the second-color sub-pixel 12 disposed adjacently in the second direction.

For example, as shown in FIG. 1, the first electrode 110 of each light emitting element includes a main body electrode 111 and a connecting electrode 112 that are disposed integrally. The main body electrode 111 overlaps the light emitting region 101, and a shape of the main body electrode 111 is approximately identical to that of the light emitting region 101. For example, the shape of the light emitting region 101 is a quadrangle, and the shape of the main body electrode 111 is also a quadrangle. The connecting electrode 112 does not overlap the light emitting region 101. For example, each sub-pixel further includes a driving circuit. The driving circuit is electrically connected to the first electrode of the light emitting element to drive the light emitting element to emit light. For example, the connecting electrode 112 is electrically connected to the driving circuit.

For example, as shown in FIG. 1, in the direction perpendicular to the base substrate 01, the first isolation portion 211 does not overlap the connecting electrode 112. That is, the pixel defining portion overlaps the connecting electrode 112. For example, the first fracture portion 212 exposes the connecting electrode 112 and a portion of the main body electrode 111.

In the display substrate provided in the present disclosure, the first isolation portion surrounding the light emitting region of the first-color sub-pixel is designed in the unclosed ring shape so that the charge paths (e.g., the branch paths) of the second electrodes can be increased, thereby being conducive to avoiding excessively high power consumption of the display substrate during displaying while reducing the crosstalk of the display substrate.

For example, as shown in FIG. 1 and FIG. 2, a size of the first fracture portion 212 corresponding to the connecting electrode 112 may be greater than that of other first fracture portion 212.

Figure 6:
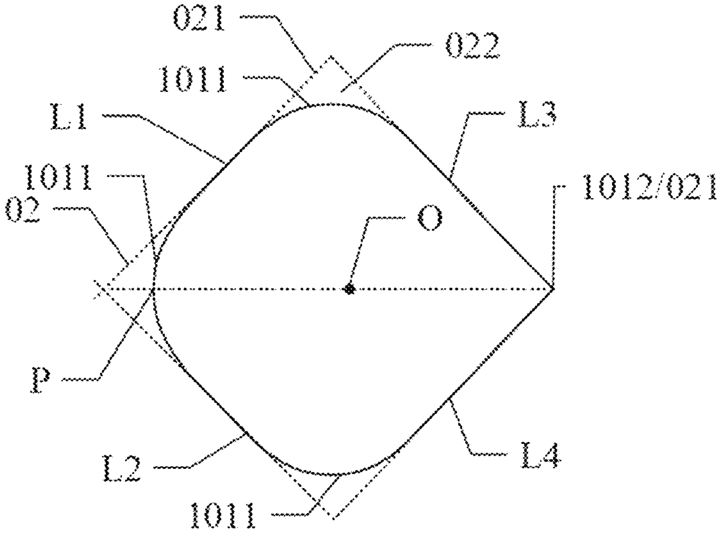
FIG. 6 is an enlarged schematic view of a light emitting region of a first-color sub-pixel shown in FIG. 1.

FIG. 6 is an enlarged schematic view of a light emitting region of a first-color sub-pixel shown in FIG. 1.

In some examples, as shown in FIG. 1 and FIG. 6, all edges of the light emitting region 101 of at least one first-color sub-pixel 11 or extended lines thereof are connected in sequence to form a polygon 02, and a plurality of vertex angles 021 of the polygon 02 have regions 022 not overlapping a plurality of angles of the corresponding light emitting region 101. The light emitting region 101 of at least one first-color sub-pixel 11 includes at least one particular angle 1011, and an area of the region 022, not overlapping the corresponding vertex angle 021 of the polygon 02, of the particular angle 1011 is greater than an area of the region of each angle 1012 of at least part of other angles 1012 that does not overlap the vertex angle 021 of the polygon 02 corresponding to the angle 1012. For example, the areas of other angles 1012, not overlapping the vertex angles 021 of the polygon 02 corresponding to the angles 1012, of the light emitting region 101 of the first-color sub-pixel 11 are tiny, e.g., substantially zero. That is, these angles of the light emitting region coincide with the vertex angles of the polygon.

For example, as shown in FIG. 6, a distance of an intersection point of extended lines of two straight edges L1 and L2 forming the particular angle 1011 to the center O of the light emitting region of the sub-pixel is different from that of an intersection point of two straight edges L3 and L4 forming another angle 1012 to the center O of the sub-pixel. For example, an intersection point of two lines is the vertex of the other angle. In this case, the other angle may be a range of x microns along the outline with the vertex as the center, and a value of x may be 2 to 7 microns. For example, the particular angle may be a segment of curve formed by portions extending from two adjacent edges towards the vertex thereof and intersecting such that the angle becomes a circular chamfer. For example, the particular angle 1011 includes a circular chamfer, and the vertex of the angle may be an intersection point P of a connecting line with the circular chamfer, and the connecting line is a connection line of an intersection point of extended lines of two edges for forming the circular chamfer and the vertex of the angle opposite to the circular chamfer with the circular chamfer. In this case, the angle may be a range of x microns along the outline with the vertex P as the center, and a value of x may be 2 to 7 microns. When the particular angle is a circular chamfer and other angles are right angles or acute angles, a distance of an intersection point of extended lines of two straight edges forming the particular angle to the center of the light emitting region of the sub-pixel is smaller than that of an intersection point of extended lines of two straight edges forming other angle to the center of the light emitting region of the sub-pixel.

The "circular chamfer" is a vertex angle formed by a segment of curve. The curve may a circular arc or an irregular curve, such as a curve or a wavy line taken from an ellipse. The embodiments of the present disclosure schematically illustrate that the curve is in a shape which is convex outwards relative to the center of the sub-pixel. Without limitation thereto, the curve may also be in a shape which is concave inwards relative to the center of the sub-pixel. For example, when the curve is a circular arc, a range of the central angle of the circular arc may be 10° to 150°. For example, the range of the central angle of the circular arc may be 60° to 120°. For example, the range of the central angle of the circular arc may be 90°. For example, a curve length of the circular chamfer included in the particular angle 1011 may be 10 to 60 microns. As a matter of course, the particular angle is not limited to the circular chamfer and may also be a flat chamfer.

In some examples, as shown in FIG. 1 and FIG. 2, the first fracture portion 212 is configured to expose the particular angle 1011. For example, the branch path 320 passes through the particular angle 1011 of the light emitting region 101 of the first-color sub-pixel 11 to be connected with the trunk path 310. For example, an orthographic projection of the branch path 320 on the base substrate 01 overlaps an orthographic projection of the particular angle 1011 on the base substrate 01.

In the embodiments of the present disclosure, the fracture portion exposing an angle may refer to that the fracture portion is opposite to the angle with no isolation portion disposed between the second electrode at the angle and the trunk path.

According to the present disclosure, at least one angle of the light emitting region of the first-color sub-pixel is set as the particular angle so that a distance between the particular angle and the light emitting region of a neighboring sub-pixel can be increased, thereby reducing the probability of crosstalk occurring between adjacent sub-pixels. Meanwhile, the first fracture portion is provided at the position of the particular angle, which is conducive to reducing the resistance of the second electrode, thereby reducing the power consumption of the display substrate during displaying.

For example, as shown in FIG. 1 and FIG. 2, the angles 1010 of the light emitting region 101 corresponding to each first fracture portion 212 are all particular angles 1011. For example, the number of the first fracture portions 212 corresponding to the light emitting region 101 of a same first-color sub-pixel 11 is not greater than that of the particular angles 1011 included in the light emitting region 101.

In some examples, as shown in FIG. 1 and FIG. 2, the isolation portion 210 includes a second isolation portion 213 in the unclosed ring shape surrounding at least one second-color sub-pixel 12. The second isolation portion 213 has at least two second fracture portions 214. At least one branch path 320 passes through the second fracture portions 214 to be connected with the trunk paths 310. The second isolation portion refers to a defining structure exposed by the second opening of the pixel defining pattern, and the second fracture portion is a defining structure covered by the pixel defining portion. The second isolation portion refers to a portion, exposed by the second opening, of a defining structure surrounding the light emitting region of the first-color sub-pixel.

For example, as shown in FIG. 1 and FIG. 2, the isolation portion 210 surrounding each second-color sub-pixel 12 is the second isolation portion 213. The second isolation portion 213 in the unclosed ring shape has two second fracture portions 214. One end of the branch path 320 passing through the light emitting region 101 of the second-color sub-pixel 12 passes through one second fracture portion 214 to be connected with the first trunk path 311, and the other end of the branch path 320 passes through the other second fracture portion 214 to be connected with the second trunk path 312. When the second isolation portion in the unclosed ring shape has two second fracture portions, the relative positional relationship of the two second fracture portions may be set such that two ends of the branch path passing through the light emitting region of the second-color sub-pixel pass through two different second fracture portions to be connected with the first trunk path and the second trunk path, respectively, or such that two ends passing through the light emitting region of the second-color sub-pixel are both connected with the first trunk path or both connected with the second trunk path.

For example, the number of the second fracture portions 214 of the second isolation portion 213 in the unclosed ring shape surrounding at least one second-color sub-pixel 12 is greater than two, and the branch path 320 passes through each second fracture portion 214 to be connected with the trunk paths 310. The number of the first trunk paths 311 connected to the branch path 320 may be the same as or different from the number of the second trunk paths 312 connected to the branch path 320.

In some examples, as shown in FIG. 2, at least one branch path 320 passes through at least two second fracture portions 214 to form at least one L-shaped branch path. The at least two second fracture portions include one second fracture portion located on a side of the light emitting region of the second-color sub-pixel in the first direction and one second fracture portion located on a side of the light emitting region of the second-color sub-pixel in the second direction.

For example, an orthographic projection of a corner of the L-shaped branch path 320 on the base substrate overlaps an orthographic projection of the light emitting region 101 of the second-color sub-pixel 12 on the base substrate. FIG. 2 schematically illustrates that one second-color sub-pixel corresponds to one L-shaped branch path. Without limitation thereto, the number and positions of the second fracture portions may be set such that a second-color sub-pixel corresponds to a plurality of L-shaped branch paths. The L-shaped branch paths correspond to a same second-color sub-pixel may share part of branch paths or be spaced apart.

In some examples, as shown in FIG. 1 and FIG. 2, at least a portion of the second isolation portion 213 is located between the second-color sub-pixel 12 and the third-color sub-pixel 13 disposed adjacently in the third direction. The first direction and the second direction both intersect the third direction. For example, the third direction may be the V-direction shown in FIG. 4A. A distance between edges, close to each other, of the second isolation portion 213 and the light emitting region 101 of the second-color sub-pixel 12 is a third distance D3, and a distance between edges, close to each other, of the second isolation portion 213 and the light emitting region 101 of the third-color sub-pixel 13 is a fourth distance D4. The third distance D3 is smaller than fourth second distance D4. The edge of the second isolation portion refers to an edge of the second isolation portion that is exposed by the second opening of the pixel defining pattern.

For example, only one isolation portion 210 (e.g., the second isolation portion 213) is disposed between the second-color sub-pixel 12 and the third-color sub-pixel 13 disposed adjacently, and the second isolation portion 213 is closer to the second-color sub-pixel 12, thereby being conducive to increasing the width of the trunk path of the second electrode at a position overlapping the third-color sub-pixel. Accordingly, the power consumption of the display substrate during displaying can be reduced.

For example, a ratio of the third distance D3 to the fourth distance D4 may be 0.1 to 0.9. For example, the ratio of the third distance D3 to the fourth distance D4 may be 0.2 to 0.7. For example, the ratio of the third distance D3 to the fourth distance D4 may be 0.3 to 0.8. For example, the ratio of the third distance D3 to the fourth distance D4 may be 0.45 to 0.65. For example, the ratio of the third distance D3 to the fourth distance D4 may be 0.5 to 0.58. For example, the ratio of the third distance D3 to the fourth distance D4 may be 0.55 to 0.6.

In some examples, as shown in FIG. 1 and FIG. 2, the first isolation portion 211 and the second fracture portion 214, or the second isolation portion 213 and the first fracture portion 212 are disposed between adjacent first-color sub-pixel 11 and second-color sub-pixel 12 such that the path between the adjacent first-color sub-pixel and second-color sub-pixel has a great width at the position of the fracture portion while at least one layers of the light emitting functional layers and the second electrodes of the adjacent first-color sub-pixel and second-color sub-pixel are isolated. Thus, the resistance of the second electrodes is reduced to reduce the power consumption of the display substrate during displaying.

For example, as shown in FIG. 1 and FIG. 2, the second fracture portions 214 are configured to expose at least one angle 1020 of the light emitting region 101 of the second-color sub-pixel 12. For example, each second fracture portion 214 exposes one angle 1020 of the light emitting region 101 of the second-color sub-pixel 12, and different second fracture portions 214 corresponding to the same second-color sub-pixel 12 are configured to expose different angles 1020 of the light emitting region 101. For example, two angles 1020 exposed by two second fracture portions 214 corresponding to the same second-color sub-pixel 13 may be two adjacent angles 1020 or two opposite angles 1020.

For example, as shown in FIG. 1 and FIG. 2, the branch path 320 passing through the light emitting region 101 of the second-color sub-pixel 12 passes through an angle 1020 of the light emitting region 101 to be connected with the trunk path 310.

For example, as shown in FIG. 1 and FIG. 2, the light emitting region 101 of the first-color sub-pixel 11 includes four edges, and each edge is correspondingly provided with the first isolation portion 211. The light emitting region 101 of the second-color sub-pixel 12 includes four edges, and each edge is correspondingly provided with the second isolation portion 213. The light emitting region 101 of the third-color sub-pixel 13 includes four edges, and each edge is correspondingly provided with the first isolation portion 211 or the second isolation portion 213.

For example, as shown in FIG. 1 and FIG. 2, the first isolation portion 211 in the unclosed ring shape includes a first sub-portion surrounding three edges of the light emitting region 101 of the first-color sub-pixel 11 and a second sub-portion corresponding to a fourth edge of the light emitting region 101 of the first-color sub-pixel 11. A gap is formed between each of two ends of the second sub-portion and the first sub-portion, and the gap is the first fracture portion 212.

For example, as shown in FIG. 1 and FIG. 2, the second isolation portion 213 in the unclosed ring shape includes a third sub-portion surrounding three edges of the light emitting region 101 of the second-color sub-pixel 12 and a fourth sub-portion corresponding to a fourth edge of the light emitting region 101 of the second-color sub-pixel 12. A gap is formed between each of two ends of fourth sub-portion and the third sub-portion, and the gap is the second fracture portion 214.

For example, as shown in FIG. 1 and FIG. 2, a relative position relationship between the first sub-portion and the second sub-portion of the first isolation portion 211 is the same as that between the third sub-portion and the fourth sub-portion of the second isolation portion 213.

For example, as shown in FIG. 1 and FIG. 2, the light emitting region 101 of the third-color sub-pixel 13 includes two long edges disposed oppositely and two short edges disposed oppositely. The second sub-portion of the first isolation portion 211 corresponds to the long edges of the light emitting region 101 of the third-color sub-pixel 13, and the fourth sub-portion of the second isolation portion 213 corresponds to the short edges of the light emitting region 101 of the third-color sub-pixel 13. A length of the second sub-portion of the first isolation portion 211 is greater than that of the fourth sub-portion of the second isolation portion 213.

In the display substrate, if the crosstalk between adjacent sub-pixels is minimized, it is easy to result in high resistance of the second electrodes. If the resistance of the second electrodes is kept at a low level, it is easy to result in great crosstalk between adjacent sub-pixels. In the display substrate provided in the present disclosure, the isolation portion is disposed between two sub-pixels disposed adjacently in any direction and at least part of isolation portions are designed into unclosed ring structures, thereby being conducive to keeping the resistance of the second electrodes at a low level while reducing the crosstalk between adjacent sub-pixels. The crosstalk and the power consumption parameter of the display substrate is balanced.

The isolation portions are disposed around the sub-pixels to prevent the crosstalk between the sub-pixels. Meanwhile, part of paths (e.g., cathode paths) need to be maintained between adjacent sub-pixels, guaranteeing that a voltage difference between cathode electrodes is within a certain range while reducing the crosstalk between sub-pixels.

For example, as shown in FIG. 1 to FIG. 3, the isolation portion 210 includes a portion extending in a direction intersecting both of the row direction and the column direction. With such an extension direction of the isolation portion, the path of the second electrode may include an edge extending in a direction intersecting both of the row direction and the column direction, thereby being conducive to improving the convergence and connection effect of the paths of the second electrodes extending in different directions.

For example, as shown in FIG. 1 to FIG. 3, the isolation portion 210 includes a portion extending in a direction parallel to at least one of the row direction and the column direction.

With such an extension direction of the isolation portion, the extension direction of the path of the second electrode may be controlled.

Figure 7:
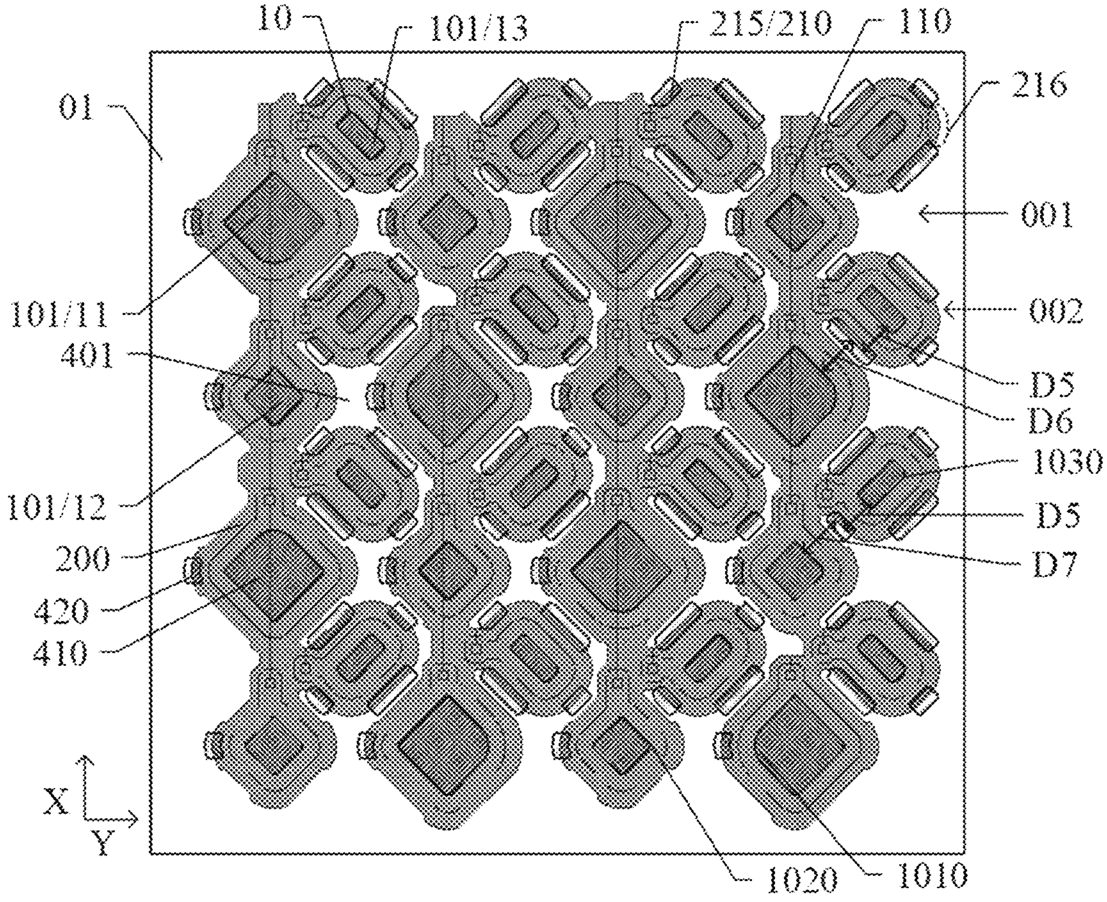
FIG. 7 and FIG. 8 are schematic diagrams illustrating a partial planar structure of another display substrate provided according to an embodiment of the present disclosure.
Figure 8:
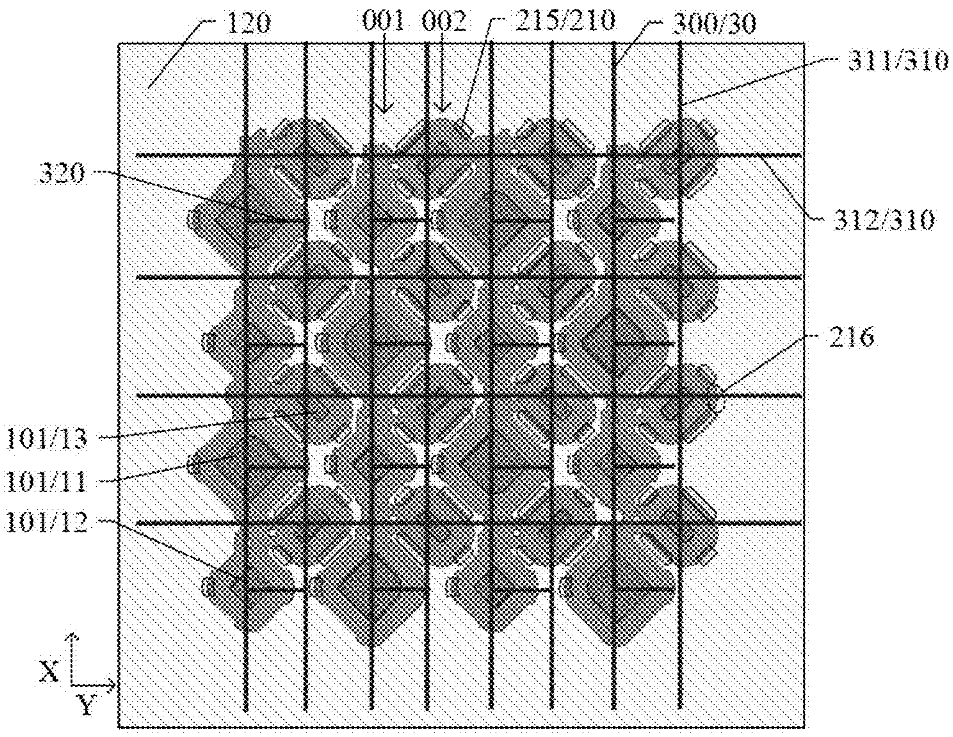

FIG. 7 and FIG. 8 are schematic diagrams illustrating a partial planar structure of another display substrate provided according to an embodiment of the present disclosure. FIG. 7 illustrates the first electrode of the light emitting element and does not illustrate the second electrode of the light emitting element. FIG. 8 illustrates the second electrode of the light emitting element and does not illustrate the first electrode of the light emitting element. The display substrate shown in FIG. 7 and FIG. 8 differs from the display substrate shown in FIG. 1 in that the reticular path of the second electrodes is changed by changing the shapes and positions of the isolation portions without changing the arrangement of pixels. FIG. 8 schematically illustrates routes of the paths and does not illustrate a shape of the paths. The second electrodes in the display substrate include a path having an uneven width, and an orthographic projection of a widest portion of the path on the base substrate overlaps the orthographic projection of the light emitting region on the base substrate. The base substrate, the insulating layer, the defining structure, the pixel defining portion, the first opening, and the light emitting element shown in the present example have the same features with those shown in FIG. 1, which will not be described here redundantly.

In some examples, as shown in FIG. 8, a plurality of trunk paths 310 further include a trunk path 310 passing through the first sub-pixel set 001. For example, the plurality of trunk paths 310 further include a trunk path 310 passing through the light emitting region 101 of the first-color sub-pixel 11 and the light emitting region 101 of the second-color sub-pixel 12. The display substrate shown in FIG. 8 is described by taking for example that the Y-direction is the first direction and the X-direction is the second direction. For example, at least one trunk path 310 passes through the first sub-pixel set 001.

For example, as shown in FIG. 8, the trunk paths 310 pass through the first sub-pixel set 001 and the second sub-pixel set 002. For example, the trunk paths 310 pass through the light emitting region 101 of the first-color sub-pixel 11, the light emitting region 101 of the second-color sub-pixel 12, and the light emitting region 101 of the third-color sub-pixel 13. For example, one of the first trunk path 311 and the second trunk path 312 of the trunk paths 310 passes through the first sub-pixel set 001 and the second sub-pixel set 002.

The trunk paths and the branch paths in the display substrate shown in FIG. 8 have the same definitions with those in the display substrate shown in FIG. 2, which will not be described here redundantly.

In the display substrate provided in the present disclosure, the plurality of trunk paths includes the trunk path passing through the first sub-pixel set and the second sub-pixel set, and a large number of trunk paths are provided, thereby being conducive to reducing the resistance of the second electrodes. Thus, the power consumption of the display substrate during displaying is reduced.

In some examples, as shown in FIG. 7 and FIG. 8, the isolation portion 210 includes a third isolation portion 215 in the unclosed ring shape surrounding at least one third-color sub-pixel 13. The third isolation portion 215 in the unclosed ring shape has at least two third fracture portions 216 exposing angles 1030 of the light emitting region 101 of the third-color sub-pixel 13. At least one trunk path 310 passes through the third fracture portions 216. The third isolation portion refers to a defining structure exposed by the second opening of the pixel defining pattern, and the third fracture portion is a defining structure covered by the pixel defining portion. The third isolation portion refers to a portion, exposed by the second opening, of a defining structure surrounding the light emitting region of the third-color sub-pixel.

For example, as shown in FIG. 7 and FIG. 8, the trunk path 310 passes through an angle 1030 of the third-color sub-pixel 13.

For example, as shown in FIG. 7 and FIG. 8, the third isolation portion 215 corresponding to the same third-color sub-pixels 13 has four third fracture portions 216 such that the first trunk path 311 passes through two third fracture portions 216 disposed oppositely and the second trunk path 312 passes through the other two third fracture portions 216 disposed oppositely, and the first trunk path 311 and the second trunk path 312 intersect within the light emitting region 101 of the third-color sub-pixel 13.

For example, as shown in FIG. 7 and FIG. 8, the light emitting region 101 of the third-color sub-pixel 13 includes four edges. The third isolation portion 215 in the unclosed ring shape includes fifth sub-portions and sixth sub-portions disposed alternately. Gaps between the fifth sub-portions and the sixth sub-portions are the third fracture portions 216. Two fifth sub-portions and two sixth sub-portions are disposed corresponding to the four edges of the light emitting region 101, respectively. For example, the light emitting region 101 of the third-color sub-pixel 13 includes two long edges disposed oppositely and two short edges disposed oppositely. The fifth sub-portions correspond to the long edges, and the sixth sub-portions correspond to the short edges. A length of the fifth sub-portion is greater than that of the sixth sub-portion. For example, the length of the fifth sub-portion is not less than that of the long edge, and the length of the sixth sub-portion is not less than that of the short edge.

In some examples, as shown in FIG. 7 and FIG. 8, the third isolation portion 215 is located between the first-color sub-pixel 11 and the third-color sub-pixel 13 disposed adjacently in the third direction. The first direction and the second direction both intersect the third direction. For example, the fifth sub-portions or the sixth sub-portions of the third isolation portion 215 are disposed between the first-color sub-pixel 11 and the third-color sub-pixel 13.

In some examples, as shown in FIG. 7 and FIG. 8, a distance between edges, close to each other, of the third isolation portion 215 and the light emitting region 101 of the third-color sub-pixel 13 is a fifth distance D5, and a distance between edges, close to each other, of the third isolation portion 215 and the light emitting region 101 of the first-color sub-pixel 11 is a sixth distance D6. The fifth distance D5 is smaller than the sixth distance D6.

For example, as shown in FIG. 7 and FIG. 8, an area of the light emitting region 101 of the first-color sub-pixel 11 is greater than that of the light emitting region 101 of the third-color sub-pixel 13. A width of the trunk path 310 at a position overlapping the light emitting region 101 of the first-color sub-pixel 11 is greater than that of the trunk path 310 at a position overlapping the light emitting region 101 of the third-color sub-pixel 13. For example, only one isolation portion 210 (e.g., the third isolation portion 215) is disposed between the first-color sub-pixel 11 and the third-color sub-pixel 13 disposed adjacently, and the third isolation portion 215 is closer to the third-color sub-pixel 13, thereby being conducive to further increasing the width of the trunk path of the second electrode at the position overlapping the first-color sub-pixel. Accordingly, the power consumption of the display substrate during displaying can be reduced. Moreover, in the display substrate, the area of the orthographic projection of the isolation portion on the base substrate is small. For example, the isolation portion is disposed only at a position where crosstalk is most prone to occurring between adjacent sub-pixels, and each isolation portion has a small size so that a size of conduction paths of the second electrodes can be greatly increased. This is applicable to a scenario having a high requirement on power consumption.

For example, a ratio of the fifth distance D5 to the sixth distance D6 may be 0.1 to 0.9. For example, the ratio of the fifth distance D5 to the sixth distance D6 may be 0.2 to 0.7. For example, the ratio of the fifth distance D5 to the sixth distance D6 may be 0.3 to 0.8. For example, the ratio of the fifth distance D5 to the sixth distance D6 may be 0.45 to 0.65. For example, the ratio of the fifth distance D5 to the sixth distance D6 may be 0.5 to 0.58. For example, the ratio of the fifth distance D5 to the sixth distance D6 may be 0.55 to 0.6.

In some examples, as shown in FIG. 7 and FIG. 8, the third isolation portion 215 is located between the second-color sub-pixel 12 and the third-color sub-pixel 13 disposed adjacently in the third direction. The first direction and the second direction both intersect the third direction. For example, the fifth sub-portions or the sixth sub-portions of the third isolation portion 215 are disposed between the second-color sub-pixel 12 and the third-color sub-pixel 13.

In some examples, as shown in FIG. 7 and FIG. 8, the distance between the edges, close to each other, of the third isolation portion 215 and the light emitting region 101 of the third-color sub-pixel 13 is the fifth distance D5, and a distance between edges, close to each other, of the third isolation portion 215 and the light emitting region 101 of the second-color sub-pixel 12 is a seventh distance D7. The fifth distance D5 is smaller than the seventh second distance D7.

For example, as shown in FIG. 7 and FIG. 8, an area of the light emitting region 101 of the second-color sub-pixel 12 is greater than that of the light emitting region 101 of the third-color sub-pixel 13. A width of the trunk path 310 at a position overlapping the light emitting region 101 of the second-color sub-pixel 12 is greater than that of the trunk path 310 at the position overlapping the light emitting region 101 of the third-color sub-pixel 13. Only one isolation portion 210 (e.g., the third isolation portion 215) is disposed between the second-color sub-pixel 12 and the third-color sub-pixel 13 disposed adjacently, and the third isolation portion 215 is closer to the third-color sub-pixel 13, thereby being conducive to further increasing the width of the trunk path of the second electrode at the position overlapping the second-color sub-pixel. Accordingly, the power consumption of the display substrate during displaying can be reduced.

For example, a ratio of the fifth distance D5 to the seventh distance D7 may be 0.1 to 0.9. For example, the ratio of the fifth distance D5 to the seventh distance D7 may be 0.2 to 0.7. For example, the ratio of the fifth distance D5 to the seventh distance D7 may be 0.3 to 0.8. For example, the ratio of the fifth distance D5 to the seventh distance D7 may be 0.45 to 0.65. For example, the ratio of the fifth distance D5 to the seventh distance D7 may be 0.5 to 0.58. For example, the ratio of the fifth distance D5 to the seventh distance D7 may be 0.55 to 0.6.

In the display substrate, since the crosstalk between sub-pixels mainly occurs in a direction of straight edges, close to each other, of adjacent sub-pixels and a low degree of crosstalk occurs between angles, close to each other, of the adjacent sub-pixels due to a long crosstalk route, the risk of crosstalk occurring between the sub-pixels is still low in the case of no isolation portion disposed between the angles, close to each other, of the adjacent sub-pixels (e.g., the angles of the first-color sub-pixel and the third-color sub-pixel, or the angles of the second-color sub-pixel and the third-color sub-pixel); meanwhile, the conducive paths of the second electrodes can also be increased and the resistance can be reduced.

In some examples, as shown in FIG. 7 FIG. 8, the isolation portion 210 further includes a fourth isolation portion 217. The fourth isolation portion 217 is located between adjacent first-color sub-pixel 11 and the second-color sub-pixel 12 arranged in the second direction or the first direction to reduce the probability of crosstalk occurring between the first-color sub-pixel and the second-color sub-pixel.

For example, as shown in FIG. 7 and FIG. 8, a gap is formed between the fourth isolation portion 217 and the third isolation portion 215. For example, two third isolation portions 215 (e.g., two fifth sub-portions or two sixth sub-portions) are disposed on two sides of the fourth isolation portion 217, respectively. The present disclosure is not limited thereto. The fourth isolation portion may also be integrated with the third isolation portion.

For example, as shown in FIG. 7 and FIG. 8, an angle 1010 of the light emitting region 101 of the first-color sub-pixel 11 is opposite to an angle 1020 of the light emitting region 101 of the second-color sub-pixel 12, and the fourth isolation portion 217 is located between the angle 1010 of the first-color sub-pixel 11 and the angle 1020 of the second-color sub-pixel 12. A distance between angles, close to each other, of the first-color sub-pixel and the second-color sub-pixel disposed adjacently is small, and the fourth isolation portion is disposed between the two angles and spaced apart from the third isolation portion so that an excessive increase in the resistance of the second electrodes cannot be caused while reducing the probability of crosstalk occurring between the first-color sub-pixel and the second-color sub-pixel.

For example, as shown in FIG. 7 and FIG. 8, the fourth isolation portion 217 may be disposed only between adjacent first-color sub-pixel 11 and second-color sub-pixel 12 arranged in the first direction such that the trunk path 310 passes through the first-color sub-pixel 11 and the second-color sub-pixel 12 arranged in the second direction. As a matter of course, the present disclosure is not limited thereto. The fourth isolation portion may be disposed only between adjacent first-color sub-pixel and second-color sub-pixel arranged in the second direction such that the trunk path passes through the first-color sub-pixel and the second-color sub-pixel arranged in the first direction.

For example, as shown in FIG. 7 and FIG. 8, the branch path 320 may pass through the light emitting region 101 of the first-color sub-pixel 11, and may also pass through the light emitting region 101 of the second-color sub-pixel 12. For example, two ends of the branch path 320 are connected to two trunk paths 310 extending in a same direction, respectively. For example, the two ends of the branch path 320 are connected to two first trunk paths 311, respectively, or the two ends of the branch path 320 are connected to two second trunk paths 312, respectively.

FIG. 8 schematically illustrates only the branch paths extending in the Y-direction. Without limitation thereto, the second electrodes may further include a branch path passing through between the third isolation portion and the fourth isolation portion.

For example, as shown in FIG. 7 and FIG. 8, a distance between edges, close to each other, of the fourth isolation portion 217 located between the first-color sub-pixel 11 and the second-color sub-pixel 12 and the light emitting region 101 of the first-color sub-pixel 11 is different from that between edges, close to each other, of the fourth isolation portion 217 and the light emitting region 101 of the second-color sub-pixel 12. For example, a plurality of fourth isolation portions 217 arranged in the Y-direction are all close to the light emitting regions 101 of sub-pixels located on a same side. For example, an odd-numbered fourth isolation portion 217 is closer to the light emitting region 101 of the first-color sub-pixel 11, and an even-numbered fourth isolation portion 217 is closer to the light emitting region 101 of the second-color sub-pixel 12.

The present disclosure is not limited to that only one fourth isolation portion is disposed between adjacent first-color sub-pixel and second-color sub-pixel, and two fourth isolation portions or more fourth isolation portions may also be possible.

Figure 9:
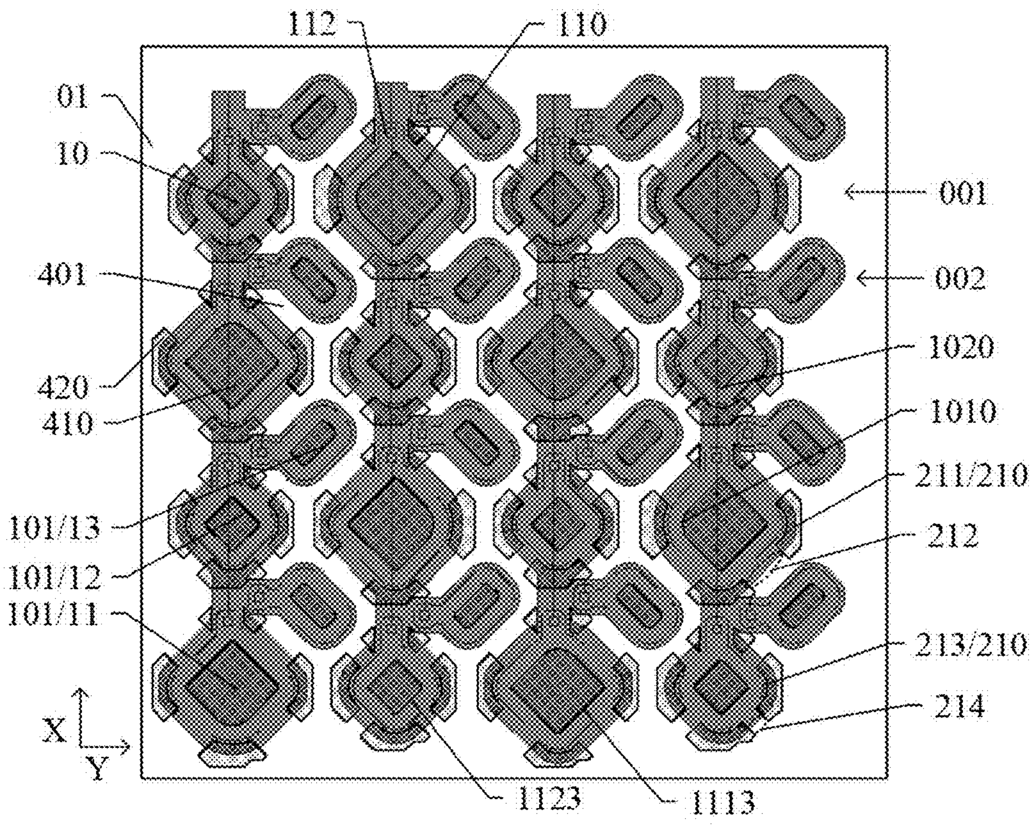
FIG. 9 and FIG. 10 are schematic diagrams illustrating a partial planar structure of another display substrate provided according to an embodiment of the present disclosure.
Figure 10:
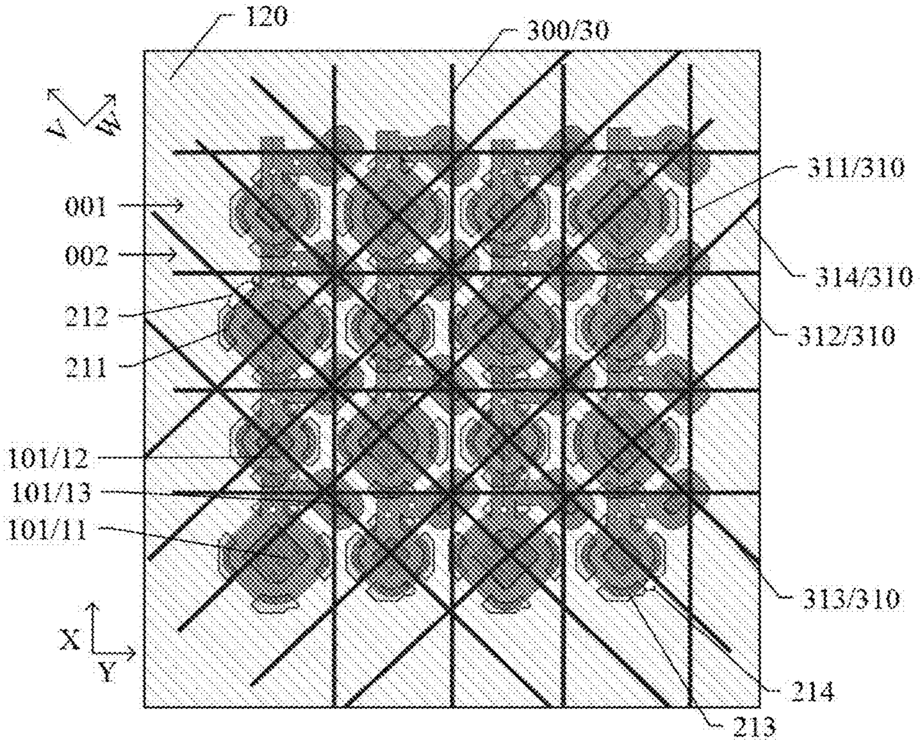

FIG. 9 and FIG. 10 are schematic diagrams illustrating a partial planar structure of another display substrate provided according to an embodiment of the present disclosure. FIG. 9 illustrates the first electrode of the light emitting element and does not illustrate the second electrode of the light emitting element. FIG. 10 illustrates the second electrode of the light emitting element and does not illustrate the first electrode of the light emitting element. The display substrate shown in FIG. 9 and FIG. 10 differs from the display substrate shown in FIG. 1 in that the reticular path of the second electrodes is changed by changing the shapes and positions of the isolation portions without changing the arrangement of pixels. FIG. 10 schematically illustrates routes of the paths and does not illustrate a shape of the paths. The second electrodes in the display substrate include a path having an uneven width, and an orthographic projection of a widest portion of the path on the base substrate overlaps the orthographic projection of the light emitting region on the base substrate. The trunk paths in the display substrate shown in FIG. 9 have the same definitions with those in the display substrate shown in FIG. 2, which will not be described here redundantly. The base substrate, the insulating layer, the defining structure, the pixel defining portion, the first opening, and the light emitting element shown in the present example have the same features with those shown in FIG. 1, which will not be described here redundantly.

In some examples, as shown in FIG. 9 and FIG. 10, the isolation portion 210 includes a first isolation portion 211 in an unclosed ring shape surrounding the light emitting region 101 of at least one first-color sub-pixel 11. The first isolation portion 211 in the unclosed ring shape has at least two first fracture portions 212 exposing at least two edges 1113 of the light emitting region 101 of the first-color sub-pixel 11. The trunk path 310 passes through two first fracture portions 212. For example, one edge 1113 of the light emitting region 101 of the first-color sub-pixel 11 is disposed opposite to one first fracture portion 212. The first isolation portion refers to a portion, exposed by the second opening, of a defining structure surrounding the light emitting region of the first-color sub-pixel.

For example, as shown in FIG. 9 and FIG. 10, a plurality of trunk paths 310 include a trunk path 310 passing through the light emitting region 101 of the third-color sub-pixel 13, and a trunk path 310 passing through the light emitting region 101 of the first-color sub-pixel 11 and the light emitting region 101 of the second-color sub-pixel 12. For example, the plurality of trunk paths 310 include a first trunk path 311 and a second trunk path 312 passing through the light emitting region 101 of the third-color sub-pixel 13. An extension direction of the first trunk path 311 intersects that of the second trunk path 312, and the first trunk path 311 and the second trunk path 312 intersect at the light emitting region 101 of the third-color sub-pixel 13.

For example, as shown in FIG. 9 and FIG. 10, the plurality of trunk paths 310 further include a third trunk path 313 passing through the light emitting region 101 of the first-color sub-pixel 11. For example, the third trunk path 313 further passes through the light emitting region 101 of the third-color sub-pixel 13.

For example, as shown in FIG. 9 and FIG. 10, by setting the number of the first fracture portions 212 of the first isolation portion 211 corresponding to a same first-color sub-pixel 11, the number of the third trunk paths 313 passing through the light emitting region 101 of the first-color sub-pixel 11 may be adjusted. For example, a same first-color sub-pixel 11 corresponds to five first fracture portions 212, wherein two first fracture portions 212 are disposed oppositely in the third direction (e.g., the V-direction), and two first fracture portions 212 disposed oppositely in a fourth direction and a fifth first fracture portion 212 is kept away from the connecting electrode 112 of the first electrode 110 of the first-color sub-pixel 11. For example, the fifth first fracture portion 212 exposes one angle 1010 of the light emitting region 101 of the first-color sub-pixel 11, and one third trunk path 313 extending in the third direction and one third trunk path 313 extending in the fourth direction pass through the same first-color sub-pixel 11. For example, no first isolation portion 211 is disposed between the first-color sub-pixel 11 and the third-color sub-pixels 13. Thus, the third trunk path may pass through the light emitting region of the first-color sub-pixel, the first fracture portions, and the light emitting region of the third-color sub-pixels in sequence.

For example, as shown in FIG. 9 and FIG. 10, at least one angle 1010 of the light emitting region 101 of the first-color sub-pixel 11 is surrounded by the first isolation portion 211, and the first isolation portion 211 is located between adjacent first-color sub-pixel 11 and second-color sub-pixel 12 to reduce the probability of crosstalk occurring between the first-color sub-pixel and the second-color sub-pixel.

For example, as shown in FIG. 9 and FIG. 10, a distance between edges, close to each other, of the first isolation portion 211 disposed between the first-color sub-pixel 11 and the second-color sub-pixel 12 and the light emitting region 101 of the first-color sub-pixel 11 is a first sub-distance, and a distance between edges, close to each other, of the first isolation portion 211 and the light emitting region 101 of the second-color sub-pixel 12 is a second sub-distance. The first sub-distance is smaller than the second sub-distance. That is, the first isolation portion 211 is closer to the light emitting region 101 of the first-color sub-pixel 11.

For example, as shown in FIG. 9 and FIG. 10, the first isolation portion 211 includes a plurality of sub-portions spaced apart, and the first fracture portions 212 are disposed between adjacent sub-portions. For example, a size of the first fracture portion 212 is smaller than a length of an edge 1113 of the light emitting region 101 of the first-color sub-pixel 11.

In some examples, as shown in FIG. 9 and FIG. 10, the isolation portion 210 includes a second isolation portion 213 in the unclosed ring shape surrounding at least one second-color sub-pixel 12. The second isolation portion 212 in the unclosed ring shape has at least two second fracture portions 214 exposing at least two edges 1123 of the light emitting region 101 of the second-color sub-pixel 11. The first isolation portion 211 is disposed opposite to the second isolation portion 213. The second isolation portion refers to a portion, exposed by the second opening, of a defining structure surrounding the light emitting region of the first-color sub-pixel.

For example, as shown in FIG. 9 and FIG. 10, the second isolation portion 213 is located between the first-color sub-pixel 11 and the second-color sub-pixel 12. For example, the first isolation portion 211 and the second isolation portion 213 are disposed between the first-color sub-pixel 11 and the second-color sub-pixel 12.

For example, as shown in FIG. 9 and FIG. 10, the plurality of trunk paths 310 further include a fourth trunk path 314 passing through the light emitting region 101 of the second-color sub-pixel 12. For example, the fourth trunk path 314 further passes through the light emitting regions 101 of the third-color sub-pixels 13.

For example, as shown in FIG. 9 and FIG. 10, by setting the number of the second fracture portions 214 of the second isolation portion 213 corresponding to a same second-color sub-pixel 12, the number of the fourth trunk paths 314 passing through the light emitting region 101 of the second-color sub-pixel 12 may be adjusted. For example, a same second-color sub-pixel 12 corresponds to five second fracture portions 214, wherein two second fracture portions 214 are disposed oppositely in the third direction (e.g., the V-direction), and two second fracture portions 214 disposed oppositely in the fourth direction (e.g., the W-direction) and a fifth second fracture portion 214 is kept away from the connecting electrode 112 of the first electrode 110 of the second-color sub-pixel 12. For example, the fifth second fracture portion 214 exposes one angle 1020 of the light emitting region 101 of the second-color sub-pixel 12, and one fourth trunk path 314 extending in the third direction and one fourth trunk path 314 extending in the fourth direction pass through the same second-color sub-pixel 12. For example, no second isolation portion 213 is disposed between the second-color sub-pixel 12 and the third-color sub-pixels 13. Thus, the fourth trunk path may pass through the light emitting region of the second-color sub-pixel, the second fracture portions, and the light emitting region of the third-color sub-pixels in sequence.

For example, as shown in FIG. 9 and FIG. 10, the first trunk path 311 passes through a gap between the first isolation portion 211 and the second isolation portion 213 and the light emitting region 101 of the third-color sub-pixel 13.

For example, as shown in FIG. 9 and FIG. 10, at least one angle 1020 of the light emitting region 101 of the second-color sub-pixel 12 is surrounded by the second isolation portion 213, and the second isolation portion 213 is located between adjacent first-color sub-pixel 11 and second-color sub-pixel 12 to reduce the probability of crosstalk occurring between the first-color sub-pixel and the second-color sub-pixel. With two isolation portions disposed between the first-color sub-pixel and the second-color sub-pixel, a case where film layers of the first-color sub-pixel and the second-color sub-pixel that ought to be disconnected are not disconnected can be avoided.

For example, as shown in FIG. 9 and FIG. 10, a distance between edges, close to each other, of the second isolation portion 213 disposed between the first-color sub-pixel 11 and the second-color sub-pixel 12 and the light emitting region 101 of the first-color sub-pixel 11 is a third sub-distance, and a distance between edges, close to each other, of the second isolation portion 213 and the light emitting region 101 of the second-color sub-pixel 12 is a fourth sub-distance. The third sub-distance is greater than the fourth sub-distance. That is, the second isolation portion 213 is closer to the light emitting region 101 of the second-color sub-pixel 12.

For example, as shown in FIG. 9 and FIG. 10, the second isolation portion 213 includes a plurality of sub-portions spaced apart, and the second fracture portions 214 are disposed between adjacent sub-portions. For example, a size of the second fracture portion 214 is smaller than a length of an edge 1123 of the light emitting region 101 of the second-color sub-pixel 12.

FIG. 10 illustrates no branch path. For example, the second electrodes of the display substrate may include a branch path passing through the connecting electrode of the first electrode of the first-color sub-pixel, and one end of the branch path may be connected to the second trunk path 312, while the other end of the branch path may be connected to the third trunk path 313. For example, the second electrodes of the display substrate may further include a branch path passing through the connecting electrode of the first electrode of the second-color sub-pixel, and one end of the branch path may be connected to the second trunk path 312, while the other end of the branch path may be connected to the fourth trunk path 314.

The embodiments of the present disclosure are not limited thereto. When the first isolation portion and the second isolation portion are disposed between the first-color sub-pixel and the second-color sub-pixel, at least one of the first isolation portion and the second isolation portion may further be provided with a small fracture portion which is only opposite to an edge of the light emitting region of a sub-pixel rather than to an angle of the light emitting region of the sub-pixel.

Since crosstalk is prone to occurring between the first-color sub-pixel and the second-color sub-pixel, e.g., crosstalk is prone to occurring between angles, opposite to each other, of the first-color sub-pixel and the second-color sub-pixel, the probability of crosstalk occurring at other positions is low. In the display substrate provided in the present disclosure, at least two isolation portions are disposed between the angles, opposite to each other, of the first-color sub-pixel and the second-color sub-pixel and no isolation portion is disposed at positions corresponding to edges of the first-color sub-pixel and the second-color sub-pixel. Thus, the resistance of the second electrodes is not increased as much as possible without reducing the probability of crosstalk occurring, thereby realizing a good balance between crosstalk and power consumption for the paths of the second electrodes.

Figure 11:
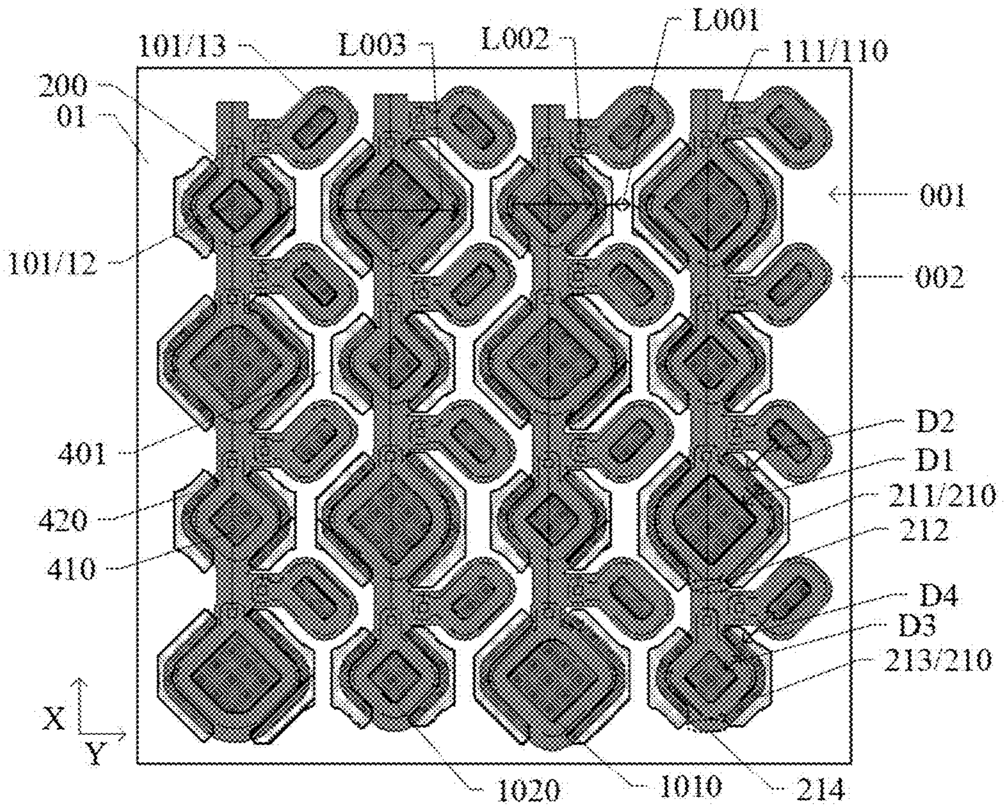
FIG. 11 and FIG. 12 are schematic diagrams illustrating a partial planar structure of another display substrate provided according to an embodiment of the present disclosure.
Figure 12:
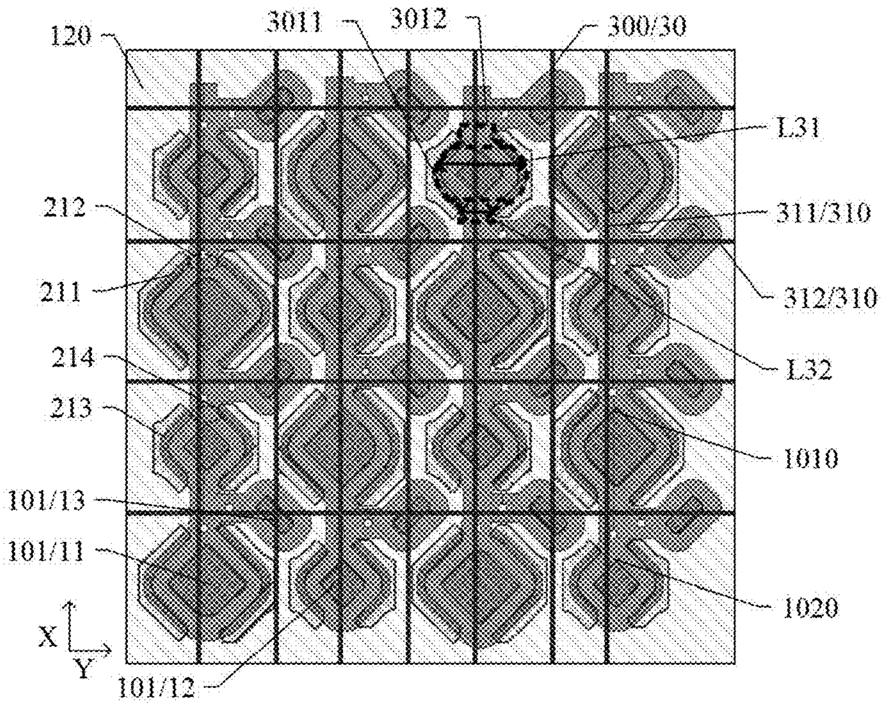

FIG. 11 and FIG. 12 are schematic diagrams illustrating a partial planar structure of another display substrate provided according to an embodiment of the present disclosure. FIG. 11 illustrates the first electrode of the light emitting element and does not illustrate the second electrode of the light emitting element. FIG. 12 illustrates the second electrode of the light emitting element and does not illustrate the first electrode of the light emitting element. The display substrate shown in FIG. 11 and FIG. 12 differs from the display substrate shown in FIG. 1 in that the reticular path of the second electrodes is changed by changing the shapes and positions of the isolation portions without changing the arrangement of pixels. FIG. 12 schematically illustrates routes of the paths and does not illustrate a shape of the paths. The second electrodes in the display substrate include a path having an uneven width, and an orthographic projection of a widest portion of the path on the base substrate overlaps the orthographic projection of the light emitting region on the base substrate. The base substrate, the insulating layer, the defining structure, the pixel defining portion, the first opening, and the light emitting element shown in the present example have the same features with those shown in FIG. 1, which will not be described here redundantly.

In some examples, as shown in FIG. 11 and FIG. 12, the isolation portion 210 includes a first isolation portion 211 in the unclosed ring shape surrounding at least one first-color sub-pixel 11. The first isolation portion 211 in the unclosed ring shape has at least two first fracture portions 212 exposing angles 1010 of the light emitting region 101 of the first-color sub-pixel 11. The at least two first fracture portions 212 include two first fracture portions 212 disposed oppositely, e.g., in the first direction, and the trunk path 310 passes through the two first fracture portions 212. The first isolation portion refers to a defining structure exposed by the second opening of the pixel defining pattern, and the first fracture portion is a defining structure covered by the pixel defining portion. The first isolation portion refers to a portion, exposed by the second opening, of a defining structure surrounding the light emitting region of the first-color sub-pixel.

For example, as shown in FIG. 11 and FIG. 12, the isolation portion 210 surrounding each first-color sub-pixel 11 is the first isolation portion 211. For example, the first isolation portion 211 is located between adjacent first-color sub-pixel 11 and second-color sub-pixel 12 arranged in the second direction. For example, the first isolation portion 211 includes at least one angle 1010 and at least one edge of the light emitting region 101 of the first-color sub-pixel 11.

For example, as shown in FIG. 11 and FIG. 12, the trunk paths 310 pass through the light emitting region 101 of the third-color sub-pixel 13 and the light emitting region 101 of the first-color sub-pixel 11. For example, the trunk paths 310 include a first trunk path 311 and a second trunk path 312 of which extension directions intersect. The first trunk path 311 and the second trunk path 312 intersect at the light emitting region 101 of the third-color sub-pixel 13.

In the display substrate provided in the embodiments of the present disclosure, the trunk paths pass through the first-color sub-pixels in addition to the third-color sub-pixels. The resistance of the second electrodes can be further reduced to reduce the power consumption.

In some examples, as shown in FIG. 11 and FIG. 12, at least a portion of the first isolation portion 210 is located between the first-color sub-pixel 11 and the third-color sub-pixel 13 disposed adjacently in the third direction. The first direction and the second direction both intersect the third direction. For example, the third direction may be the V-direction shown in FIG. 4A. A distance between edges, close to each other, of the first isolation portion 210 and the light emitting region 101 of the first-color sub-pixel 11 is a first distance D1, and a distance between edges, close to each other, of the first isolation portion 210 and the light emitting region 101 of the third-color sub-pixel 13 is a second distance D2. The first distance D1 is smaller than the second distance D2. The edge of the first isolation portion refers to an edge of the first isolation portion that is exposed by the second opening of the pixel defining pattern.

For example, only one isolation portion 210 (e.g., the first isolation portion 211) is disposed between the first-color sub-pixel 11 and the third-color sub-pixel 13 disposed adjacently, and the first isolation portion 211 is closer to the first-color sub-pixel 11, thereby being conducive to increasing the width of the trunk path of the second electrode at a position overlapping the third-color sub-pixel. Accordingly, the power consumption of the display substrate during displaying can be reduced.

For example, a ratio of the first distance D1 to the second distance D2 may be 0.1 to 0.9. For example, the ratio of the first distance D1 to the second distance D2 may be 0.2 to 0.7. For example, the ratio of the first distance D1 to the second distance D2 may be 0.3 to 0.8. For example, the ratio of the first distance D1 to the second distance D2 may be 0.45 to 0.65. For example, the ratio of the first distance D1 to the second distance D2 may be 0.5 to 0.58. For example, the ratio of the first distance D1 to the second distance D2 may be 0.55 to 0.6.

For example, as shown in FIG. 11 and FIG. 12, the first fracture portions 212 are configured to expose at least one angle 1010 of the light emitting region 101 of the first-color sub-pixel 11. For example, different first fracture portions 212 corresponding to the same first-color sub-pixel 11 are configured to expose different angles 1010 of the light emitting region 101.

For example, as shown in FIG. 11 and FIG. 12, the first fracture portion 212 exposes the connecting electrode 111 of the first electrode 110.

In some examples, as shown in FIG. 11 and FIG. 12, the isolation portion 210 includes a second isolation portion 213 in the unclosed ring shape surrounding at least one second-color sub-pixel 12. The second isolation portion 213 in the unclosed ring shape has at least two second fracture portions 214 exposing angles 1020 of the light emitting region 101 of the second-color sub-pixel 12. The at least two second fracture portions 214 include two second fracture portions 214 disposed adjacently, e.g., in the first direction. The second fracture portions 214 are disposed opposite to the first fracture portions 212, e.g., in the first direction such that the trunk path 310 passes through the first fracture portions 212 and the second fracture portions 214. For example, the trunk path 310 passes through the light emitting region 101 of the first-color sub-pixel 11, the first fracture portions 212, the second fracture portions 214, and the light emitting region 101 of the second-color sub-pixel 12 in sequence. The second isolation portion refers to a portion, exposed by the second opening, of a defining structure surrounding the light emitting region of the first-color sub-pixel.

For example, as shown in FIG. 11 and FIG. 12, the first isolation portion 211 and the second isolation portion 213 are disposed between adjacent first-color sub-pixel 11 and second-color sub-pixel 12 arranged in the second direction, and no isolation portion 210 is disposed between adjacent first-color sub-pixel 11 and second-color sub-pixel 12 arranged in the first direction. The charge paths of the second electrodes are provided in the first direction while reducing the crosstalk between the first-color sub-pixel and the second-color sub-pixel in the second direction, thereby being conducive to balancing the crosstalk and the power consumption.

In some examples, as shown in FIG. 11 and FIG. 12, the trunk path 310 passes through a gap between the first isolation portion 211 and the second isolation portion 213 disposed adjacently in the second direction and a gap between the first isolation portion 211 and the second isolation portion 213 disposed adjacently in the first direction. For example, the trunk path 310 passing through the gap between the first isolation portion 211 and the second isolation portion 213 disposed adjacently passes through the light emitting region 101 of the third-color sub-pixel 13.

In some examples, as shown in FIG. 11 and FIG. 12, at least a portion of the second isolation portion 213 is located between the second-color sub-pixel 12 and the third-color sub-pixel 13 disposed adjacently in the third direction. The first direction and the second direction both intersect the third direction. For example, the third direction may be the V-direction shown in FIG. 4A. A distance between edges, close to each other, of the second isolation portion 213 and the light emitting region 101 of the second-color sub-pixel 12 is a third distance D3, and a distance between edges, close to each other, of the second isolation portion 213 and the light emitting region 101 of the third-color sub-pixel 13 is a fourth distance D4. The third distance D3 is smaller than fourth second distance D4. The edge of the second isolation portion refers to an edge of the second isolation portion that is exposed by the second opening of the pixel defining pattern.

For example, only one isolation portion 210 (e.g., the second isolation portion 213) is disposed between the second-color sub-pixel 12 and the third-color sub-pixel 13 disposed adjacently, and the second isolation portion 213 is closer to the second-color sub-pixel 12, thereby being conducive to increasing the width of the trunk path of the second electrode at a position overlapping the third-color sub-pixel. Accordingly, the power consumption of the display substrate during displaying can be reduced.

For example, a ratio of the third distance D3 to the fourth distance D4 may be 0.1 to 0.9. For example, the ratio of the third distance D3 to the fourth distance D4 may be 0.2 to 0.7. For example, the ratio of the third distance D3 to the fourth distance D4 may be 0.3 to 0.8. For example, the ratio of the third distance D3 to the fourth distance D4 may be 0.45 to 0.65. For example, the ratio of the third distance D3 to the fourth distance D4 may be 0.5 to 0.58. For example, the ratio of the third distance D3 to the fourth distance D4 may be 0.55 to 0.6.

In some examples, as shown in FIG. 11 and FIG. 12, a gap between adjacent first isolation portion 211 and second isolation portion 213 in the first direction is not smaller than a size of the first fracture portion 212 in the second direction and a size of the second fracture portion 214 in the second direction.

By adjusting the gap between the first isolation portion and the second isolation portion disposed adjacently in the first direction, a width of the path of the second electrode therebetween can be increased as much as possible such that the resistance of the second electrode is not relatively large, thereby being conducive to reducing the power consumption.

Figure 13A:
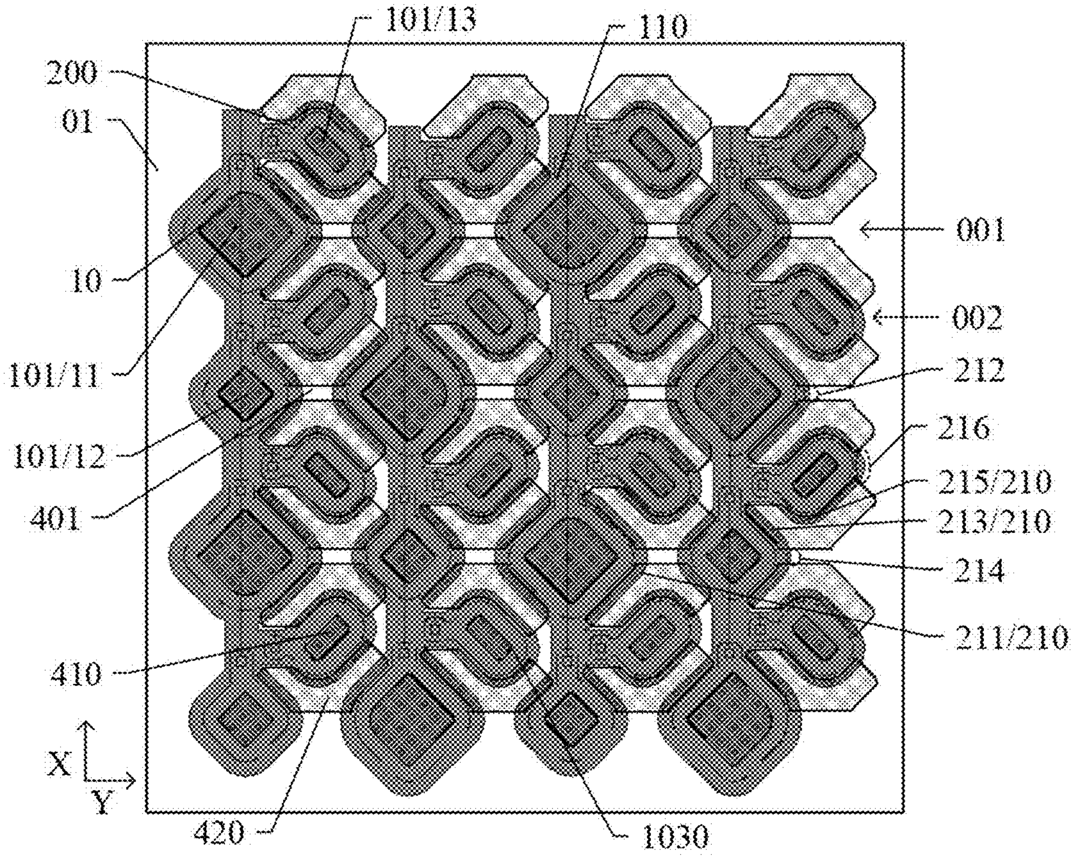
FIG. 13A and FIG. 13B are schematic diagrams illustrating a partial planar structure of another display substrate provided according to an embodiment of the present disclosure.
Figure 13B:
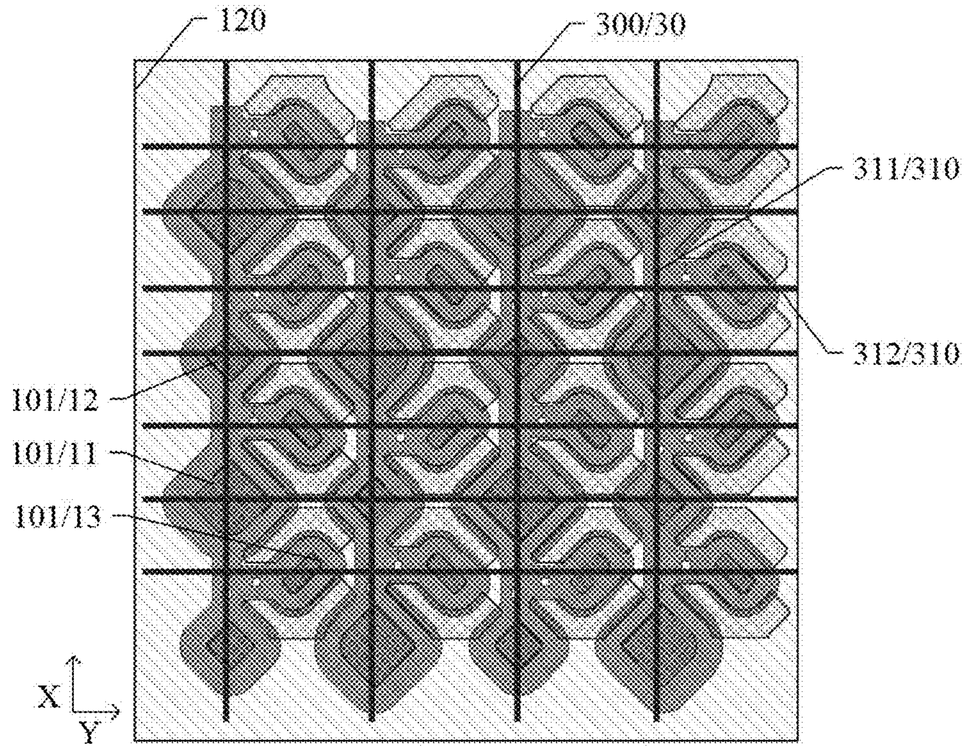

FIG. 13A and FIG. 13B are schematic diagrams illustrating a partial planar structure of another display substrate provided according to an embodiment of the present disclosure. FIG. 13A illustrates the first electrode of the light emitting element and does not illustrate the second electrode of the light emitting element. FIG. 13B illustrates the second electrode of the light emitting element and does not illustrate the first electrode of the light emitting element. The display substrate shown in FIG. 13A and FIG. 13B differs from the display substrate shown in FIG. 1 in that the reticular path of the second electrodes is changed by changing the shapes and positions of the isolation portions without changing the arrangement of pixels. FIG. 13B schematically illustrates routes of the paths and does not illustrate a shape of the paths. The second electrodes in the display substrate include a path having an uneven width, and an orthographic projection of a widest portion of the path on the base substrate overlaps the orthographic projection of the light emitting region on the base substrate. The base substrate, the insulating layer, the defining structure, the pixel defining portion, the first opening, and the light emitting element shown in the present example have the same features with those shown in FIG. 1, which will not be described here redundantly.

In some examples, as shown in FIG. 13A and FIG. 13B, the isolation portion 210 includes a third isolation portion 215 in the unclosed ring shape surrounding at least one third-color sub-pixel 13. The third isolation portion 215 in the unclosed ring shape has at least two third fracture portions 216 exposing angles 1030 of the light emitting region 101 of the third-color sub-pixel 13. The at least two third fracture portions 216 include two third fracture portions 216 disposed oppositely. The trunk path 310 passes through the two third fracture portions 216 disposed oppositely, a gap between third isolation portions 215 disposed adjacently in the first direction, and a gap between third isolation portions 215 disposed adjacently in the second direction. The third isolation portion refers to a portion, exposed by the second opening, of a defining structure surrounding the light emitting region of the third-color sub-pixel.

For example, as shown in FIG. 13A and FIG. 13B, the trunk path 310 passes through the third fracture portions 216 disposed alternately and the light emitting region 101 of the third-color sub-pixel 13.

For example, as shown in FIG. 13A and FIG. 13B, the trunk paths 310 include a first trunk path 311 and a second trunk path 312 of which extension directions intersect. One of the first trunk path 311 and the second trunk path 312 passes through the third fracture portions 216 and the light emitting region 101 of the third-color sub-pixel 13, and the other one of the first trunk path 311 and the second trunk path 312 passes through a gap between adjacent third isolation portions 215, the first-color sub-pixel 11, and the second-color sub-pixel 12. For example, part of first trunk paths 311 pass through gaps between adjacent third isolation portions 215, the first-color sub-pixels 11, and the second-color sub-pixels 12.

In some examples, as shown in FIG. 13A and FIG. 13B, a maximum size, in the first direction, of the gap between the third isolation portions 215 disposed adjacently in the first direction is not greater than that of the third fracture portion 216 in the first direction. Since the third fracture portion is greater than the gap between the third isolation portions, the width of the path passing through the second electrodes of the first-color sub-pixel and the second-color sub-pixel can be minimized while the width of the path passing through the second electrode of the third-color sub-pixel is increased as much as possible. Thus, the resistance of the second electrodes is not increased as much as possible while the crosstalk between the first-color sub-pixel and the second-color sub-pixel disposed adjacently is minimized, and the crosstalk and the power consumption are balanced.

For example, as shown in FIG. 13A and FIG. 13B, the isolation portion 210 further the first isolation portion 211 in the unclosed ring shape surrounding the first-color sub-pixel 11 and the second isolation portion 213 in the unclosed ring shape surrounding the second-color sub-pixel 12. For example, the first isolation portion 211 has the first fracture portions 212, and the second isolation portion 213 has the second fracture portions 214. For example, the second opening 420 of the pixel defining pattern for exposing the third isolation portion 215 further exposes the first isolation portion 211 and the second isolation portion 213.

For example, as shown in FIG. 13A and FIG. 13B, the trunk path 310 passes through the first fracture portion 212, the light emitting region 101 of the first-color sub-pixel 11, the second fracture portion 214, and the light emitting region 101 of the second-color sub-pixel 12 in sequence. For example, the first trunk path 311 passes through the first fracture portion 212, the light emitting region 101 of the first-color sub-pixel 11, the second fracture portion 214, and the light emitting region 101 of the second-color sub-pixel 12 in sequence. For example, the second trunk path 312 passes through the first fracture portion 212, the light emitting region 101 of the first-color sub-pixel 11, the second fracture portion 214, and the light emitting region 101 of the second-color sub-pixel 12 in sequence.

For example, as shown in FIG. 13A, one second opening 420 of the pixel defining pattern 400 includes a first isolation portion surrounding the first-color sub-pixel 11, a second isolation portion surrounding the second-color sub-pixel 12, and a third isolation portion surrounding the third-color sub-pixel 13. For example, the second opening 420 exposes the three isolation portions.

Figure 14A:
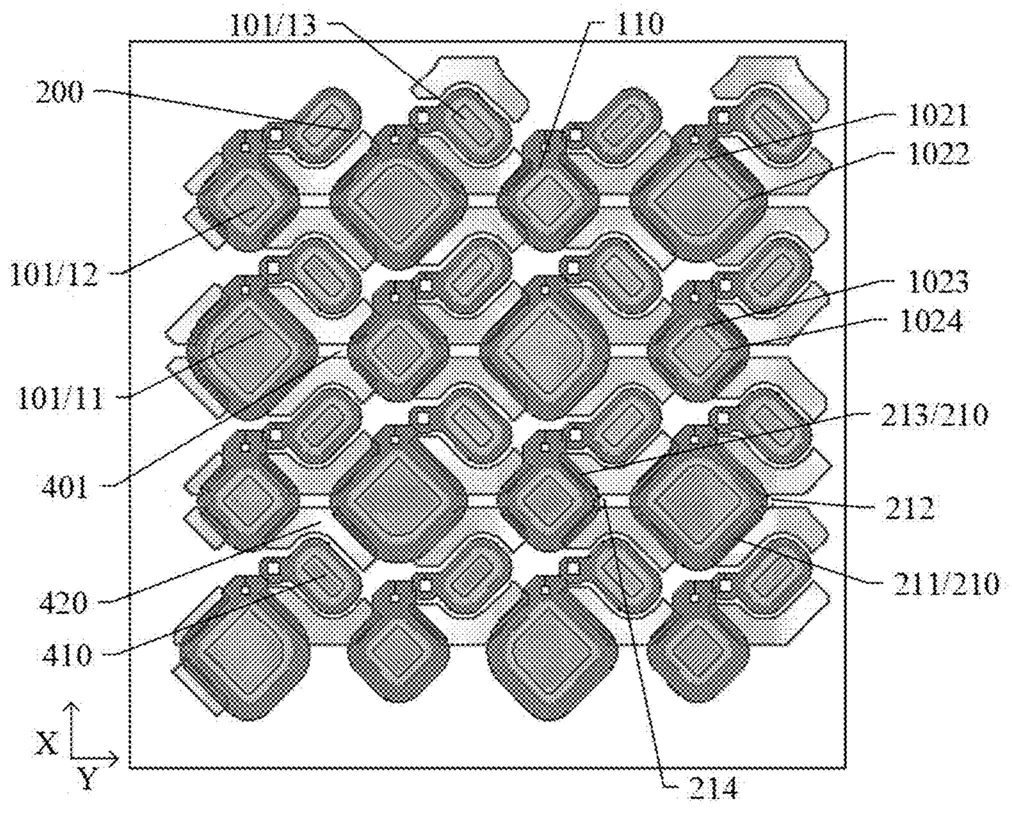
FIG. 14A is a schematic diagram illustrating a partial planar structure of another display substrate provided according to an embodiment of the present disclosure.
Figure 14B:
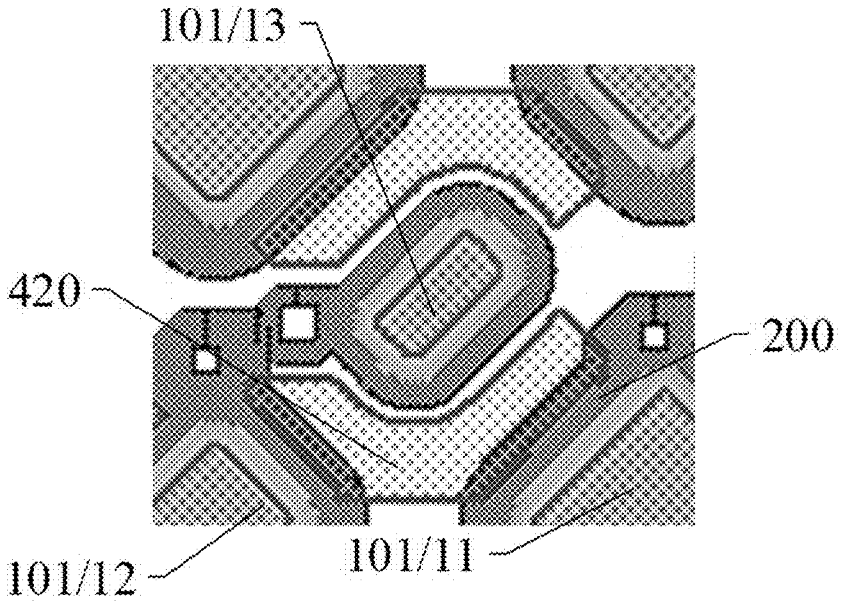
FIG. 14B is a partially enlarged view of the display substrate shown in FIG. 14A.

FIG. 14A is a schematic diagram illustrating a partial planar structure of another display substrate provided according to an embodiment of the present disclosure. FIG. 14B is a partially enlarged view of the display substrate shown in FIG. 14A. The paths of the second electrodes in the display substrate shown in FIG. 14A may be the same as the paths in FIG. 13B, will not be described here redundantly. The display substrate shown in FIG. 13A differs from the display substrate shown in FIG. 14A only by whether the defining structure 200 surrounding the third-color sub-pixel 13 is exposed by the second opening 420 of the pixel defining pattern 400. For example, in the display substrate shown in FIG. 14A, the second opening 420 exposes two isolation portions or only one isolation portion.

For example, as shown in FIG. 14A and FIG. 14B, the light emitting region of the first-color sub-pixel 11 includes a plurality of angles. The isolation portion 210 includes a first isolation portion 211 in the unclosed ring shape surrounding at least one first-color sub-pixel 11. The first isolation portion 211 in the unclosed ring shape has at least two first fracture portions 212 exposing at least two of the plurality of angles. The at least two first fracture portions 212 include two first fracture portions 212 different in size.

For example, as shown in FIG. 14A and FIG. 14B, the light emitting region 101 of the first-color sub-pixel 11 includes four angles. The four angles include two first angles 1021 disposed oppositely in the first direction and two second angles 1022 disposed oppositely in the second direction. The isolation portion 210 includes the first isolation portion 211 in the unclosed ring shape surrounding at least one first-color sub-pixel 11. The first isolation portion 211 in the unclosed ring shape has four first fracture portions 212 exposing the four angles. At least two first fracture portions 212 of the four first fracture portions 212 are different in size.

For example, as shown in FIG. 14A and FIG. 14B, the first fracture portion 212 corresponding to the connecting electrode of the first electrode has a larger size.

For example, as shown in FIG. 14A and FIG. 14B, the first fracture portion 212 exposing the first angle 1021 is different in size from the first fracture portion 212 exposing the second angle 1022. For example, the first fracture portion 212 exposing the first angle 1021 corresponds to the connecting electrode of the first electrode, and the size of the first fracture portion 212 exposing the first angle 1021 is greater than that of the first fracture portion 212 exposing the second angle 1022. Since the first fracture portion exposing the second angle has a smaller size, the crosstalk between the first-color sub-pixel and the second-color sub-pixel arranged in the second direction can be reduced.

For example, as shown in FIG. 14A and FIG. 14B, the light emitting region 101 of the second-color sub-pixel 12 includes a plurality of angles. The isolation portion 210 includes a second isolation portion 213 in the unclosed ring shape surrounding at least one second-color sub-pixel 12. The second isolation portion 213 in the unclosed ring shape has at least two second fracture portions 214 exposing at least two of the plurality of angles. The at least two second fracture portions 214 include two second fracture portions 214 different in size.

For example, as shown in FIG. 14A and FIG. 14B, the light emitting region 101 of the second-color sub-pixel 12 includes four angles. The four angles include two third angles 1023 disposed oppositely in the first direction and two fourth angles 1024 disposed oppositely in the second direction. The isolation portion 210 includes the second isolation portion 213 in the unclosed ring shape surrounding at least one second-color sub-pixel 12. The second isolation portion 213 in the unclosed ring shape has four second fracture portions 214 exposing the four angles. At least two second fracture portions 214 of the four second fracture portions 214 are different in size.

For example, as shown in FIG. 14A and FIG. 14B, the second fracture portion 214 exposing the third angle 1023 is different in size from the second fracture portion 214 exposing the fourth angle 1024.

For example, as shown in FIG. 14A and FIG. 14B, the second fracture portion 214 corresponding to the connecting electrode of the first electrode has a larger size.

For example, the second fracture portion 214 exposing the third angle 1023 corresponds to the connecting electrode of the first electrode, and the size of the second fracture portion 214 exposing the third angle 1023 is greater than that of the second fracture portion 214 exposing the fourth angle 1024. Since the second fracture portion exposing the fourth angle has a smaller size, the crosstalk between the first-color sub-pixel and the second-color sub-pixel arranged in the second direction can be reduced.

Figure 15:
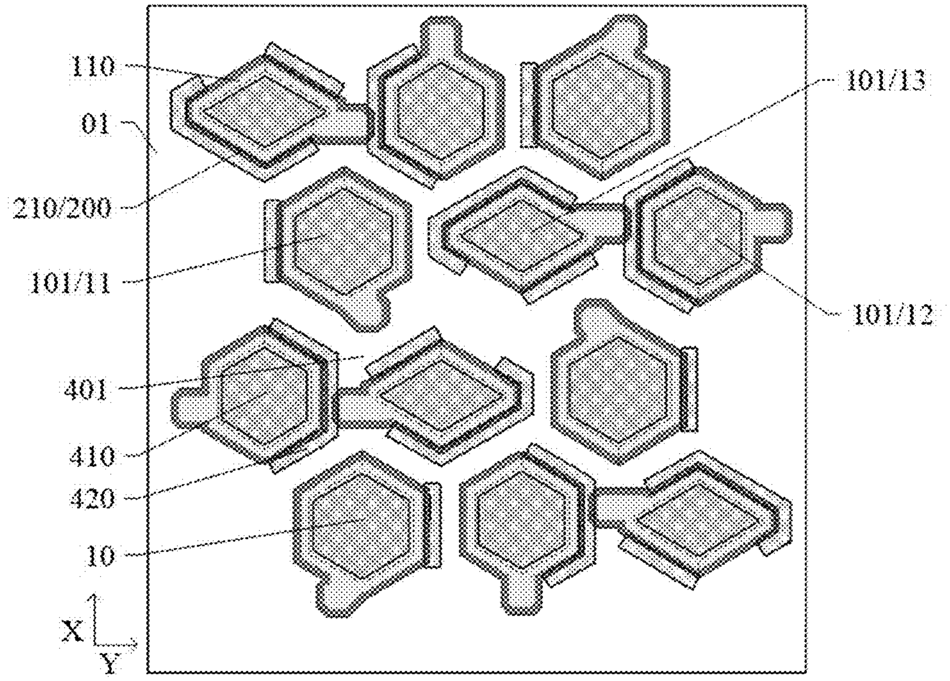
FIG. 15 and FIG. 16 are schematic diagrams illustrating a partial planar structure of another display substrate provided according to an embodiment of the present disclosure.
Figure 16:
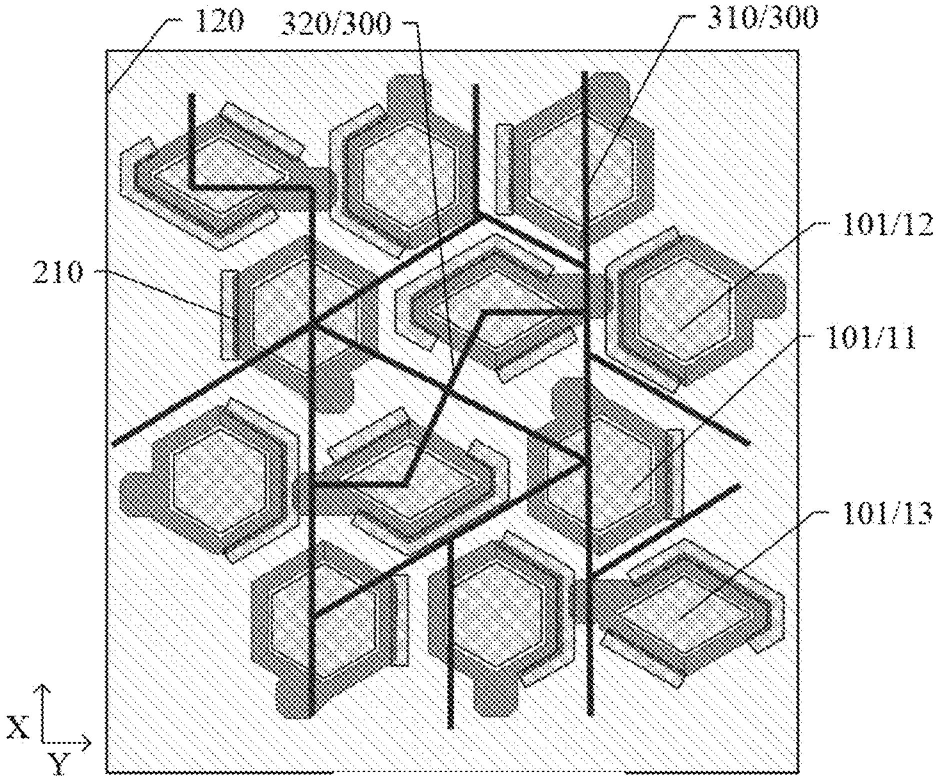

FIG. 15 and FIG. 16 are schematic diagrams illustrating a partial planar structure of another display substrate provided according to an embodiment of the present disclosure. FIG. 15 illustrates the first electrode of the light emitting element and does not illustrate the second electrode of the light emitting element. FIG. 16 illustrates the second electrode of the light emitting element and does not illustrate the first electrode of the light emitting element. The display substrate shown in FIG. 15 and FIG. 16 differs from the display substrate shown in FIG. 1 by a different pixel arrangement and a different shape and position of the isolation portion. FIG. 16 schematically illustrates routes of the paths and does not illustrate a shape of the paths. The second electrodes in the display substrate include a path having an uneven width, and an orthographic projection of a widest portion of the path on the base substrate overlaps the orthographic projection of the light emitting region on the base substrate. The base substrate, the insulating layer, and the light emitting element in the present example have the same features with those shown in FIG. 1, which will not be described here redundantly.

For example, as shown in FIG. 15 and FIG. 16, sub-pixels 10 include a first-color sub-pixel 11, a second-color sub-pixel 12, and a third-color sub-pixel 13. For example, the first-color sub-pixel 11 may be a blue sub-pixel emitting blue light; the second-color sub-pixel 12 may be a red sub-pixel emitting red light; and the third-color sub-pixel 13 may be a green sub-pixel emitting green light. For example, shapes of the light emitting region 101 of the first-color sub-pixel 11 and the light emitting region 101 of the second-color sub-pixel 12 are both a hexagon, and a shape of the light emitting region 101 of the third-color sub-pixel 13 is a quadrangle. For example, the first-color sub-pixels 11, the second-color sub-pixels 12, and the third-color sub-pixels 13 are arranged in sequence circularly in a direction to form a sub-pixel set, e.g., arranged circularly in the Y-direction to form a sub-pixel set. A plurality of pixel sets is arranged in another direction, e.g., arranged in the X-direction, and distributed in a staggered manner in the direction, e.g., in the Y-direction. For example, a plurality of sub-pixels 10 may be arranged in a Delta pixel arrangement.

For example, a gap is formed between defining structures 200 surrounding different sub-pixels 10. For example, the defining structure 200 surrounding each sub-pixel 10 may be of a structure in the closed ring shape. For example, the defining structure 200 surrounding each sub-pixel 10 may surround the first electrode 110 and covers a circle of edges of the first electrode 110.

For example, as shown in FIG. 15 and FIG. 16, a portion, exposed by the second opening 402 of the pixel defining pattern, of the defining structure 200 surrounding each sub-pixel 10 includes an isolation portion 210. The defining structure in the present example may have the same stacked structure feature with that in the display substrate in the above examples, which will not be described here redundantly.

For example, as shown in FIG. 15 and FIG. 16, a plurality of paths 300 include a plurality of trunk paths 310 and a plurality of branch paths 320. The trunk paths and the branch paths in the display substrate shown in FIG. 16 have same definitions with those in the display substrate shown in FIG. 2, which will not be described here redundantly.

For example, as shown in FIG. 15 and FIG. 16, the plurality of trunk paths 310 extend in a same direction. For example, two ends of the branch paths 320 may be connected to the trunk paths 310 extending in the X-direction.

For example, as shown in FIG. 15 and FIG. 16, the trunk paths 310 pass through the light emitting regions 101 of the first-color sub-pixels 11. For example, one branch path 320 may pass through at least one of the light emitting region 101 of the first-color sub-pixel 11, the light emitting region 101 of the second-color sub-pixel 12, and the light emitting region 101 of the third-color sub-pixel 13.

For example, as shown in FIG. 15 and FIG. 16, the defining structure 200 corresponding to one edge of the light emitting region 101 of the first-color sub-pixel 11 is exposed by the second opening 420 to form an isolation portion 210, and the defining structures 200 corresponding to other edges of the light emitting region 101 are covered by the pixel defining portion 401. The isolation portion 210 is disposed between the first-color sub-pixel 11 and the second-color sub-pixel 12 in a same sub-pixel set. with the isolation portion disposed between the first-color sub-pixel and the second-color sub-pixel, the probability of crosstalk occurring between the first-color sub-pixel and the second-color sub-pixel can be reduced.

For example, the trunk path 310 of the second electrode 120 passes through other edges of the light emitting region 101 of the first-color sub-pixel 11.

For example, as shown in FIG. 15 and FIG. 16, the defining structures 200 disposed corresponding to three edges of the light emitting region 101 of the second-color sub-pixel 12 are exposed by the second openings 420 to form isolation portions 210, and the defining structure 200 corresponding to other edge of the light emitting region 101 is covered by the pixel defining portion 401. For example, the isolation portions 210 are located between the second-color sub-pixel 12 and the third-color sub-pixel 13 in a same sub-pixel set and between the first-color sub-pixels 11 and the second-color sub-pixels 12 in adjacent sub-pixel sets. With the isolation portion disposed between the third-color sub-pixel and the second-color sub-pixel in a same sub-pixel set and the isolation portion disposed between the first-color sub-pixels and the second-color sub-pixels in adjacent sub-pixel sets, the probability of crosstalk occurring between the third-color sub-pixel and the second-color sub-pixel in the same sub-pixel set and the probability of crosstalk occurring between the first-color sub-pixels and the second-color sub-pixels in adjacent sub-pixel sets can be reduced.

For example, the branch path 320 of the second electrode 120 passes through other edges of the light emitting region 101 of the second-color sub-pixel 12 and a gap between adjacent first-color sub-pixels 11 and second-color sub-pixels 12 in a same set.

For example, as shown FIG. 15 and FIG. 16, the defining structures 200 corresponding to the edges of the light emitting region 101 of the third-color sub-pixel 13 are exposed by the second openings 420 to form the isolation portions 210, and portions of at least two edges are covered by the pixel defining portion 401 such that the isolation portions 210 are formed into isolation portions 210 in the unclosed ring shape. For example, the isolation portions 210 are located between the first-color sub-pixel 11 and the third-color sub-pixel 13 in a same sub-pixel set, and located between the third-color sub-pixels 13 and the second-color sub-pixels 12 in adjacent sub-pixel sets and between the third-color sub-pixels 13 and the third-color sub-pixels 11 in the adjacent sub-pixel sets. With the isolation portion disposed between the third-color sub-pixel and the first-color sub-pixel in a same sub-pixel set and the isolation portions disposed between the first-color sub-pixels and the second-color sub-pixels in adjacent sub-pixel sets and third-color sub-pixels and first-color sub-pixels in the adjacent sub-pixel sets, the probability of crosstalk occurring between adjacent sub-pixels in the same sub-pixel set and the probability of crosstalk occurring between adjacent sub-pixels in adjacent sub-pixel sets can be reduced.

For example, the branch path 320 of the second electrode 120 passes through the fracture portions of the isolation portions 210 in the unclosed ring shape of the light emitting region 101 of the third-color sub-pixel 13.

In the display substrate provided in the present example, with the fewest isolation portions, the resistance of the second electrodes is prevented from increasing significantly while efficient isolation effect is achieved to reduce the crosstalk.

Figure 17:
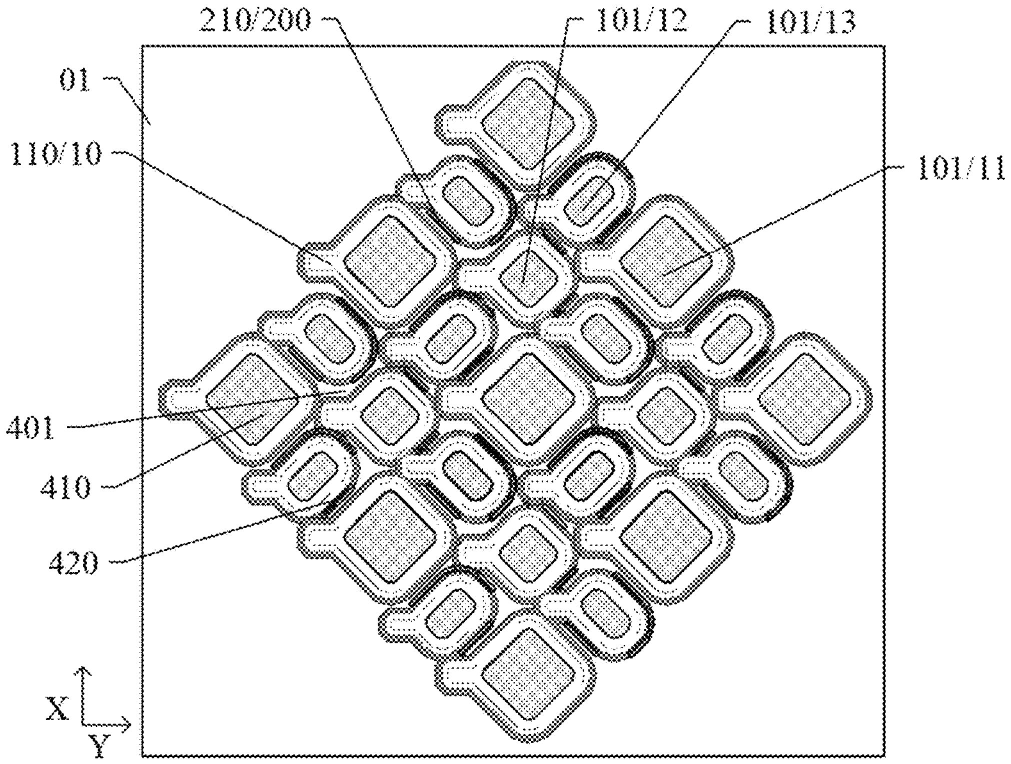
FIG. 17 and FIG. 18 are schematic diagrams illustrating a partial planar structure of another display substrate provided according to an embodiment of the present disclosure.
Figure 18:
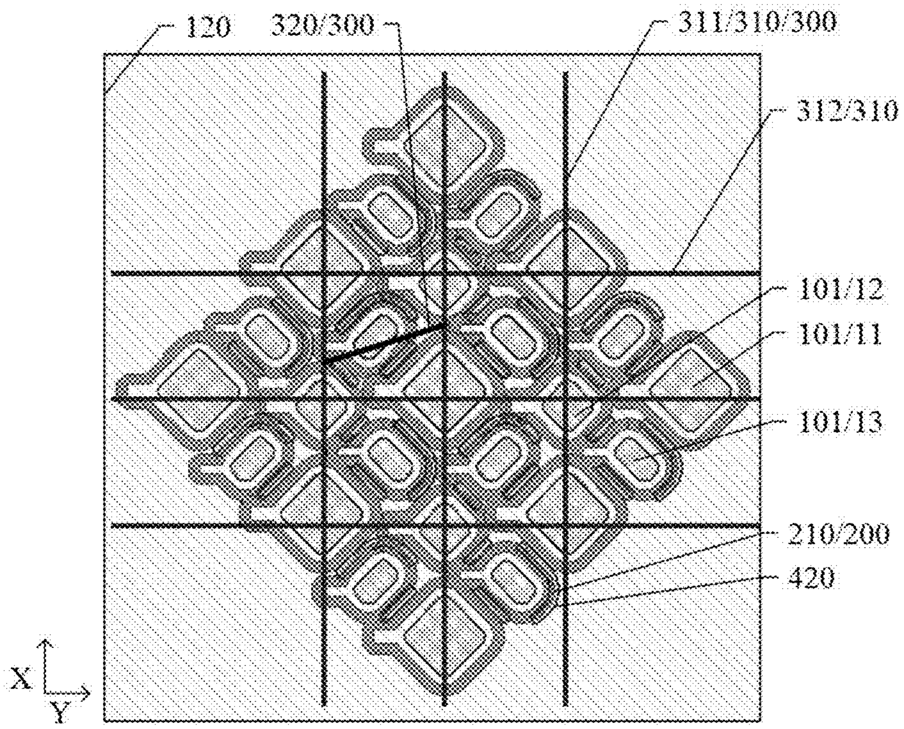

FIG. 17 and FIG. 18 are schematic diagrams illustrating a partial planar structure of another display substrate provided according to an embodiment of the present disclosure. FIG. 17 illustrates the first electrode of the light emitting element and does not illustrate the second electrode of the light emitting element. FIG. 18 illustrates the second electrode of the light emitting element and does not illustrate the first electrode of the light emitting element. The display substrate shown in FIG. 15 to FIG. 18 differs from the display substrate shown in FIG. 1 by a different pixel arrangement and a different shape and position of the isolation portion. FIG. 18 schematically illustrates routes of the paths and does not illustrate a shape of the paths. The second electrodes in the display substrate include a path having an uneven width, and an orthographic projection of a widest portion of the path on the base substrate overlaps the orthographic projection of the light emitting region on the base substrate. The base substrate, the insulating layer, and the light emitting element in the present example have the same features with those shown in FIG. 1, which will not be described here redundantly.

For example, as shown in FIG. 17 and FIG. 18, sub-pixels 10 include a first-color sub-pixel 11, a second-color sub-pixel 12, and a third-color sub-pixel 13. For example, the first-color sub-pixel 11 may be a blue sub-pixel emitting blue light; the second-color sub-pixel 12 may be a red sub-pixel emitting red light; and the third-color sub-pixel 13 may be a green sub-pixel emitting green light. For example, shapes of the light emitting region 101 of the first-color sub-pixel 11, the light emitting region 101 of the second-color sub-pixel 12, and the light emitting region 101 of the third-color sub-pixel 13 are all a quadrangle. For example, the first-color sub-pixels 11 and the second-color sub-pixels 12 are arranged alternately in a direction, e.g., in the Y-direction, to form a first sub-pixel set, and an included angle between a connecting line of centers of the light emitting regions 101 of the first-color sub-pixel 11 and the second-color sub-pixel 12 and a straight line extending in the Y-direction is large, e.g., 3 to 10 degrees. For example, the third-color sub-pixels 13 are arranged in the above-mentioned direction, e.g., the Y-direction, to form a second sub-pixel set. The first sub-pixel sets and the second sub-pixel sets are arranged alternately in another direction, e.g., in the X-direction. For example, a plurality of sub-pixels 10 are arranged in a tripod pixel arrangement.

For example, as shown in FIG. 17 to FIG. 18, the defining structures 200 surrounding different sub-pixels 10 may be of an integrated structure, and may also be spaced apart. For example, the defining structure 200 surrounding each sub-pixel 10 may surround the first electrode 110 and covers a circle of edges of the first electrode 110.

For example, as shown in FIG. 17 and FIG. 18, a portion, exposed by the second opening 402 of the pixel defining pattern, of the defining structure 200 surrounding each sub-pixel 10 includes an isolation portion 210. The defining structure in the present example may have the same stacked structure feature with that in the display substrate in the above examples, which will not be described here redundantly.

For example, as shown in FIG. 17 and FIG. 18, a plurality of paths 300 include a plurality of trunk paths 310 and a plurality of branch paths 320. The trunk paths and the branch paths in the display substrate shown in FIG. 18 have same definitions with those in the display substrate shown in FIG. 2, which will not be described here redundantly.

For example, as shown in FIG. 17 and FIG. 18, the plurality of trunk paths 310 include a first trunk path 311 and a second trunk path 312 of which extension directions intersect. The first trunk path 311 is connected with the second trunk path 312. Charge transported by the second electrode 120 may be transported in the first trunk path 311 and the second trunk path 312. For example, one of the first trunk path 311 and the second trunk path 312 extends in the X-direction, and the other one extends in the Y-direction.

For example, as shown in FIG. 17 and FIG. 18, two ends of the branch paths 320 may be connected to the trunk paths 310 extending in a same direction. For example, the extension direction of the branch path 320 is different from that of the trunk path 310.

For example, as shown in FIG. 17 and FIG. 18, the trunk paths 310 pass through the light emitting region 101 of the first-color sub-pixel 11 and the light emitting region 101 of the second-color sub-pixel 12. For example, the first trunk path 311 passes through the light emitting region 101 of the first-color sub-pixel 11 and the light emitting region 101 of the second-color sub-pixel 12. For example, the branch paths 320 pass through the light emitting region 101 of the third-color sub-pixel 13.

For example, as shown in FIG. 17 and FIG. 18, a circle of defining structures 200 surrounding the light emitting region 101 of the first-color sub-pixel 11 is not exposed by the second opening 420 of the pixel defining pattern. For example, in a circle of defining structures 200 surrounding the light emitting region 101 of the second-color sub-pixel 12, at least a portion located between the second-color sub-pixel and the third-color sub-pixel 13 is exposed by the second opening 420 to form the isolation portion 210. For example, in a circle of defining structures 200 surrounding the light emitting region 101 of the second-color sub-pixel 12, at least a portion located between the third-color sub-pixel 13 and the first-color sub-pixel 11 and at least a portion located between the third-color sub-pixel 13 and the second-color sub-pixel 12 are exposed by the second openings 420 to form the isolation portions 210. For example, the isolation portions 210 surrounding the light emitting region 101 of any sub-pixel 10 are all the isolation portions 210 in the unclosed ring shape.

In the display substrate provided in the present example, with the fewest isolation portions, the resistance of the second electrodes is prevented from increasing significantly while efficient isolation effect is achieved to reduce the crosstalk.

In each of the above embodiments, no defining structure may be disposed on a side, far away from the center of the display region, of at least part of sub-pixels located at an edge of the display region to improve the continuity of the second electrodes at the edge of the display region.

Another embodiment of the present disclosure provides a display substrate, including a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. An isolation portion is disposed between at least two adjacent sub-pixels. At least one layer of the light emitting functional layer and at least a portion of the second electrode are disconnected at an edge of the isolation portion, and the second electrodes of sub-pixels disposed adjacently are at least partially disposed continuously to form a reticular path. The reticular path includes a plurality of crisscrossed paths. At least one path has an uneven width. The base substrate, sub-pixels, and isolation portions in the present embodiment may have the same features with those in any above embodiment.

As shown in FIG. 11 and FIG. 12, at least partial edge of the path 300 with an uneven width is an edge of the isolation portion 210. The path 300 with an uneven width includes a first path portion 3011 overlapping the light emitting region 101 and a second path portion 3012 located at a position outside the light emitting region 101. Straight lines perpendicular to an extension direction of the path 300 with an uneven width include a first straight line passing through an orthographic projection of the first path portion 3011 on the base substrate 01 and a second line passing through an orthographic projection of the second path portion 3012 on the base substrate 01. A length of a connecting line of two intersection points of the first straight line with orthographic projections of edges of the isolation portions 210 located on two sides of the first path portion 3011 on the base substrate 01 is a first connecting line length L31, and a length of a connecting line of two intersection points of the second straight line with orthographic projections of edges of the isolation portions 210 located on two sides of the second path portion 3012 on the base substrate 01 is a second connecting line length L32. The first connecting line length L31 is not less than the second connecting line length L32.

In the display substrate provided in the present disclosure, the isolation portion is provided to isolate at least one layer of the light emitting functional layer and at least a portion of the second electrode. The isolation portion is shaped such that the second electrodes form the reticular path. In the reticular path, a distance between edges of the isolation portions on two sides of the first path portion at a position corresponding to the light emitting region is not less than that between edges of the isolation portions on two sides of the second path portion corresponding to a position outside the light emitting region. Thus, the conduction effect of the second electrodes can be improved while the crosstalk occurring between adjacent sub-pixels is reduced, guaranteeing that the resistance of the second electrodes is not increased as much as possible and thereby being conducive to avoiding the problems of excessively high power consumption and brightness uniformity of the display substrate.

As shown in FIG. 1 to FIG. 18, an embodiment of the present disclosure provides a display substrate, including: a base substrate; a plurality of sub-pixels located on the base substrate, wherein each of at least part of sub-pixels includes a light emitting element including a light emitting region; the light emitting element includes a light emitting functional layer, and a first electrode and a second electrode that are located on two sides of the light emitting functional layer in a direction perpendicular to the base substrate; the first electrode is located between the light emitting functional layer and the base substrate; the light emitting functional layer includes a plurality of film layers; and the second electrode covers the light emitting region of the sub-pixel; and a pixel defining pattern located between the second electrode and the base substrate and located on a side, far away from the base substrate, of the first electrode, wherein the pixel defining pattern includes a plurality of first openings; one sub-pixel corresponds to at least one first opening; at least a portion of the light emitting element of the sub-pixel is located in the first opening corresponding to the sub-pixel, and the first opening is configured to expose the first electrode; wherein the pixel defining pattern further includes a plurality of second openings located between at least part of sub-pixels; and at least one layer of the light emitting functional layer and at least a portion of the second electrode are disconnected at the second opening. Thus, the crosstalk occurring between adjacent sub-pixels can be reduced.

In some examples, as shown in FIG. 1 to FIG. 18, at least one isolation portion is disposed within each second opening; and at least one layer of the light emitting functional layer and at least a portion of the second electrode are disconnected at the isolation portion.

In some examples, as shown in FIG. 1 to FIG. 18, a gap is formed between an orthographic projection of a partial edge of the isolation portion on the base substrate and an orthographic projection of an edge of the second opening where the isolation portion is located on the base substrate, thereby being conducive to realizing isolation of the light emitting functional layer by the edge position of the isolation portion.

In some examples, as shown in FIG. 1 to FIG. 18, two edges of the light emitting regions of sub-pixels located on two sides of the isolation portion in a direction perpendicular to an extension direction of the isolation portion have different distances to an edge, exposed by the second opening, of the isolation portion. Thus, the conduction effect of the second electrodes can be improved, guaranteeing that the resistance of the second electrodes is not increased as much as possible and thereby being conducive to avoiding the problems of excessively high power consumption and brightness uniformity of the display substrate.

In some examples, as shown in FIG. 1 to FIG. 18, at least one second opening is formed around the light emitting region of at least one sub-pixel.

In some examples, as shown in FIG. 1 to FIG. 18, a portion of the second electrode that surrounds the second opening includes a structure in an unclosed ring shape such that a shape of the second electrode may be a reticular network, thereby being conducive to improving the conduction effect of the second electrode.

In some examples, as shown in FIG. 1 to FIG. 18, a second electrode overlapping the light emitting region of the sub-pixel and a second electrode located at the second opening and far away from the light emitting region are of a continuous structure. Thus, the conduction effect of the second electrodes can be improved, guaranteeing that the resistance of the second electrodes is not increased as much as possible and thereby being conducive to avoiding the problems of excessively high power consumption and brightness uniformity of the display substrate.

In some examples, as shown in FIG. 1 to FIG. 18, the second electrodes of the sub-pixels located on two sides of the isolation portion in the direction perpendicular to the extension direction of the isolation portion are connected at a position outside the second opening, thereby being conducive to improving the conduction effect of the second electrodes and guaranteeing that the resistance of the second electrodes is not increased as much as possible.

In some examples, as shown in FIG. 1 to FIG. 18, the second opening surrounding the light emitting region of at least one sub-pixel is of a structure in the unclosed ring shape such that the second electrodes are disposed continuously at the position of a fracture portion of the second opening in the unclosed ring shape.

In some examples, as shown in FIG. 1 to FIG. 18, a shape of the light emitting region of at least one sub-pixel includes a polygon, and the second opening is formed on a side, far away from a center of the light emitting region, of each edge of the polygon, thereby being conducive to reducing the crosstalk between adjacent sub-pixels.

In some examples, as shown in FIG. 1 to FIG. 18, a boundary of the second opening includes a portion extending in a direction intersecting a row direction and a column direction.

In some examples, as shown in FIG. 1 to FIG. 18, an edge of the second opening includes a portion extending in a direction parallel to one of the row direction and the column direction.

In some examples, as shown in FIG. 1 to FIG. 18, the plurality of sub-pixels includes a plurality of first-color sub-pixels, a plurality of second-color sub-pixels, and a plurality of third-color sub-pixels. The plurality of sub-pixels is arranged in a plurality of first sub-pixel sets and a plurality of second sub-pixel sets disposed alternately in a first direction. Each first sub-pixel set includes the first-color sub-pixels and the second-color sub-pixels disposed alternately in a second direction, and each second sub-pixel set includes the third-color sub-pixels arranged in the second direction; and the first direction intersects the second direction.

In some examples, as shown in FIG. 1 to FIG. 18, the second opening includes a first opening portion in the unclosed ring shape surrounding at least one first-color sub-pixel; and the first opening portion in the unclosed ring shape has a first fracture portion which is disposed opposite to at least one of an edge and an angle of the first-color sub-pixel.

In some examples, as shown in FIG. 1 to FIG. 18, the second opening includes a second opening portion in the unclosed ring shape surrounding at least one second-color sub-pixel; and the second opening portion in the unclosed ring shape has a second fracture portion which is disposed opposite to at least one of an edge and an angle of the second-color sub-pixel.

In some examples, as shown in FIG. 1 to FIG. 18, the second opening includes a third opening portion in the unclosed ring shape surrounding at least one third-color sub-pixel; and the third opening portion in the unclosed ring shape has a third fracture portion which is disposed opposite to at least one of an edge and an angle of the third-color sub-pixel.

In some examples, as shown in FIG. 1 to FIG. 18, the first opening portion is located between the first-color sub-pixel and the third-color sub-pixel disposed adjacently, or the first opening portion is located between the first-color sub-pixel and the second-color sub-pixel disposed adjacently.

In some examples, as shown in FIG. 1 to FIG. 18, the second opening portion is located between the second-color sub-pixel and the third-color sub-pixel disposed adjacently, or the second opening portion is located between the first-color sub-pixel and the second-color sub-pixel disposed adjacently.

In some examples, as shown in FIG. 1 to FIG. 18, the third opening portion is located between the second-color sub-pixel and the third-color sub-pixel disposed adjacently, or the second opening portion is located between the first-color sub-pixel and the third-color sub-pixel disposed adjacently.

In some examples, as shown in FIG. 1 to FIG. 18, a size of the first fracture portion is different from a size of the second fracture portion.

In some examples, as shown in FIG. 1 to FIG. 18, the first opening portion and the second opening portion are disposed adjacently between the first-color sub-pixel and the second-color sub-pixel. A minimum distance between the first opening portion and the second opening portion disposed adjacently is a first spacing distance L001. A maximum spacing distance between the first opening portions surrounding the first-color sub-pixels in an arrangement direction of the first opening portion and the second opening portion disposed adjacently (e.g., a distance between two intersection points of a straight line passing through the center of the light emitting region of the first-color sub-pixel with edges, close to the center of the light emitting region, of the first opening portion surrounding the light emitting region, as shown in FIG. 11) is a second spacing distance L002. A maximum spacing distance between the second opening portions surrounding the second-color sub-pixels in the arrangement direction of the first opening portion and the second opening portion disposed adjacently is a third spacing distance L003. The second spacing distance and the third spacing distance are both greater than the first spacing distance. The spacing distances between the opening portions at different positions are set such that the second electrode has a large size at a position covering the light emitting region. Thus, the conduction effect of the second electrode at a position outside the light emitting region can be improved while normal display of the sub-pixel is guaranteed.

In some examples, as shown in FIG. 1 to FIG. 18, the display substrate further includes an insulating layer located between the pixel defining pattern and the base substrate. The isolation portion is located on a surface, far away from the base substrate, of the insulating layer; and the insulating layer is disposed at other positions than the isolation portion in the second opening.

The distribution of the second openings in the present embodiment may be the same as the distribution of the isolation portions in the above embodiments. For the distribution of the second openings, a reference may be made to the distribution of the isolation portions.

An embodiment of the present disclosure provides a display substrate, including a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. An isolation portion is disposed between at least two adjacent sub-pixels. At least one layer of the light emitting functional layer and at least a portion of the second electrode are disconnected at an edge of the isolation portion, and the second electrodes of sub-pixels disposed adjacently are at least partially disposed continuously to form a reticular path. A length of orthographic projections of the second electrodes in the at least part of sub-pixels on the base substrate in a direction is greater than a sum of sizes of orthographic projections of the light emitting regions of the sub-pixels arranged in the direction on the base substrate. The reticular path includes a plurality of crisscrossed paths. At least one path has an uneven width, and a width of an overlapping portion of the path with an uneven width and the light emitting region is greater than that of an overlapping portion of the path and at least a portion outside the light emitting region.

For example, according to the embodiment of the present disclosure, a direction mentioned above includes a row direction or a column direction.

For example, according to the embodiment of the present disclosure, the plurality of sub-pixels includes sub-pixels of different colors. Overlapping portions of the path with the light emitting regions of the sub-pixels of different colors have different widths.

For example, according to the embodiment of the present disclosure, an edge of the isolation portion includes a portion extending in a direction intersecting the row direction and the column direction.

For example, according to the embodiment of the present disclosure, the edge of the isolation portion includes a portion extending in a direction parallel to one of the row direction and the column direction.

For example, according to the embodiment of the present disclosure, the plurality of paths includes a plurality of trunk paths and a plurality of branch paths. The plurality of trunk paths passes through a region where the at least part of sub-pixels are located. Two ends of at least one branch path are connected to the trunk paths of which extension directions intersect, respectively, or two ends of at least one branch path are both connected to the trunk paths extending in a same direction.

For example, according to the embodiment of the present disclosure, the plurality of paths includes a first trunk path and a second trunk path of which extension directions intersect. Two ends of at least one branch path are connected to the first trunk path and the second trunk path, respectively. Alternatively, two ends of at least one branch path are both connected to one of the first trunk path and the second trunk path.

For example, according to the embodiment of the present disclosure, the plurality of sub-pixels includes a plurality of first-color sub-pixels, a plurality of second-color sub-pixels, and a plurality of third-color sub-pixels. The plurality of sub-pixels is arranged in a plurality of first sub-pixel sets and a plurality of second sub-pixel sets disposed alternately in a first direction. Each first sub-pixel set includes the first-color sub-pixels and the second-color sub-pixels disposed alternately in a second direction, and each second sub-pixel set includes the third-color sub-pixels arranged in the second direction. The first direction intersects the second direction.

For example, according to the embodiment of the present disclosure, the plurality of paths includes a plurality of trunk paths. The plurality of trunk paths passes through a region where the at least part of sub-pixels are located. At least one trunk path overlaps the light emitting regions of all third-color sub-pixels in one second sub-pixel set.

For example, according to the embodiment of the present disclosure, the plurality of trunk paths further includes a trunk path passing through the first sub-pixel set.

For example, according to the embodiment of the present disclosure, the plurality of trunk paths includes a first trunk path and a second trunk path of which extension directions intersect. The plurality of paths further includes a plurality of branch paths. Two ends of at least one branch path are connected to the first trunk path and the second trunk path, respectively. The at least one branch path passes through at least one of the first-color sub-pixel and the second-color sub-pixel.

For example, according to the embodiment of the present disclosure, the isolation portion includes a first isolation portion in an unclosed ring shape surrounding at least one first-color sub-pixel. The first isolation portion in the unclosed ring shape has at least two first fracture portions. At least one branch path passes through the first fracture portions to be connected with the trunk paths.

For example, according to the embodiment of the present disclosure, the isolation portion includes a second isolation portion in the unclosed ring shape surrounding at least one second-color sub-pixel. The second isolation portion in the unclosed ring shape has at least two second fracture portions. At least one branch path passes through the second fracture portions to be connected with the trunk paths.

For example, according to the embodiment of the present disclosure, the at least one branch path passes through the at least two first fracture portions. The at least two first fracture portions include one first fracture portion located on a side of the light emitting region of the first-color sub-pixel in the first direction and one first fracture portion located on a side of the light emitting region of the first-color sub-pixel in the second direction.

For example, according to the embodiment of the present disclosure, the at least one branch path passes through the at least two second fracture portions. The at least two second fracture portions include one second fracture portion located on a side of the light emitting region of the second-color sub-pixel in the first direction and one second fracture portion located on a side of the light emitting region of the second-color sub-pixel in the second direction.

For example, according to the embodiment of the present disclosure, the first fracture portions are configured to expose at least one angle of the light emitting region of the first-color sub-pixel.

For example, according to the embodiment of the present disclosure, all edges of the light emitting region of the at least one first-color sub-pixel or extended lines thereof are connected in sequence to form a polygon, and a plurality of vertex angles of the polygon have regions not overlapping a plurality of angles of the corresponding light emitting region. The light emitting region of the at least one first-color sub-pixel includes at least one particular angle, and an area of the region, not overlapping the corresponding vertex angle of the polygon, of the particular angle is greater than an area of the region of each angle of at least part of other angles that does not overlap the vertex angle of the polygon corresponding to the angle. At least part of first fracture portions are configured to expose at least part of particular angles.

For example, according to the embodiment of the present disclosure, at least a portion of the first isolation portion is located between the first-color sub-pixel and the third-color sub-pixel disposed adjacently in a third direction, and the first direction and the second direction both intersect the third direction. A distance between edges, close to each other, of the first isolation portion and the light emitting region of the first-color sub-pixel is a first distance, and a distance between edges, close to each other, of the first isolation portion and the light emitting region of the third-color sub-pixel is a second distance. The first distance is smaller than the second distance.

For example, according to the embodiment of the present disclosure, at least a portion of the second isolation portion is located between the second-color sub-pixel and the third-color sub-pixel disposed adjacently in the third direction, and the first direction and the second direction both intersect the third direction. A distance between edges, close to each other, of the second isolation portion and the light emitting region of the second-color sub-pixel is a third distance, and a distance between edges, close to each other, of the second isolation portion and the light emitting region of the third-color sub-pixel is a fourth distance. The third distance is smaller than the fourth distance.

For example, according to the embodiment of the present disclosure, the isolation portion includes a third isolation portion in the unclosed ring shape surrounding at least one third-color sub-pixel. The third isolation portion in the unclosed ring shape has at least two third fracture portions exposing angles of the light emitting region of the third-color sub-pixel. At least one trunk path passes through the third fracture portions.

For example, according to the embodiment of the present disclosure, at least a portion of the third isolation portion is located between the first-color sub-pixel and the third-color sub-pixel disposed adjacently in the third direction, and the first direction and the second direction both intersect the third direction. A distance between edges, close to each other, of the third isolation portion and the light emitting region of the third-color sub-pixel is a fifth distance, and a distance between edges, close to each other, of the third isolation portion and the light emitting region of the first-color sub-pixel is a sixth distance. The fifth distance is smaller than the sixth distance. And/or, at least a portion of the third isolation portion is located between the second-color sub-pixel and the third-color sub-pixel disposed adjacently in the third direction, and the first direction and the second direction both intersect the third direction. The distance between the edges, close to each other, of the third isolation portion and the light emitting region of the third-color sub-pixel is the fifth distance, and a distance between edges, close to each other, of the third isolation portion and the light emitting region of the second-color sub-pixel is a seventh distance. The fifth distance is smaller than the seventh distance.

For example, according to the embodiment of the present disclosure, the isolation portion further includes a fourth isolation portion. The fourth isolation portion is located between the adjacent first-color sub-pixel and second-color sub-pixel arranged in the second direction or the first direction.

For example, according to the embodiment of the present disclosure, the isolation portion includes a first isolation portion in the unclosed ring shape surrounding at least one first-color sub-pixel. The first isolation portion in the unclosed ring shape has at least two first fracture portions exposing angles of the light emitting region of the first-color sub-pixel. The at least two first fracture portions include two first fracture portions disposed oppositely, and the trunk path passes through the two first fracture portions.

For example, according to the embodiment of the present disclosure, the isolation portion includes a second isolation portion in the unclosed ring shape surrounding at least one second-color sub-pixel. The second isolation portion in the unclosed ring shape has at least two second fracture portions exposing angles of the light emitting region of the second-color sub-pixel. The at least two second fracture portions include two second fracture portions disposed oppositely. The second fracture portions are disposed opposite to the first fracture portions such that the trunk path passes through the first fracture portions and the second fracture portions.

For example, according to the embodiment of the present disclosure, at least a portion of the first isolation portion is located between the first-color sub-pixel and the third-color sub-pixel disposed adjacently in the third direction, and the first direction and the second direction both intersect the third direction. A distance between edges, close to each other, of the first isolation portion and the light emitting region of the first-color sub-pixel is a first distance, and a distance between edges, close to each other, of the first isolation portion and the light emitting region of the third-color sub-pixel is a second distance. The first distance is smaller than the second distance.

For example, according to the embodiment of the present disclosure, at least a portion of the second isolation portion is located between the second-color sub-pixel and the third-color sub-pixel disposed adjacently in the third direction, and the first direction and the second direction both intersect the third direction. A distance between edges, close to each other, of the second isolation portion and the light emitting region of the second-color sub-pixel is a third distance, and a distance between edges, close to each other, of the second isolation portion and the light emitting region of the third-color sub-pixel is a fourth distance. The third distance is smaller than the fourth distance.

For example, according to the embodiment of the present disclosure, a gap between the first isolation portion and the second isolation portion adjacent in the first direction is not smaller than a size of the first fracture portion in the second direction and a size of the second fracture portion in the second direction.

For example, according to the embodiment of the present disclosure, the isolation portion includes a third isolation portion in the unclosed ring shape surrounding at least one third-color sub-pixel. The third isolation portion in the unclosed ring shape has at least two third fracture portions exposing angles of the light emitting region of the third-color sub-pixel. The at least two third fracture portions include two third fracture portions disposed oppositely. The trunk path passes through the two third fracture portions disposed oppositely, a gap between the third isolation portions disposed adjacently in the first direction, and a gap between the third isolation portions disposed adjacently in the second direction.

For example, according to the embodiment of the present disclosure, at least a portion of the third isolation portion is located between the second-color sub-pixel and the third-color sub-pixel disposed adjacently, and/or at least a portion of the third isolation portion is located between the first-color sub-pixel and the third-color sub-pixel disposed adjacently.

For example, according to the embodiment of the present disclosure, the light emitting region of the first-color sub-pixel includes a plurality of angles. The isolation portion includes a first isolation portion in the unclosed ring shape surrounding at least one first-color sub-pixel. The first isolation portion in the unclosed ring shape has at least two first fracture portions exposing at least two of the plurality of angles. The at least two first fracture portions include two first fracture portions different in size.

For example, according to the embodiment of the present disclosure, the light emitting region of the first-color sub-pixel includes four angles. The four angles include two first angles disposed oppositely in the first direction and two second angles disposed oppositely in the second direction. The first fracture portion exposing the first angle is different in size from the first fracture portion exposing the second angle.

For example, according to the embodiment of the present disclosure, the light emitting region of the second-color sub-pixel includes a plurality of angles. The isolation portion includes a second isolation portion in the unclosed ring shape surrounding at least one second-color sub-pixel. The second isolation portion in the unclosed ring shape has at least two second fracture portions exposing at least two of the plurality of angles. The at least two second fracture portions include two second fracture portions different in size.

For example, according to the embodiment of the present disclosure, the light emitting region of the second-color sub-pixel includes four angles. The four angles include two third angles disposed oppositely in the first direction and two fourth angles disposed oppositely in the second direction. The second fracture portion exposing the third angle is different in size from the second fracture portion exposing the fourth angle.

For example, according to the embodiment of the present disclosure, the isolation portion includes a first isolation portion in the unclosed ring shape surrounding at least one first-color sub-pixel. The first isolation portion in the unclosed ring shape has at least two first fracture portions exposing at least two edges of the light emitting region of the first-color sub-pixel. The trunk path passes through two first fracture portions.

For example, according to the embodiment of the present disclosure, the isolation portion includes a second isolation portion in the unclosed ring shape surrounding at least one second-color sub-pixel. The second isolation portion in the unclosed ring shape has at least two second fracture portions exposing at least two edges of the light emitting region of the second-color sub-pixel. The first isolation portion is disposed opposite to the second isolation portion.

For example, according to the embodiment of the present disclosure, the display substrate further includes: a pixel defining pattern located on a side, far away from the base substrate, of the first electrode; and an insulating layer located between the pixel defining pattern and the base substrate. The pixel defining pattern includes a plurality of first openings. One sub-pixel corresponds to at least one first opening. At least a portion of the light emitting element of the sub-pixel is located in the first opening corresponding to the sub-pixel, and the first opening is configured to expose the first electrode. The pixel defining pattern further includes a second opening configured to expose the isolation portion which is located between the light emitting functional layer and the insulating layer.

For example, according to the embodiment of the present disclosure, the display substrate further includes a defining structure located between the light emitting functional layer and the insulating layer. The defining structure surrounds the light emitting region of each of the at least part of sub-pixels. A portion, exposed by the second opening, of the defining structure includes the isolation portion.

For example, according to the embodiment of the present disclosure, at least a portion of the defining structure is located on a side, far away from the base substrate, of the first electrode.

For example, according to the embodiment of the present disclosure, at least a portion of the defining structure is located between the first electrode and the insulating layer.

For example, according to the embodiment of the present disclosure, the insulating layer includes a protrusion on a side far away from the base substrate. An orthographic projection of the protrusion on the base substrate overlaps an orthographic projection of the defining structure on the base substrate, and the isolation portion is in contact with the protrusion.

For example, according to the embodiment of the present disclosure, a material of the isolation portion includes an inorganic non-metallic material, and a material of the insulating layer includes an organic material. The orthographic projection of the protrusion on the base substrate is completely located within an orthographic projection of the isolation portion on the base substrate.

For example, according to the embodiment of the present disclosure, at least partial edge of the isolation portion protrudes relative to an edge of the protrusion by a size of less than 1 micron.

For example, according to the embodiment of the present disclosure, the isolation portion includes one film layer, or the isolation portion includes a first isolation structure layer and a second isolation structure layer that are stacked. The first isolation structure layer is located on a side, far away from the base substrate, of the second isolation structure layer, and an edge of the second isolation structure layer protrudes relative to an edge of the second isolation structure layer. Alternatively, the isolation portion includes a first isolation structure layer, a second isolation structure layer, and a third isolation structure layer that are stacked in sequence, and an edge of the first isolation structure layer and an edge of the third isolation structure layer both protrude relative to an edge of the second isolation structure layer.

For example, according to the embodiment of the present disclosure, at least one film layer of the light emitting functional layer includes a charge generation layer. The light emitting functional layer includes a first light emitting layer, the charge generation layer, and a second light emitting layer that are stacked. The charge generation layer is located between the first light emitting layer and the second light emitting layer and disconnected at an edge of the isolation portion.

An embodiment of the present disclosure provides a display substrate, including a base substrate, and a plurality of sub-pixels located on the base substrate. Each of at least part of sub-pixels includes a light emitting element including a light emitting region. The light emitting element includes a light emitting functional layer, and a first electrode and a second electrode that are located on two sides of the light emitting functional layer in a direction perpendicular to the base substrate. The first electrode is located between the light emitting functional layer and the base substrate. The light emitting functional layer includes a plurality of film layers. An isolation portion is disposed between at least two adjacent sub-pixels. At least one layer of the light emitting functional layer and at least a portion of the second electrode are disconnected at an edge of the isolation portion, and the second electrodes of sub-pixels disposed adjacently are at least partially disposed continuously to form a reticular path. The reticular path includes a plurality of crisscrossed paths. At least one path has an uneven width, and at least partial edge of the path with an uneven width is an edge of the isolation portion. The path with an uneven width includes a first path portion overlapping the light emitting region and a second path portion located at a position outside the light emitting region. Straight lines perpendicular to an extension direction of the path with an uneven width include a first straight line passing through an orthographic projection of the first path portion on the base substrate and a second line passing through an orthographic projection of the second path portion on the base substrate. A length of a connecting line of two intersection points of the first straight line with orthographic projections of edges of the isolation portions located on two sides of the first path portion on the base substrate is a first connecting line length, and a length of a connecting line of two intersection points of the second straight line with orthographic projections of edges of the isolation portions located on two sides of the second path portion on the base substrate is a second connecting line length. The first connecting line length is not less than the second connecting line length.

Figure 19:
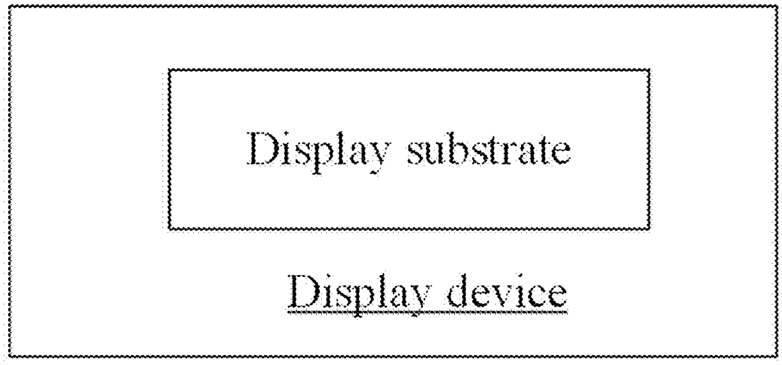
FIG. 19 is a schematic block diagram of a display device provided according to another embodiment of the present disclosure.

FIG. 19 is a schematic block diagram of a display device provided according to another embodiment of the present disclosure. As shown in FIG. 19, the display device provided by the embodiment of the present disclosure includes any display substrate described above.

For example, the display device further includes a cover plate located on a light emitting side of the display substrate.

For example, the display device may be a display device such as an organic light emitting diode display device, and any product or component having the display function and including the display device, such as a television, a digital camera, a mobile phone, a watch, a tablet computer, a notebook computer, and a navigator, which will not be limited in the embodiments of the present disclosure.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The foregoing is merely exemplary embodiments of the disclosure, but is not used to limit the protection scope of the disclosure. The protection scope of the disclosure shall be defined by the attached claims.

The invention claimed is:

1. A display substrate, comprising:

a base substrate;

a plurality of sub-pixels located on the base substrate, wherein each of at least part of sub-pixels comprises a light emitting element comprising a light emitting region; the light emitting element comprises a light emitting functional layer, and a first electrode and a second electrode located on two sides of the light emitting functional layer in a direction perpendicular to the base substrate; the first electrode is located between the light emitting functional layer and the base substrate; the light emitting functional layer comprises a plurality of film layers; and the second electrode covers the light emitting region of the sub-pixel; and a pixel defining pattern located between the second electrode and the base substrate and located on a side, far away from the base substrate, of the first electrode, wherein the pixel defining pattern comprises a plurality of first openings; one sub-pixel corresponds to at least one first opening; at least a portion of the light emitting element of the sub-pixel is located in the first opening corresponding to the sub-pixel, and the first opening is configured to expose the first electrode, wherein the pixel defining pattern further comprises a plurality of second openings located between at least part of sub-pixels; and at least one layer of the light emitting functional layer and at least a portion of the second electrode are disconnected at the second opening, wherein at least one isolation portion is disposed within each second opening; and at least one layer of the light emitting functional layer and at least a portion of the second electrode are disconnected at the isolation portion, wherein two edges of the light emitting regions of sub-pixels located on two sides of the isolation portion in a direction perpendicular to an extension direction of the isolation portion have different distances to an edge, exposed by the second opening, of the isolation portion.

2. The display substrate according to claim 1, wherein a gap is formed between an orthographic projection of a partial edge of the isolation portion on the base substrate and an orthographic projection of an edge of the second opening where the isolation portion is located on the base substrate.

3. The display substrate according to claim 1, wherein at least one second opening is formed around the light emitting region of at least one sub-pixel.

4. The display substrate according to claim 1, wherein a portion, surrounding the second opening, of the second electrode comprises a structure in a closed ring shape.

5. The display substrate according to claim 1, wherein a portion of the second electrode overlapping the light emitting region of the sub-pixel and a portion of the second electrode located at the second opening and far away from the light emitting region are of a continuous structure.

6. The display substrate according to claim 1, wherein the second electrode of the sub-pixels located on two sides of the isolation portion in the direction perpendicular to the extension direction of the isolation portion is connected at a position outside the second opening.

7. The display substrate according to claim 1, wherein the second opening surrounding the light emitting region of at least one sub-pixel is of a structure in an unclosed ring shape.

8. The display substrate according to claim 1, wherein a shape of the light emitting region of at least one sub-pixel comprises a polygon, and the second opening is formed on a side, far away from a center of the light emitting region, of each edge of the polygon.

9. The display substrate according to claim 1, wherein a boundary of the second opening comprises a portion extending in a direction intersecting a row direction and a column direction.

10. The display substrate according to claim 9, wherein an edge of the second opening comprises a portion extending in a direction parallel to one of the row direction and the column direction.

11. The display substrate according to claim 1, wherein the plurality of sub-pixels comprise a plurality of first-color sub-pixels, a plurality of second-color sub-pixels, and a plurality of third-color sub-pixels; the plurality of sub-pixels is arranged in a plurality of first sub-pixel sets and a plurality of second sub-pixel sets disposed alternately in a first direction; each first sub-pixel set comprises the first-color sub-pixels and the second-color sub-pixels disposed alternately in a second direction, and each second sub-pixel set comprises the third-color sub-pixels arranged in the second direction; and the first direction intersects the second direction.

12. The display substrate according to claim 1, further comprising an insulating layer located between the pixel defining pattern and the base substrate, wherein the isolation portion is located on a surface, far away from the base substrate, of the insulating layer; and the insulating layer is disposed at other positions than the isolation portion in the second opening.

13. The display substrate according to claim 1, wherein at least one film layer of the light emitting functional layer comprises a charge generation layer; the light emitting functional layer comprises a first light emitting layer, the charge generation layer, and a second light emitting layer that are stacked; and the charge generation layer is located between the first light emitting layer and the second light emitting layer and disconnected at an edge of the isolation portion.

14. A display device, comprising the display substrate according to claim 1.

15. A display substrate, comprising:

a base substrate;

a plurality of sub-pixels located on the base substrate, wherein each of at least part of sub-pixels comprises a light emitting element comprising a light emitting region; the light emitting element comprises a light emitting functional layer, and a first electrode and a second electrode located on two sides of the light emitting functional layer in a direction perpendicular to the base substrate; the first electrode is located between the light emitting functional layer and the base substrate; the light emitting functional layer comprises a plurality of film layers; and the second electrode covers the light emitting region of the sub-pixel; and a pixel defining pattern located between the second electrode and the base substrate and located on a side, far away from the base substrate, of the first electrode, wherein the pixel defining pattern comprises a plurality of first openings; one sub-pixel corresponds to at least one first opening; at least a portion of the light emitting element of the sub-pixel is located in the first opening corresponding to the sub-pixel, and the first opening is configured to expose the first electrode, wherein the pixel defining pattern further comprises a plurality of second openings located between at least part of sub-pixels; and at least one layer of the light emitting functional layer and at least a portion of the second electrode are disconnected at the second opening, wherein the plurality of sub-pixels comprise a plurality of first-color sub-pixels, a plurality of second-color sub-pixels, and a plurality of third-color sub-pixels; the plurality of sub-pixels is arranged in a plurality of first sub-pixel sets and a plurality of second sub-pixel sets disposed alternately in a first direction; each first sub-pixel set comprises the first-color sub-pixels and the second-color sub-pixels disposed alternately in a second direction, and each second sub-pixel set comprises the third-color sub-pixels arranged in the second direction; and the first direction intersects the second direction, wherein the second opening comprises a first opening portion in the unclosed ring shape surrounding at least one first-color sub-pixel; and the first opening portion in the unclosed ring shape has a first fracture portion which is disposed opposite to at least one of an edge and an angle of the first-color sub-pixel, wherein the second opening comprises a second opening portion in the unclosed ring shape surrounding at least one second-color sub-pixel; and the second opening portion in the unclosed ring shape has a second fracture portion which is disposed opposite to at least one of an edge and an angle of the second-color sub-pixel, and wherein the second opening comprises a third opening portion in the unclosed ring shape surrounding at least one third-color sub-pixel; and the third opening portion in the unclosed ring shape has a third fracture portion which is disposed opposite to at least one of an edge and an angle of the third-color sub-pixel.

16. The display substrate according to claim 15, wherein the first opening portion is located between the first-color sub-pixel and the third-color sub-pixel disposed adjacently, or the first opening portion is located between the first-color sub-pixel and the second-color sub-pixel disposed adjacently, wherein the second opening portion is located between the second-color sub-pixel and the third-color sub-pixel disposed adjacently, or the second opening portion is located between the first-color sub-pixel and the second-color sub-pixel disposed adjacently, and wherein the third opening portion is located between the second-color sub-pixel and the third-color sub-pixel disposed adjacently, or the third opening portion is located between the first-color sub-pixel and the third-color sub-pixel disposed adjacently.

17. The display substrate according to claim 15, wherein a size of the first fracture portion is different from a size of the second fracture portion.

18. The display substrate according to claim 15, wherein the first opening portion and the second opening portion are disposed adjacently between the first-color sub-pixel and the second-color sub-pixel; a minimum distance between the first opening portion and the second opening portion disposed adjacently is a first spacing distance; a maximum spacing distance between the first opening portions surrounding the first-color sub-pixel in an arrangement direction of the first opening portion and the second opening portion disposed adjacently is a second spacing distance, and a maximum spacing distance between the second opening portions surrounding the second-color sub-pixel in the arrangement direction of the first opening portion and the second opening portion disposed adjacently is a third spacing distance; and the second spacing distance and the third spacing distance are both greater than the first spacing distance.

* * * * *